United States Patent [19]

Oba et al.

[11] Patent Number: 5,348,835

[45] Date of Patent: Sep. 20, 1994

[54] PHOTOSENSITIVE RESIN COMPOSITION FOR FORMING POLYIMIDE FILM PATTERN COMPRISING AN O-QUINONE DIAZIDE PHOTOSENSITIVE AGENT

[75] Inventors: Masayuki Oba, Yokohama; Rumiko Hayase, Kawasaki; Naoko Kihara, Matsudo; Shuzi Hayase, Kawasaki; Yukihiro Mikogami, Yokohama; Yoshihiko Nakano, Tokyo; Naohiko Oyasato, Kawaguchi; Shigeru Matake; Kei Takano, both of Yokohama, all of Japan

[73] Assignee: Kabushiki Kaisha Toshiba, Kawasaki, Japan

[21] Appl. No.: 766,334

[22] Filed: Sep. 27, 1991

[30] Foreign Application Priority Data

Sep. 28, 1990 [JP] Japan .................. 2-259032
Jan. 17, 1991 [JP] Japan .................. 3-003962
Mar. 6, 1991 [JP] Japan .................. 3-039854
Mar. 28, 1991 [JP] Japan .................. 3-090001

[51] Int. Cl.$^5$ .......................... G03F 7/023; G03F 7/30
[52] U.S. Cl. .................................. 430/192; 430/165; 430/167; 430/189; 430/191; 430/193; 430/197; 430/330; 528/353; 525/436
[58] Field of Search ............... 430/192, 193, 165, 197, 430/167, 330; 528/353, 350, 329.1; 525/436, 434

[56] References Cited

U.S. PATENT DOCUMENTS

| | | | |
|---|---|---|---|
| 3,261,811 | 7/1966 | Tatum ................... | 525/436 |
| 4,385,165 | 5/1983 | Ahne et al. ............ | 528/353 |
| 4,622,285 | 11/1986 | Ahne ..................... | 528/353 |
| 4,847,359 | 7/1989 | Pfeifer et al. .......... | 528/353 |
| 4,880,722 | 11/1989 | Moreau et al. ......... | 430/192 |
| 4,897,461 | 1/1990 | Uekita et al. .......... | 528/353 |
| 4,927,736 | 5/1990 | Mueller et al. ........ | 430/192 |
| 4,942,108 | 7/1990 | Moreau et al. ......... | 430/192 |
| 5,037,720 | 8/1991 | Khanna .................. | 430/192 |
| 5,037,949 | 8/1991 | Mueller et al. ........ | 528/353 |
| 5,114,826 | 5/1992 | Kwong et al. .......... | 430/192 |

FOREIGN PATENT DOCUMENTS

| | | |
|---|---|---|
| 224680 | 6/1987 | European Pat. Off. . |
| 291779 | 11/1988 | European Pat. Off. . |
| 2317680 | 2/1977 | France . |
| 64-60630 | 3/1989 | Japan . |
| 2181149 | 7/1990 | Japan . |

OTHER PUBLICATIONS

SPIE, vol. 1086, "Advances in Resist Technology and Processing VI (1989) Moss et al: Positive-working polyimide resists based on . . . ".

Primary Examiner—Charles L. Bowers, Jr.
Assistant Examiner—John S. Chu
Attorney, Agent, or Firm—Oblon, Spivak, McClelland, Maier & Neustadt

[57] ABSTRACT

Disclosed is a photosensitive resin composition, containing a polyamic acid derivative having a repeating unit represented by general formula (1) given below and a photosensitive agent:

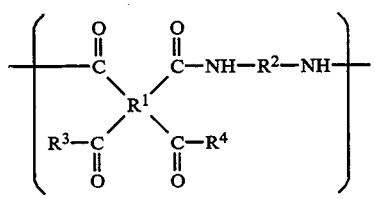

where, $R^1$ represents a tetravalent organic group, $R^2$ represents a divalent organic group, and $R^3$ and $R^4$ represent a monovalent organic group, at least one of $R^3$ and $R^4$ being an organic group having at least on hydroxyl group bonded to an aromatic ring. A semiconductor substrate is coated with the photosensitive resin composition, followed by exposing the coated film to light through a patterning mask and subsequently applying a development and a heat treatment so as to form a polyimide film pattern. A baking treatment also be applied immediately after the exposure step. The photosensitive resin composition of the present invention performs the function of a positive or negative photoresist film and the function of a polyimide protective film on a semiconductor substrate.

7 Claims, 1 Drawing Sheet

PHOTOSENSITIVE RESIN COMPOSITION FOR FORMING POLYIMIDE FILM PATTERN COMPRISING AN O-QUINONE DIAZIDE PHOTOSENSITIVE AGENT

BACKGROUND OF THE INVENTION

1. Field of the Invention

The present invention relates to a photosensitive resin composition for forming a polyimide film pattern used as an insulating material of an electronic part or as a passivation film, an α-ray shielding film or an interlayer insulating film in a semiconductor device. The present invention also relates to a method of forming the polyimide film pattern.

2. Description of the Prior Art

In a semiconductor device, a protective film (passivation film) is formed on the surface of a semiconductor substrate having a semiconductor element formed therein in order to protect the element from the influence of the external environment and to improve the reliability of the element. In general, a polyimide resin excellent in its electrical properties such as the insulating properties and in its resistances to radiation and heat is widely used as a material of the protective film. These excellent properties also allow the polyimide resin to be used widely as a material of the α-ray shielding film in a semiconductor device and as a material of the interlayer insulating film included in a multilayer interconnection structure.

A polyimide resin film can be easily formed from its precursor of a polyamic acid. Specifically, a predetermined surface is coated first with a varnish of the polyamic acid, followed by heating the coated layer so as to form a film. Then, a heat treatment is applied to the film so as to subject the polyamic acid to a cyclizing reaction. As a result, the polyamic acid is cured (imidized) so as to form a polyimide film. In this method, a stabilizing treatment can be performed at a relatively low temperature and, thus, the method is employed widely.

On the other hand, a pad processing or the like is required in the manufacture of a semiconductor device in order to make a through-hole in a multilayered interconnection structure or to achieve an electric connection to an external lead wire. Thus, it is necessary to pattern a polyimide film formed as a protective film or an interlayer insulating film in a semiconductor device so as to form a hole having a predetermined pattern structure. In general, PEP (photo engraving process) using a photo resist is employed for patterning a polyimide film. Specifically, a polyimide film is formed first as described previously on the surface of a semiconductor substrate having a semiconductor element formed therein, followed by forming a photo resist film on the polyimide film. Then, the photo resist film is selectively exposed to light and subsequently developed so as to form a resist pattern. Further, the polyimide film below the resist pattern is selectively etched using the resist pattern as an etching-resistant mask so as to form a polyimide protective film or an interlayer insulating film of a desired pattern.

In the conventional method of forming a polyimide film pattern described above, however, it is necessary to perform formation of a polyimide film and PEP for the pattern formation as two independent processes. Naturally, the two-stage process makes the formation of the polyimide film pattern troublesome.

To overcome the difficulty noted above, proposed is a resin composition containing a precursor of a polyimide, said composition making it possible to pattern a polyimide film without relying on PEP. For example, Published Unexamined Japanese Patent Application No. 49-115541 discloses a polyamic acid ester prepared by the reaction between a dichlorinated dicarboxyl diester having a photopolymerizable group introduced therein by an ester bond, which is used in place of the tetracarboxylic dianhydride which is used generally, and a diamine. The polyamic acid ester exhibits a negative photosensitivity. Specifically, when exposed to light, the exposed portion of the composition itself is made insoluble in a developing solution. It follows that patterning can be achieved simultaneously with formation of a polyimide film. In other words, a polyimide film pattern can be formed without relying on PEP.

However, very troublesome operations are required for synthesizing the compound having a photopolymerizable group and for synthesizing the polyamic acid ester. An additional difficulty is that chlorine ions are contained as an impurity in the final product resin. Further, an organic solvent is used as a developing solution, with the result that it is necessary to use a large amount of the organic solvent in the manufacturing process of the semiconductor device. This is not desirable in terms of safety, sanitation and environmental contamination. What should also be noted is that the formed polyimide film pattern is swollen by the solvent, leading to a low resolution.

Published Examined Japanese Patent Application No. 59-52822 discloses a heat resistant photosensitive material (or a negative photosensitive resin composition) containing a compound having a carbon-to-carbon double bond capable of dimerization or polymerization by actinic radiation and an amino group. However, when the photosensitive material disclosed in this prior art is used for forming a protective film in a resin-encapsulated type semiconductor device or the like, the protective film is low in its adhesion with a semiconductor substrate, a protective film of an inorganic material on the substrate surface or with the encapsulating resin, with the result that the reliability of the semiconductor device is impaired. Further, it is necessary to use an organic solvent as a developing solution in the developing step, as in the case of using the polyamic acid ester referred to previously. It follows that various problems are brought about, as pointed out previously.

Published Unexamined Japanese Patent Application No. 60-6365 discloses a photosensitive resin composition containing a compound prepared by adding as a salt an aminomethacrylate to the carboxyl group of a polyamic acid. However, the photosensitive resin composition disclosed in this prior art is defective in that the composition is low in solubility in a solvent used.

On the other hand, Published Unexamined Japanese Patent Application No. 62-145240 discloses a photosensitive resin composition containing a polymer having an isoimide structure. The composition exhibits a positive photosensitivity. Specifically, when exposed to light, the exposed portion of the composition is made soluble in a developing solution. However, the polymer is low in its heat resistance and in sensitivity to light, making it impractical to use the composition for forming a protective film included in a semiconductor device.

A photosensitive resin composition exhibiting a positive photosensitivity is also disclosed in Published Unexamined Japanese Patent Application No. 64-60630. Specifically, disclosed in this prior art is a composition prepared by adding a photosensitive agent of o-quinone diazide compound to an imide soluble in a solvent, said imide being synthesized by the reaction between a diamine having a hydroxyl group bonded to the aromatic ring and an acid anhydride. Further, Published Unexamined Japanese Patent Application No. 62-135824 discloses a similar photosensitive resin composition containing a quinone diazide as a photosensitive agent. Still further, Published Unexamined Japanese Patent Application No. 60-37550 discloses a photosensitive precursor of the polyimide having an o-nitrobenzyl ester group.

An alkaline aqueous solution can be used for the development of the photosensitive resin composition of a positive photosensitivity. Naturally, the problems brought about by the use of an organic solvent need not be worried about. However, the construction of the polymer, which is the main component of the resin composition, is restricted in the case of the positive photosensitive resin composition, resulting in a low adhesion with a silicon wafer, glass substrate, ceramic substrate, encapsulating resin, metal, etc. which are widely used in a semiconductor device.

In addition, Published Unexamined Japanese Patent Application No. 52-13315 discloses a positive photosensitive resin composition which can be developed with an alkaline aqueous solution, i.e., a photosensitive precursor of the polyimide which utilizes the solubility in an alkaline solution of a polyamic acid and contains a naphtoquinone diazide compound as a dissolution inhibitor. The photosensitive precursor of the polyimide permits the pattern formation with a simplified process of film formation, exposure and development. However, the difference in solubility in an alkaline developing solution is not sufficiently large between the exposed portion and the non-exposed portion in the developing step, making it difficult to form a fine polyimide film pattern. Further, Published Unexamined Japanese Patent Application No. 62-135824 referred to previously teaches that a photosensitive polyimide precursor film is heated to about 90° C. before exposure to light so as to improve the resolution of the formed polyimide film pattern. Even if the particular process is applied, however, the resolution remains to be insufficient in the case of using the photosensitive precursor of the polyimide noted above.

SUMMARY OF THE INVENTION

An object of the present invention is to simplify the process of forming a predetermined polyimide film pattern. To be more specific, the present invention is intended to provide a photosensitive resin composition which permits forming a polyimide film pattern without using a photoresist and a method of forming a polyimide film pattern.

According to a first embodiment of the present invention, there is provided a photosensitive resin composition for forming a polyimide film pattern, comprising a polyamic acid derivative having a repeating unit represented by general formula (1), and a photosensitive agent:

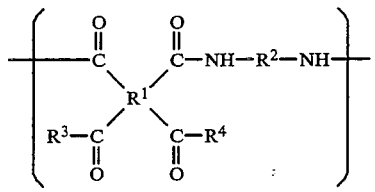

where, $R^1$ represents a tetravalent organic group, $R^2$ represents a divalent organic group, and $R^3$ and $R^4$ represent a monovalent organic group or hydroxyl group, at least one of $R^3$ and $R^4$ being an organic group having at least one hydroxyl group bonded to an aromatic ring.

According to a second embodiment of the present invention, there is provided a photosensitive resin composition for forming a polyimide film pattern, comprising a polyamic acid derivative having a repeating unit represented by general formula (1), a polyamic acid having a repeating unit represented by general formula (2), and a photosensitive agent:

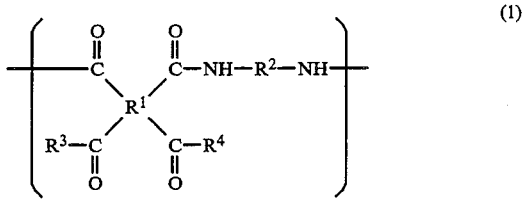

(1)

(2)

where, $R^1$ represents a tetravalent organic group, $R^2$ represents a divalent organic group, $R^3$ and $R^4$ represent a monovalent organic group or hydroxyl group, at least one of $R^3$ and $R^4$ being an organic group having at least one hydroxyl group bonded to an aromatic ring, $R^5$ represents a tetravalent organic group, and $R^6$ represents a divalent organic group.

Further, according to a third embodiment of the present invention, there is provided a photosensitive resin composition for forming a polyimide film pattern, comprising a polyamic acid derivative having a copolymer structure including a repeating unit represented by general formula (1) and a repeating unit represented by general formula ( 2 ), and a photosensitive agent:

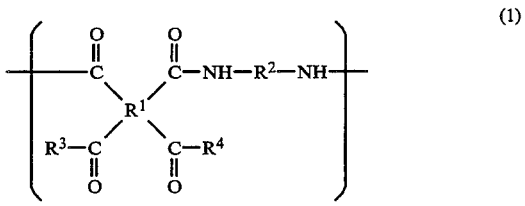

(1)

-continued

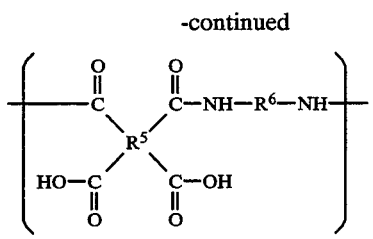
(2)

where, $R^1$ represents a tetravalent organic group, $R^2$ represents a divalent organic group, $R^3$ and $R^4$ represent a monovalent organic group or hydroxyl group, at least one of $R^3$ and $R^4$ being an organic group having at least one hydroxyl group bonded to an aromatic ring, $R^5$ represents a tetravalent organic group, and $R^6$ represents a divalent organic group.

Still further, the present invention provides a method of forming a polyimide film pattern, comprising the steps of:

forming on a substrate a resin layer containing as main components a polyamic acid having a repeating unit represented by general formula (2) and a naphtoquinone diazide compound:

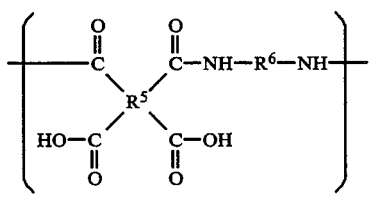
(2)

where, $R^5$ represents a tetravalent organic group, and $R^6$ represents a divalent organic group, selectively exposing a predetermined region of the resin layer to light;

applying a baking treatment at 130° to 200° C. to the resin layer after the light exposure;

developing the resin layer after the baking treatment so as to selectively remove or leave unremoved the predetermined region of the resin layer; and heating the developed resin layer to imidize the resin layer.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawing, which is incorporated in and constitutes a part of the specification, illustrates presently preferred embodiments of the invention and, together with the general description given above and the detailed description of the preferred embodiments given below, serves to explain the principles of the invention.

DETAILED DESCRIPTION OF THE PREFERRED EMBODIMENTS

Figure 1:
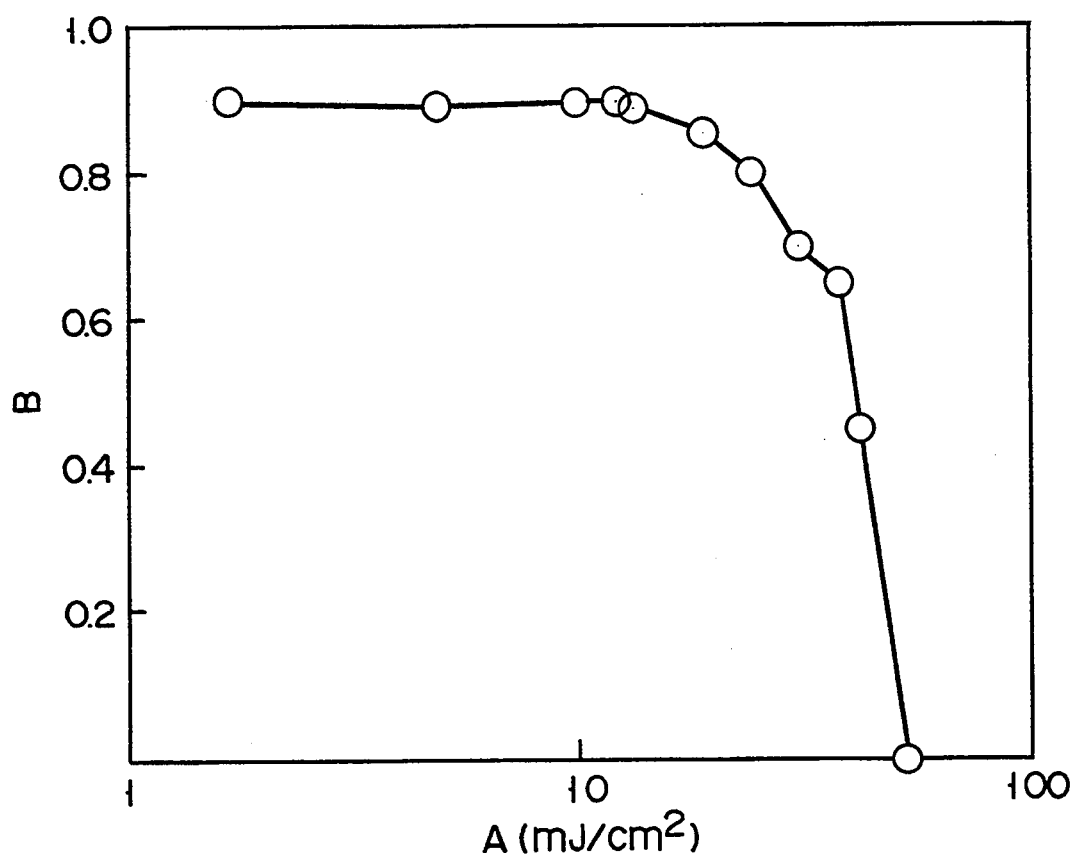
FIG. 1 is a graph showing the sensitivity to light in the light exposure step of a photosensitive resin composition according to the present invention.

In the present invention, a substrate surface is coated first with a photosensitive resin composition according to any one of the first to third embodiments of the present invention, followed by exposing the resin composition layer to light through a mask having a predetermined pattern and subsequently applying a development so as to pattern the resin composition layer. Finally, a heat treatment is applied to the patterned composition layer so as to form a desired polyimide film pattern.

The photosensitive resin composition according to any one of the first to third embodiments of the present invention comprises a resin component and a photosensitive agent component. The resin component contained in the photosensitive resin composition according to the first embodiment of the present invention is a polyamic acid derivative having a repeating unit represented by general formula (1) given above. The polyamic acid derivative, which is a precursor of a polyimide, can be synthesized by any of the two methods described below.

In the first method, a compound represented by general formula (4) given below is formed in the first stage by the reaction between a tetracarboxylic dianhydride represented by general formula (3) given below and any of an alcohol compound, amine compound and alkoxide having at least one hydroxyl group bonded directly to an aromatic ring:

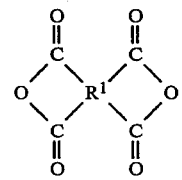
(3)

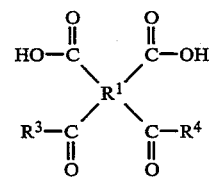
(4)

where $R^1$, $R^3$ and $R^4$ are equal to those included in general formula (1) .

In this stage, the molar ratio of the tetracarboxzlic dianhydride to the additive should be set at about 1:1 to 1:2.

In the second stage, a reaction is carried out in an organic solvent among the compound represented by general formula (4), a diamine represented by general formula (5) given below, and a dehydrating agent:

$$NH_2-R^2-NH_2 \quad (5)$$

where $R^2$ is equal to that included in general formula (1).

In this state, the molar ratio of the reactants should be set at about 1:1:2 (or more).

As a result, a polyamic acid derivative having a repeating unit represented by general formula (1) is synthesized by the polyamidation of the compound represented by general formula (4) and the diamine represented by general formula (5).

The tetracarboxylic dianhydride represented by general formula (3), which is used in the first stage reaction, is not particularly restricted in the present invention. To be more specific, the tetracarboxylic dianhydride used in the present invention includes, for example, pyromellitic dianhydride (PMDA), 3,3',4,4'-benzophenone tetracarboxylic dianhydride (BTDA), 1,4,5,8-naphthalene tetracarboxylic dianhydride, 2,3,6,7-naphthalene tetracarboxylic dianhydride, 1,2,5,6-naphthalene tetracarboxylic dianhydride, 3,3',4,4'-biphenyltetracarboxylic dianhydride, 2,2',3,3'-biphenyltetracarboxylic dianhydride, 2,3,3',4'-biphenyltetracarboxylic dianhydride, 2,3,3',4'-benzophenone tetracarboxylic dianhydride, 2,2-bis (3,4-dicarboxyphenyl) propane dianhydride, 2,2-bis [5-(3,4-dicarboxyphenoxy)phenyl] propane dianhydride, 2,2-bis [4-(2,3-dicarboxyphenoxy)phenyl] propane dianhydride, bis (3,4-dicarboxyphenyl) sulfonic dianhydride, bis (3,4-dicarboxyphenyl) ether dianhydride, bis (3,4-dicarboxyphenyl) methane dianhydride, perylene-3,4,9,10-tetracarboxylic dianhydride, butane tetracarboxylic dianhydride, 2,2'-(3,4-dicarboxyphenyl) hexafluoropropane dianhydride, his (3,4-dicarboxyphenyl) dimethylsilane dianhydride, and bis (3,4-dicarboxyphenyl) tetramethyldisiloxane dianhydride. These tetracarboxylic dianhydrides can be used singly or in combination.

In the first stage, the reaction is carried out between the tetracarboxylic dianhydride given above and an alcohol compound, amine compound, phenol compound or alkoxide given below. To be more specific, the alcohol compound used in the first stage reaction is represented by general formula (6) given below:

where $R^7$—O— is equal to $R^3$ or $R^4$ defined previously.

$R^7$— in general formula (6) represents an organic group having at least one hydroxyl group bonded to an aromatic ring. The specific alcohol compounds used in the present invention include, for example, 2-hydroxybenzyl alcohol, 3-hydroxybenzyl alcohol, 4-hydroxybenzyl alcohol, 2-hydroxyphenyl ethyl alcohol, 3-hydroxyphenyl ethyl alcohol, 4-hydroxyphenyl ethyl alcohol, 4-hydroxyphenyl-3-propanol, 4-hydroxyphenyl-4-butanol, and hydroxynaphthyl ethyl alcohol. In the present invention, it is particularly desirable to use an alcohol compound represented by general formula (7) given below:

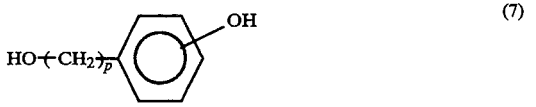

where, p is a positive integer, preferably, integer of 1 to 4.

The amine compound used in the first stage reaction is the primary or secondary amine represented by general formula (8) given below:

where $R^8$—N($R^9$) is equal to $R^3$ or $R^4$ defined previously, and $R^9$ represents hydrogen or a monovalent organic group.

$R^8$— included in general formula (8) given above represents an organic group having at least one hydroxyl group bonded to an aromatic ring. Specific amine compounds used in the present invention include, for example, 2-aminophenol, 3-aminophenol, 4-aminophenol, 4-amino-4'-hydroxy diphenylethane, 4-amino-4'-hydroxy diphenylether, 2-(4'-aminophenyl)-2-(3'-hydroxyphenyl) propane, 2-(4'-aminophenyl)-2-(3'-hydroxyphenyl) hexafluoropropane, 2-(3'-aminophenyl)-2-(3'-hydroxyphenyl) propane, 2-(4'-aminophenyl)-2-(4'-hydroxyphenyl) propane, and 2-(4'-aminophenyl)-2-(4'-hydroxyphenyl) hexafluoropropane. Particularly desirable is a primary or secondary amine represented by general formula (9) given below:

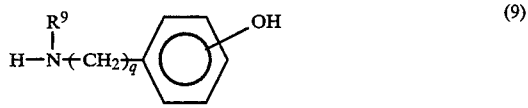

where, $R^9$ represents hydrogen or a monovalent organic group, and q is a positive integer, preferably, an integer of 0 to 4.

The alkoxide used in the first stage reaction is provided by, for example, an sodium alkoxide or potassium alkoxide of the alcohol compound represented by general formula (6) described previously.

In the first stage, the reaction between the tetracarboxylic dianhydride and any of the alcohol compound, the amine compound and the alkoxide described above is carried out at room temperature or at about 25° to 200° C. A solvent may or may not be used in the reaction. Also, a catalyst may or may not be used in the reaction. In the case of using the alcohol compound represented by general formula (6), the primary or secondary amine represented by general formula (8) or the alkoxide noted above in the first stage reaction, produced is a compound which is represented by general formula (10) given below, which is included in the general formula (4) described previously:

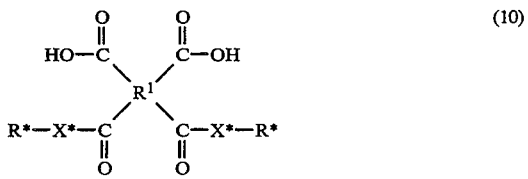

where X* is —O— or —N($R^9$)—, R* is $R^7$, $R^8$ defined previously or hydrogen, at least one of two R* groups being not hydrogen.

On the other hand, the diamine represented by general formula (5), which is used in the second stage reaction, is not particularly restricted. The specific diamine used in the present invention include, for example, aromatic diamines such as m-phenylenediamine, p-phenylenediamine, 2,4-tolylenediamine, 3,3'-diaminodiphenylether, 4,4'-diaminodiphenylether, 3,4'-diaminodiphenylether, 3,3'-diaminodiphenyl sulfone, 4,4'-diaminodiphenyl sulfone, 3,4'-diaminodiphenyl sulfone, 3,3'-diaminodiphenylmethane, 4,4'-diaminodiphenylmethane, 3,4'-diaminodiphenylmethane, 4,4'-diaminodiphenyl sulfide, 3,3'-diaminodiphenyl ketone, 4,4'-diaminodiphenyl ketone, 3,4'-diaminodiphenyl ketone, 2,2-bis (4-aminophenyl) propane, 2,2-bis (4-aminophenyl) hexafluoropropane, 1,3-bis (3-aminophenoxy) benzene, 1,3-bis (4-aminophenoxy) benzene, 1,4-bis (4-aminophenoxy) benzene, 4-methyl-2,4-bis (4-aminophenyl)-1-pentene, 4-methyl-2,4-bis (4-aminophenyl)-2-pentene, 1,4-bis (α,α-dimethyl-4-aminobenzyl) benzene, imino-di-p-phenylenediamine, 1,5-diaminonaphthalene, 2,6-diaminonapthalene, 4-methyl-2,4-bis (4-aminophenyl) pentane, 5 (or 6)-amino-1-(4-aminophenyl)-1,3,3-trimethylindane, bis (p-aminophenyl) phosphine oxide, 4,4'-diamino azobenzene, 4,4'-diaminodiphenylurea, 4,4'-bis (4-aminophenoxy) biphenyl, 2,2-bis [4-(4-aminophenoxy) phenyl] propane, 2,2-bis [4-(4-aminophenoxy) phenyl] hexafluoropropane, 2,2-bis [4-(3-aminophenoxyphenyl] benzophenone, 4,4'-bis (4-aminophenoxy) diphenyl sulfone, 4,4'-bis [4-α,α-dimethyl-4-aminobenzyl) phenoxy] benzophenone, 4,4'-bis [4-(α,α-dimethyl-4-aminobenzyl) phenoxy] diphenyl sulfone, bis (4-aminophenyl) dimethylsilane, and bis (4-aminophenyl) tetramethylsiloxane. It is also possible to use derivative of these aromatic diamines, in which at least one substituent selected from the group consisting of chlorine, fluorine, bromine, methyl, methoxy, cyano and phenyl is substituted for the hydrogen atom bonded to the aromatic ring of the aromatic diamine. Further, it is possible to use 3,5-diamino-1-hydroxybenzene, 3,3'-dihydroxy-4,4'-diaminobiphenyl, 4,4'-dihydroxy-3,3'-diaminobiphenyl, 2,2-bis (4-amino-3-hydroxyphenyl) propane, bis (3-amino-4-hydroxyphenyl) sulfide, bis (3-amino-4-hydroxyphenyl) sulfone, bis (3-amino-4-hydroxyphenyl) methane, bis (4-amino-3-hydroxyphenyl) methane, 2,2-bis (4-amino-3-hydroxyphenyl) hexafluoropropane, 2,2-bis (3-amino-4-hydroxyphenyl) hexafluoropropane, 2-(3-hydroxy-4-aminophenyl)-2-(3-amino-4-hydroxyphenyl) hexafluoropropane, bis (p-aminophenyl) tetramethyldisiloxane, bis (γ-aminopropyl) tetramethyldisiloxane, 1,4-bis (γ-aminopropyldimethylsilyl) benzene, bis (4-aminobutyl) tetramethyldisiloxane, bis (γ-aminopropyl) tetraphenyldisiloxane, 4,4'-diaminobiphenyl, phenylindanediamine, 3,3'-dimethoxy-4,4'-diaminobiphenyl, 3,3'-dimethyl-4,4'-diaminobiphenyl, o-toluidine sulfone, bis (4-aminophenoxyphenyl) sulfone, bis (4-aminophenoxyphenyl) sulfide, 1,4-bis (4-aminophenoxyphenyl) benzene, 1,3-bis (4-aminophenoxyphenyl) benzene, 9,9-bis (4-aminophenyl) anthracene (10), 9,9-bis (4-aminophenyl) fluorene, 4,4'-di-(3-aminophenoxy) diphenyl sulfone, 4,4'-diaminobenzamilide and the compound represented by a formula given below;

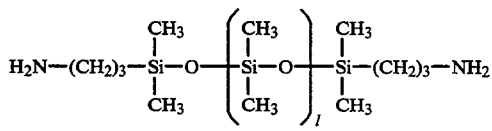

where l is an integer of 2 to 12.

These diamines can be used singly or in combination.

The dehydroating agent used in the second stage reaction includes, for example, sulfuric acid, hydrochloric acid, p-toluene sulfonic acid, cobalt acetate, manganese acetate, stannous chloride, stannic chloride, polyphosphate, triphenyl phosphite, bis-o-phenylene phosphate, N,N'-(phenylphosphino) bis [2(3H)-benzothizolone], a carbodimide derivative represented by general formula R—N=C=N—R' and, preferably, dicyclohexyl carbodiimide (DCC).

In general, a non-protogenic polar solvent is used as an organic solvent in the synthesis of the resin component having a repeating unit represented by general formula (1) because the non-protogenic polar solvent is advantageous in the polymer synthesis. In the synthesis of the polyamic acid derivative used in the present invention, however, it is also possible to use an aromatic hydrocarbon, tetrahydrofuran, dioxane, etc. as a solvent. The specific compounds of the solvent used in the present invention include, for example, ketone series solvents such as cyclohexanone, acetone, methyl ethyl ketone, and methyl isobutyl ketone; cellosolve series solvents such as methyl cellosolve, methyl cellosolve acetate, ethyl cellosolve acetate, and butyl cellosolve acetate; ester series solvents such as ethyl acetate, butyl acetate, and isoamyl acetate; ether series solvents such as tetrahydrofuran and dioxane; other solvents such as N,N-dimethylformamide, N,N-dimethylacetoamide, N-methyl-2-pyrrolidone, N-methyl-ε-caprolactam, γ-caprolactone, sulfolane, N,N,N',N'-tetramethylurea, hexamethylphosphoamide, toluene and xylene. These solvents may be used singly or in combination.

The second stage reaction can be carried out under cooling or heating, i.e., under the temperature falling with a range of between $-20°$ and $100°$ C., for about 30 minutes to 24 hours, preferably for about 1 to 8 hours, more preferably for 4 to 8 hours.

In the first method of synthesizing a polyamic acid derivative having a repeating unit represented by general formula (1), a monomer (carboxylic acid derivative) having a substituent (which corresponds to the alcohol compound, amine compound or alkoxide described previously) introduced into the carboxylic acid is formed in the first stage reaction. Then, in the second stage reaction, a polymer chain (polyamic acid derivative) having the substituent introduced into the side chain is formed by the polycondensation reaction between the monomer formed in the first stage reaction and the diamine described previously. In short, the first method of synthesizing the polyamic acid derivative is featured in that the reaction proceeds in the order of the substituent introduction and, then, the polymerization.

In the second method of synthesizing a polyamic acid derivative having a repeating unit represented by general formula (1), which is a resin component of the photosensitive resin composition according to the first embodiment of the present invention, a polymerization reaction is carried out in the first stage between the tetracarboxylic dianhydride represented by general formula (3) and the diamine represented by general formula (5). The molar ratio of the tetracarboxylic dianhydride to the diamine should be set at about 1.1:1.0 to 1.0:1.1, preferably 1.0:1.0. As a result, formed is a polyamic acid having a repeating unit represented by general formula (11) given below:

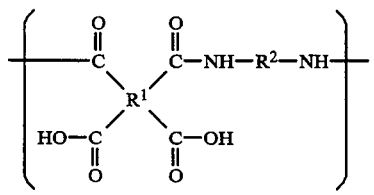

In the second stage, reaction is carried out within an organic solvent among the polyamic acid having a repeating unit represented by general formula (11) noted above, an alcohol compound, amine compound or alkoxide having at least one hydroxyl group directly bonded to the aromatic ring as described previously, and the dehydrating agent. In this stage, the molar ratio of the reactants should be set at about 1:1:1 to 1:2:2 (the molar amount of the polyamic acid having a repeating unit represented by general formula (11) calculated in terms of the tetracarboxylic acid units). In this stage, a dehydrating condensation reaction takes place between the polyamic acid having a repeating unit represented by general formula (11), and the alcohol compound, amine compound or alcoxide. As a result, the substituent is introduced into the side chain (carboxyl group) of the repeating unit (11) so as to form a polyamic acid derivative having a repeating unit represented by general formula (1).

Any kind of the tetracarboxylic dianhydride represented by general formula (3) and the diamine represented by general formula (5) can be used in the first stage reaction of the second method as far as these tetracarboxzlic dianhydride and diamine can be used in the first method of synthesizing the polyamic acid derivative described previously.

The polymerization reaction in the first stage of the second method can be carried out by any of the solution polymerization method, interfacial polymerization method and melt polymerization method. The organic solvent which can be used in the first method of synthesizing a polyamic acid derivative can also be used as a solvent in the solution polymerization method.

In the case of using the solution polymerization method in the first stage of the second method, the reaction temperature should be set at $-60°$ to $150°$ C. If the reaction temperature is lower than $-60°$ C., the reaction rate is very low. In this case, it is necessary to carry out the polymerization reaction for a long time. This is disadvantageous in the industrial manufacture of the polyamic acid derivative. Where the reaction temperature exceeds $150°$ C., however, side reactions tend to take place. Also, traces of water contained as an impurity in the reaction system brings about hydrolysis of the product polyamic acid having a repeating unit represented by general formula (11). It follows that the desired polymerization reaction is inhibited, and the molecular weight of the resultant polyamic acid having a repeating unit represented by general formula (11) tends to be lowered. Preferably, the solution polymerization should be carried out at a temperature falling within a range of between $-20°$ C. and $60°$ C.

In the case of employing the solution polymerization reaction method in the first stage, the reaction should be carried out for 30 minutes to 24 hours, preferably for 1 to 8 hours. If the reaction time is shorter than 30 minutes, the polymerization reaction fails to proceed sufficiently. If the reaction time exceeds 24 hours, however, no industrial merit can be obtained. Preferably, the reaction should be carried out for 1 to 8 hours. More preferably, the reaction should be carried out for 4 to 6 hours in order to avoid the difficulties noted above, i.e., the undesired side reactions and the hydrolysis, which is caused by an impurity, of the polyamic acid having a repeating unit represented by general formula (11).

In the second stage reaction included in the second synthesizing method described above, it is possible to use the compounds which can be used in the first method of synthesizing the polyamic acid derivative with respect to any of the alcohol compound, amine compound, and alkoxide having at least one hydroxyl group bonded to the aromatic ring, dehydrating agent and organic solvent.

In the second stage reaction, the amount of any of the alcohol compound, amine compound, and alkoxide is determined to fall within a range of between 1 mol and 4 mols depending on the reactivity of the specific compound used relative to 1 mol of the tetracarboxylic dianhydride represented by general formula (3), which is used in the first stage reaction. It is possible to control the amount of the substituent introduced into the side chain of the product polyamic acid derivative represented by general formula (1), i.e., the rate of introduction of the organic group into $R^3$ and $R^4$, by suitably controlling the amount of the alcohol compound, etc. noted above in accordance with the object and use of the final photosensitive resin composition. For example, where the photosensitive resin composition is used for forming a polyimide film pattern by the lithography technique, it is necessary for the composition to be soluble in an alkaline solution. In this case, it is desirable to set the amount of the additive at 2 mols or less relative to 1 mol of the tetracarboxylic dianhydride represented by general formula (3).

The second stage reaction is carried out under cooling or heating, i.e., under temperatures falling within a range of between $-60°$ to $200°$ C., for about 30 minutes to 24 hours. If the reaction temperature is lower than $-60°$ C., the reactivity of the dehydrating condensation reaction is markedly lowered. If the reaction temperature exceeds $200°$ C., however, side reactions such as decomposition and gelation of the main chain of the reactant polyamic acid having a repeating unit represented by general formula (11) tend to take place easily. The second stage reaction should be carried out preferably at $-60°$ to $100°$ C. for about 1 to 8 hours, more preferably at $-20°$ to $50°$ C. for about 4 hours.

As described above, the second method of synthesizing a polyamic acid derivative having a repeating unit represented by general formula (1) comprises the first stage reaction for forming a polymer chain (polyamic acid), and the second stage reaction for introducing the substituent (which corresponds to the alcohol compound, amine compound and alkoxide) into side chain of the polymer so as to synthesize the desired polyamic acid derivative. In short, the second method is featured in that the reactions proceed in the order of polymerization and, then, introduction of the substituent, which is opposite to that in the first method. It follows that, in the second method, the rate of polymerization reaction carried out in the first stage is promoted because the polymerization reaction, which is carried out between the acid anhydride and diamine, proceeds quantitatively. As a result, the formed polymer is enabled to have a sufficiently large molecular weight. In the first method, however, the condensation reaction involving the dehydrating agent does not necessarily proceed quantitatively in the polymerization reaction which is carried out in the second stage. In addition, since the substituent group is already bonded to the monomer, the monomer molecule is rendered bulky depending on the kind of the substituent group. It follows that the rate of the polymerization reaction tends to be lowered. In other words, the polymerization degree of the formed polymer tends to be low in some cases.

In the second method, however, the polymer formed by the side reaction, which is brought about by the dehydrating agent, is partly gelled. As a result, the polyimide film pattern formed by using the photosensitive resin composition containing said polymer tends to be lowered in resolution.

Under the circumstances, it is desirable to synthesize the polyamic acid derivative by the first method in the case of forming a fine polyimide film pattern of 10 microns or less.

On the other hand, the polyimide film pattern formed by using the photosensitive resin composition containing a polymer synthesized by the second method is excellent in its mechanical strength. It follows that, where the polyimide film pattern is required to exhibit a high mechanical strength, it is possible to employ the second method for synthesizing the polyamic acid derivative.

In the present invention, additional compounds given below can also be used as compounds for introducing substituent groups into the side chains of the polyamic acid derivative having a repeating unit represented by general formula (1), i.e., as compounds reacting with the tetracarboxylic dianhydride represented by general formula (3) in the first stage of the first method or as compounds reacting with the polyamic acid represented by general formula (11) in the second stage of the second method. Specifically, it is possible to use as such a compound any of an alcohol compound which does not have a hydroxyl group bonded to the aromatic ring, an amine compound which does not have a hydroxyl group bonded to the aromatic ring, an alkoxide which does not have a hydroxyl group bonded to the aromatic ring, and a phenol compound having only one hydroxyl group bonded to the aromatic ring together with the alcohol compound, amine compound and alkoxide having at least one hydroxyl group bonded to the aromatic ring.

The alcohol compound which does not have a hydroxyl group bonded to the aromatic ring includes, for example, methanol, ethanol, 1-propanol, isopropyl alcohol, 1-butanol, 2-butanol, isobutanol, t-butanol, 1-pentanol, 1-hexanol, benzyl alcohol, methylbenzyl alcohol, cynnamyl alcohol, methoxybenzyl alcohol, allyl alcohol, chrotyl alcohol, and 2-hydroxyethyl methacrylate.

The amine compound which does not have a hydroxyl group bonded to the aromatic ring includes, for example, methyl amine, ethyl amine, propyl amine, butyl amine, pentyl amine, hexyl amine, aniline, toluidine, ethyl aniline, and benzyl amine.

The alkoxide which does not have a hydroxyl group bonded to the aromatic ring includes, for example, sodium alkoxide and potassium alkoxide of the alcohol compounds noted above.

Further, the phenol compound noted above includes, for example, phenol, cresol, xylenol, butyl phenol, allyl phenol, and methoxy phenol.

In the case of using the compound which does not have a hydroxyl group bonded to the aromatic ring or the particular phenol compound noted above, the amount of the particular compound should desirably be about 80 mol % or less based on the total amount of the compounds used for introducing the substituent group into the side chains of the polyamic acid derivative. If the amount noted above is larger than 80 mol %, the solubility of the photosensitive resin composition in a developing solution is lowered, resulting in a low resolution of the polyimide film pattern formed by using the composition. More preferably, the amount of the particular compound should be 60 mol % or less.

In this case, it is possible for the particular polyamic acid derivative noted above and the polyamic acid derivative having the organic group, in which a hydroxyl group is bonded to the aromatic ring, introduced into the side chain to form a mixture in the resin component of the photosensitive resin composition of the present invention. It is also possible for these two kinds of the polyamic acid derivatives to form a copolymer.

The polyamic acid derivative having a repeating unit represented by general formula (1) is purified as follows. In the first step, methanol, ethanol, water or the like, which is used in an amount of about 1 to 2 mols per mol of the dehydrating agent, is added to the reaction solution of the polyamic acid derivative, and the system is stirred for 1 to 4 hours so as to bring about reaction of the unreacted dehydrating agent and, thus, to form a precipitate. Then, the precipitate is removed outside the system by means of filtering. The reaction solution thus prepared is slowly added to methanol, ethanol or water in an amount of 5 to 100 times as much as the amount of the reaction solution so as to precipitate a polymer. The resultant polymer is separated out by means of filtering and, then, washed with methanol, ethanol or water. Further, the washed polymer is dried under vacuum at 60° C. so as to isolate and purify the polyamic acid derivative.

In the photosensitive resin composition according to the second embodiment of the present invention, the resin component is provided by a mixture comprising a polyamic acid derivative having a repeating unit represented by general formula (1) given above and a polyamic acid having a repeating unit represented by general formula (2) given above. The polyamic acid derivative having a repeating unit represented by general formula (1) can be synthesized as in the polyamic acid derivative contained in the photosensitive resin composition according to the first embodiment of the present invention. Also, the polyamic acid derivative noted above can be synthesized by using the compounds similar to those used in the first embodiment of the present invention described previously.

On the other hand, the polyamic acid having a repeating unit represented by general formula (2) can be synthesized by any of the two methods described below.

In the first method, reaction between a tetracarboxylic dianhydride represented by general formula (12) given below and a diamine represented by general formula (13) given below is carried out within a suitable solvent. The reaction should be carried out at −20° C. to 20° C., preferably at −5° C. to 10° C., so as to obtain a polyamic acid having a repeating unit represented by general formula (2):

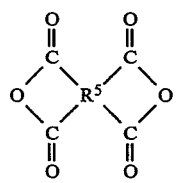 (12)

$H_2N-R^6-NH_2$ (13)

where $R^5$ and $R^6$ are as already defined in general formula (2).

In the first method, it is possible to use compounds similar to those of the tetracarboxylic dianhydride represented by general formula (3), the diamine represented by general formula (5) and the solvent used in the synthesis of the polyamic acid derivative having a repeating unit represented by general formula (1) as the tetracarboxylic dianhydride represented by general formula (12), the diamine represented by general formula (13) and the solvent, respectively.

In the second method, any one of a monoamine represented by general formula (14) given below and a dicarboxylic anhydride represented by general formula (15) given below is reacted with the tetracarboxylic dianhydride represented by general formula (12) and the diamine represented by general formula (13) in the presence of an organic solvent. In this case, a polycondensation reaction is carried out within the organic solvent so as to obtain a polyamic acid having a repeating unit represented by general formula (2):

   (14)

where, A represents a monovalent organic group.

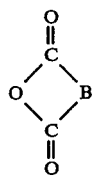   (15)

where, B represents a divalent organic group.

In the case of using the monoamine represented by general formula (14), the tetracarboxylic dianhydride represented by general formula (12) and the diamine represented by general formula (13) in the polycondensation reaction which is carried out in the second method, synthesized is a polyamic acid represented by general formula (16) given below as a polyamic acid having a repeating unit represented by general formula (2):

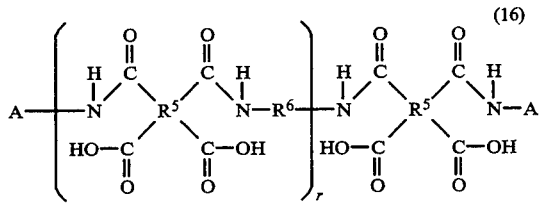   (16)

where r represents a positive integer.

On the other hand, in the case of using the dicarboxylic anhydride represented by general formula (15), the tetracarboxylic dianhydride represented by general formula (12) and the diamine represented by general formula (13) in the polycondensation reaction which is carried out in the second method, synthesized is a polyamic acid represented by general formula (17) given below as a polyamic acid having a repeating unit represented by general formula (2):

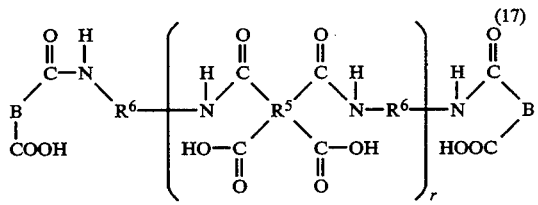   (17)

where s represents a positive integer.

The monoamine represented by general formula (14) includes, for example, m-aminodiphenyl, p-aminodiphenyl, m-aminodiphenyl ether, p-aminodiphenyl ether, aniline, o-anisidine, m-anisidine, p-anisidine, p-aminobenzaldehyde, o-toluidine, m-toluidine and p-toluidine.

The dicarboxylic anhydride represented by general formula (15) includes, for example, phthalic anhydride, hexahydrophthalic anhydride, methylnadicanhydride, 4-methylhexahydrophthalic anhydride, methyltetrahydrophthalic anhydride, and maleic anhydride.

In the case of employing the second method for the synthesis of the polyamic acid having a repeating unit represented by general formula (2), it is possible to use as the tetracarboxylic dianhydride represented by general formula (12) and the diamine represented by general formula (13) the compounds similar to those of the tetracarboxylic dianhydride represented by general formula (3) and the diamine represented by general formula (5), respectively, which are used for the synthesis of the polyamic acid derivative having a repeating unit represented by general formula (1).

Particularly, it is desirable in the present invention to use as the diamine represented by general formula (13) a siloxane compound because the use of the siloxane compound permits improving the adhesion between the polyimide film, which is finally obtained, and a semiconductor substrate.

The organic solvent used for the polycondensation reaction utilized in the second method of synthesizing a polyamic acid having a repeating unit represented by general formula (2) includes, for example, N,N-dimethylformamide, N,N-dimethylacetoamide, N-methyl-2-pyrrolydone, N-methyl-ε-caprolactam, γ-butyrolactone, sulfolane, N,N,N',N'-tetramethylurea and hexamethylphosphoamide.

In the second method of synthesizing a polyamic acid having a repeating unit represented by general formula (2), it is necessary to set the ratio of the sum of the monoamine represented by general formula (14) and the diamine represented by general formula (13) to the sum of the dicarboxylic anhydride represented by general formula (15) and the tetracarboxylic dianhydride represented by general formula (12) as follows. Specifically, the equivalent ratio of the amino group (—HN₂) to the

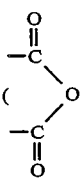

should be about 100:100. Further, in the second method, the reaction should be carried out at −15° to 30° C. for 10 minutes to 20 hours.

In order to improve the coating capability of the photosensitive resin composition or the polyamic acid on the surface of a semiconductor substrate, it is desirable for the resultant polyamic acid having a repeating unit represented by general formula (2) to have a logarithmic viscosity, as measured under a polymer concentration of 0.5 g/dl within a N-methyl-2-pyrrolidone solvent maintained at 30° C., of 0.4 to 1.0 dl/g, preferably 0.5 to 0.9 dl/g. In order to control the logarithmic viscosity of the polyamic acid having a repeating unit represented by general formula (2) to fall within the range noted above in the second method of synthesizing the polyamic acid having a repeating unit represented by general formula (2), it is necessary to control the mixing ratio of the raw materials as described below.

In the case of synthesizing a polyamic acid represented by general formula (16) by utilizing the polycondensation reaction among the monoamine represented by general formula (14), the tetracarboxylic dianhydride represented by general formula (12) and the diamine represented by general formula (13), the molar ratio of the monoamine (14) to the diamine (13) should be 0.01 to 0.2:0.9 to 0.995, preferably 0.02 to 0.06:0.97 to 0.99. If the mixing amount of the monoamine (14) is unduly large, the logarithmic viscosity of the synthesized polyamic acid (16) is lowered, resulting in failure to obtain a cured film having a smooth surface. On the other hand, if the mixing amount of the monoamine (14) is unduly small, it is impossible to obtain a sufficient effect on treating the molecular terminal of the polyamic acid (16), with the result that a difficulty is brought about in terms of workability.

In the case of synthesizing the polyamic acid represented by general formula (17) by utilizing the polycondensation reaction among the dicarboxylic anhydride (15), the tetracarboxylic dianhydride (12) and the diamine (13), the molar ratio of the dicarboxylic anhydride (15) and the tetracarboxylic dianhydride (12) should be 0.01 to 0.2:0.9 to 0.995, preferably 0.02 to 0.06:0.97 to 0.99. If the mixing amount of the dicarboxylic anhydride (15) is unduly large, the logarithmic viscosity of the synthesized polyamic acid (17) is lowered, resulting in failure to obtain a cured film having a smooth surface. On the other hand, if the mixing amount of the dicarboxylic anhydride (15) is unduly small, it is impossible to obtain a sufficient effect on treating the molecular terminal of the polyamic acid (17), with the result that a difficulty is brought about in terms of workability.

In the case of using a siloxane compound as a diamine (13) in the synthesis of the polyamic acid (16) or (17), it is desirable to use the siloxane compound in an amount of 0.01 to 20 mol % based on the total amount of the amine compounds (monoamine being calculated in terms of diamine). If the mixing amount of the siloxane compound exceeds 20 mol %, the heat resistance of the final polyimide film tends to be lowered. On the other hand, if the mixing amount of the siloxane compound is smaller than 0.01 mol %, it is impossible to obtain the effect of improving adhesion between the polyimide film and the semiconductor substrate.

In the present invention, it is desirable to employ the second method, which uses the monoamine (14) and the dicarboxylic anhydride (15), for synthesizing the polyamic acid having a repeating unit represented by general formula (2), because the second method permits stably synthesizing a polyamic acid of a desired chemical structure.

The photosensitive resin composition according to the second embodiment of the present invention contains as resin components both a polyamic acid derivative having a repeating unit represented by general formula (1) and a polyamic acid having a repeating unit represented by general formula (2). The mixing amount of the polyamic acid derivative should be 20 to 98 parts by weight based on 100 parts by weight of the total amount of the resin components, preferably 30 to 95 parts by weight. If the mixing amount of the polyamic acid derivative is smaller than 20 parts by weight, the rate of dissolution in a developing solution is increased in both the light exposed portion and the non-exposed portion in the case of patterning a polyimide film, which is formed by using the photosensitive resin composition of the present invention, by means of photolithography or the like. It follows that a contrast of the desired relief image is lowered. It should also be noted that the polyamic acid serves to improve the mechanical strength of the final polyimide film. In order to obtain a sufficient effect of improving the mechanical strength, it is necessary to use at least 20 parts by weight of the polyamic acid.

As in the photosensitive resin composition according to the first embodiment of the present invention, it is possible for the photosensitive resin composition according to the second embodiment of the present invention to contain a polyamic acid derivative having a substituent group, which does not have a hydroxyl group bonded to the aromatic ring, introduced into the side chain.

The photosensitive resin composition according to the third embodiment of the present invention contains as a resin component a polyamic acid derivative having a copolymer structure including a repeating unit represented by general formula (1) given above and a repeating unit represented by general formula (2) given above. It is possible to synthesize the polyamic acid derivative having a copolymer structure by a method similar to the first method of synthesizing the polyamic acid derivative contained in the photosensitive resin composition according to the first embodiment of the present invention.

Specifically, in a first stage, the tetracarboxylic dianhydride (3) is reacted with any of the alcohol compound having at least one hydroxyl group bonded to the aromatic ring, the amine compound having at least one hydroxyl group bonded to the aromatic ring, and the alkoxide having at least one hydroxyl group bonded to the aromatic ring so as to obtain the compound represented by general formula (4). The molar ratio of the tetracarboxylic dianhydride to the additive should be set at 1:1 to 1:2. The reaction may be carried out in the presence or absence of a solvent at room temperature or under heating.

In a second stage, reaction among the compound (4), the diamine (5) and the dehydrating agent is carried out within an organic solvent. The molar ratio of these reactants should be set at s: (s+t): 2s or more (s and t being a positive integer). The reaction may be carried out under cooling or heating condition for about 1 to 8 hours, preferably for at least 4 hours.

Further, in a third stage, t mol of the tetracarboxylic dianhydride (3) is added to the reaction solution prepared in the second stage so as to carry out a reaction at 0° to 20° C. for about 1 to 8 hours, preferably for at least 4 hours. As a result, prepared is a polyamic acid derivative of a copolymer structure having the repeating units represented by both general formula (1) and general formula (2). In this case, $R^1$ and $R^2$ included in general formulas (1) and (2) are equal to $R^5$ and $R^6$, respectively.

In the second stage, the compound (4) fails to react completely with the diamine depending on the kind of the dehydrating agent used. In some cases, unreacted diamine (5) remains in the reaction product even if t mols of the tetracarboxylic dianhydride (3) is added in the third stage. If unreacted diamine remains in the photosensitive resin composition, the stability tends to be impaired with respect to the photosensitive agent, in particular o-quinone diazide compound, which will be described herein later. In order to decrease the amount of the remaining unreacted diamine, it is possible to add more than t mols of the tetracarboxylic dianhydride in the third stage. Alternatively, it is possible to carry out a equivalent reaction between the compound (4) and diamine (5) in the second stage, followed by adding an excessive amount of the tetracarboxylic dianhydride (3) in the third stage in order to treat the unreacted diamine. It is possible to increase the molecular weight of the resin component by allowing the tetracarboxylic dianhydride (3) to react with the unreacted reactant.

In the synthesis of the resin component contained in the photosensitive resin composition according to the third embodiment of the present invention, it is possible to use any of the compounds used in the synthesis of the resin component contained in the photosensitive resin compositions according to the first and second embodiments of the present invention with respect to any of the tetracarboxylic dianhydride (3), the alcohol compound having at least one hydroxyl group bonded to the aromatic ring, the amine compound having at least one hydroxyl group bonded to the aromatic ring, the alkoxide having at least one hydroxyl group bonded to the aromatic ring, the diamine (5), the dehydrating agent and any of the solvents.

In the synthesis of the resin component contained in the photosensitive resin composition according to the third embodiment of the present invention, it is possible to use an alcohol compound which does not have a hydroxyl group bonded to the aromatic ring, an amine compound which does not have a hydroxyl group bonded to the aromatic ring, alkoxide which does not have a hydroxyl group bonded to the aromatic ring, or a phenol compound having only one hydroxyl group bonded to the aromatic ring together with the alcohol compound having at least one hydroxyl group bonded to the aromatic ring, the amine compound having at least one hydroxyl group bonded to the aromatic ring, the alkoxide having at least one hydroxyl group bonded to the aromatic ring, as in the photosensitive resin composition according to the first embodiment of the present invention.

The ratio (s/t) in the amount of the repeating units (1) to the repeating units (2) need not be specified in the copolymer structure of the resin component because properties of the resin film which is finally obtained differ depending on the raw material resins used. However, in the case where the photosensitive resin composition is of positive type, in which light-exposed portion is dissolved in an alkaline developing solution depending on the kind of the photosensitive agent described later, the number of carboxyl groups of the polyamic acid is increased with increase in the value of t noted above, with the result that the solubility in the alkaline developing solution is increased even in the non-exposed portion, too. It follows that it is impossible to obtain a sufficiently large difference in the solubility in the alkaline developing solution between the exposed portion and the non-exposed portion in the stage of development. On the other hand, if the value of t is unduly small, some portion of the diamine (5) tends to remain unreacted, with the result that the stability of the photosensitive agent tends to be impaired, as described previously. It follows that it is desirable for the value of s/t to fall within a range of between 2 and 20.

The order of arrangement of the repeating units (1) and the repeating units (2) in the copolymer structure of the resin component is not particularly restricted in the photosensitive resin composition according to the third embodiment of the present invention. In other words, it is possible for the polyamic acid derivative of the copolymer structure to be any of an alternate copolymer, random copolymer, and block copolymer.

The photosensitive resin composition of the present invention contains a photosensitive agent. In the present invention, the photosensitive agent can be commonly used for the photosensitive resin compositions of the first, second and third embodiments. The specific compounds used as the photosensitive agent in the present invention include, for example, o-quinone diazide compound, azide compound and diazo compound.

In the case of using o-quinone diazide compound, compounds having at least one o-quinone diazide group in the molecule, e.g., compounds QD-1 to QD-15 shown in Table A, can be used singly or in combination. It is particularly desirable to use as the photosensitive agent aromatic esters of o-naphthoquinone diazide sulfonic acid including, for example, 1,2-naphthoquinone diazide sulfonic acid esters of 2,3,4-trihydroxy benzophenone such as compounds QD-1 and QD-2 shown in Table A, and 1,2-naphthoquinone diazide sulfonic acid esters of 2,3,4,4'-tetrahydroxy benzophenone such as compounds QD-4 and QD-5 shown in Table A.

For example, compound QD-4, i.e., 1,2-naphthoquinone diazide-5-sulfonic acid ester of 2,3,4,4'-tetrahydroxybenzophenone, is suitable for use as a photosensitive agent for the exposure to g-rays. Compound QD-5, i.e., 1,2-naphthoquinone diazide-4-sulfonic acid ester of 2,3,4,4'-tetrahydroxybenzophenone, is suitable for use as a photosensitive agent for the exposure to an ultraviolet radiation having a wavelength shorter than that of g-rays. In the photosensitive agent of 1,2-naphthoquinone diazide-4-sulfonic acid ester of 2,3,4,4'-tetrahydroxybenzophenone, the esterification rate of 2,3,4,4'-tetrahydroxybenzophenone with 1,2-naphthoquinone diazide-4-sulfonic acid is in general 40 to 100% based on the total number of hydroxyl groups contained in the benzophenone compound. In other words, the number of naphthoquinone diazide groups introduced into a single molecule of 2,3,4,4'-tetrahydroxy benzophenone, which has four hydroxyl groups, is 1.6 to 4 on the average. It follows that this photosensitive agent is equal to a mixture of sulfonic acid esters having 1, 2, 3 or 4 naphthoquinone azide compounds.

In the present invention, it is also possible to use 1,2-naphthoquinone diazide-4-sulfonic acid esters, e.g., compounds QD-16 to QD-51 shown in Table B, as the o-quinone diazide compound acting as the photosensitive agent.

These naphthoquinone diazide compounds can be easily prepared by reacting a naphthoquinone diazide sulfonyl chloride represented by the formula given below with any of alcohols, phenols or amines so as to remove HCl:

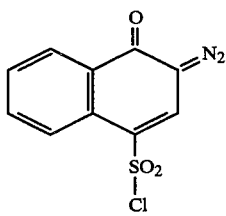

where an azide compound is used as a photosensitive agent contained in the photosensitive resin composition of the present invention, compounds A-1 to A-18 shown in Table C can be used singly or in combination.

Where a diazo compound is used as a photosensitive agent in the photosensitive resin composition of the present invention, it is desirable to use a diazo compound represented by general formula (18) given below:

(18)

where $R^{10}$ and $R^{11}$, which may be the same or different, represent substituted or unsubstituted alkyl group having 1 to 20 carbon atoms, substituted or unsubstituted aryl group, substituted or unsubstituted alkyl group having 1 to 20 carbon atoms and a silicon atom, or substituted or unsubstituted aryl group having a silicon atom.

The diazo compound represented by general formula (18) permits forming a fine polyimide film pattern in the case of using, particularly, a deep ultraviolet radiation. Specific compounds DA-1 to DA-22 shown in Table D can be used singly or in combination as the diazo compound represented by general formula (18).

The photosensitive resin compositions according to the first to third embodiments of the present invention can be prepared as follows by using the resin components and the photosensitive agent components described above.

Specifically, a photosensitive agent is dissolved in a solution of a resin component synthesized within an organic solvent as described previously so as to prepare a varnish. It is desirable for the varnish to have a polymer (resin component) concentration of 5 to 40% by weight.

In preparing the varnish, the addition amount of the photosensitive agent should be controlled as follows. In the case of the photosensitive resin composition according to the first or third embodiment of the present invention, it is desirable to set the amount of the photosensitive agent at 0.1 to 30 parts by weight based on 100 parts by weight of the amount of the resin component, i.e., the polyamic acid derivative having a repeating unit represented (1), or the polyamic acid derivative of a copolymer structure having a repeating unit (1) and a repeating unit (2). Where the amount of the photosensitive agent is smaller than 0.1 parts by weight, the resultant photosensitive resin composition fails to exhibit a sufficiently high sensitivity to light in the light exposure step. On the other hand, where the amount of the photosensitive agent is larger than 30 parts by weight, it is impossible to obtain a sufficient difference in solubility in a developing solution between the exposed portion and the non-exposed portion of the photosensitive resin composition layer, resulting in failure to obtain a desired polyimide film pattern.

In the case of using the photosensitive resin composition according to the second embodiment of the present invention, it is desirable to set the amount of the photosensitive agent to fall within a range of between 5 and 50 parts by weight, preferably between 10 and 30 parts by weight, based on the sum of the polyamic acid derivative having a repeating unit (1), the polyamic acid having a repeating unit (2), and the photosensitive agent, the sum being set at 100 parts by weight. If the amount of the photosensitive agent is smaller than 5 parts by weight, the resultant photosensitive resin composition fails exhibit a sufficiently high sensitivity to light in the step of light exposure. On the other hand, if the amount is larger than 50 parts by weight, the residue of the photosensitive agent component after the development raises a serious problem.

It is possible to add as desired a photosensitizer, a dye, a surfactant, an alkali-soluble resin, etc. to the photosensitive resin composition of the present invention. The alkali-soluble resin, which is not particularly restricted in the present invention, includes, for example, poly-p-vinyl phenol, poly-o-vinyl phenol, poly-m-isopropyl phenol, m,p-cresol novolak resin, xylesol novolak resin, copolymer of p-vinyl phenol and methyl methacrylate, copolymer of p-isopropenyl phenol and maleic anhydride, polymethacrylic acid, and polymers having the repeating units shown in Table E.

Let us describe the functions of the photosensitive resin compositions according to the first to third embodiments of the present invention with reference to the process of forming a polyimide passivation film or a polyimide interlayer insulting film using the compositions.

The photosensitive resin composition of the present invention performs different functions in the steps of exposure and development depending on the chemical structure of the resin component used, the kind of the photosensitive agent used, and the pattern forming method. The following description covers the case where o-quinone diazide compound and an azide compound are used as the photosensitive agent.

Let us describe first the function of the photosensitive resin composition of the present invention in the case where an o-quinone diazide compound, i.e., 1,2-naphthoquinone diazide-5-sulfonic acid ester, is used as the photosensitive agent. In this case, the photosensitive resin compositions according to the first to third embodiments of the present invention perform substantially the same function.

In the first step, the photosensitive resin composition according to any of the first to third embodiments of the present invention, which contains 1,2-naphthoquinone diazide-5-sulfonic acid ester as the photosensitive agent, is filtered so as to remove fine impurities from the composition, followed by coating a semiconductor substrate with the composition by means of the rotary coating method or the dipping method. Then, the coating is heated and dried (baked) so as to form a photosensitive resin composition layer. It should be noted that the photosensitive resin composition of the present invention exhibits an excellent solubility in a solvent. This facilitates the coating process and, thus, the composition is suitable for forming a thick layer.

In the next step, the photosensitive resin composition layer is pre-cured at 60° to 100° C., followed by selectively exposing the composition layer through a desired mask pattern to an energy beam such as an x-ray, visible light, infrared radiation, ultraviolet radiation, and an electron beam (exposure step). In this step, the o-naphthoquinone diazide sulfonic acid ester portion (19) of the photosensitive agent in the exposed portion of the photosensitive resin composition is converted into a ketene represented by general formula (20) given below by the photochemical reaction and water within the system, as shown below:

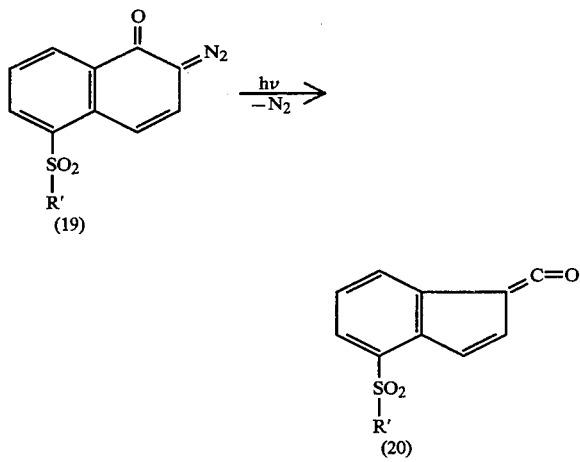

where R' represents a monovalent organic group.

After the light exposure step, a baking treatment is applied to the photosensitive resin composition layer at about 90° to 200° C. for about 5 seconds to 60 minutes. By this baking treatment, the ketene (20) formed as a result of the exposure reacts with the active hydrogen contained in the resin component in the exposed portion so as to crosslink the polymer chains. On the other hand, the o-naphthoquinone diazide sulfonic acid ester contained in the resin composition is partially decomposed by the baking treatment in the non-irradiation portion (non-exposed portion).

In the next step, a development is applied to the photosensitive resin composition layer after the baking treatment by means of, for example, a dipping method using an alkaline aqueous solution or a spraying method (developing step). The alkaline aqueous solution used in the present invention includes an inorganic alkaline aqueous solution such as an aqueous solution of potassium hydroxide or sodium hydroxide and an organic alkaline aqueous solution such as an aqueous solution of propyl amine, butylamine, monoethanolamine, ethylenediamine, trimethylenediamine, trimethylammonium hydroxide, hydrazine, or tetramethylammonium hydroxide. These alkaline aqueous solutions can be used singly or in combination. It is also possible to add to these amine compounds a poor solvent for the photosensitive resin composition of the present invention such as methanol, ethanol, 2-propanol, ethylene glycol, ethylene cellosolve, butyl cellosolve, diethylene glycol, ethyl carbitol or water. Alternatively, the amine compound noted above may be mixed with a solvent used for preparing the photosensitive resin composition of the present invention such as N-methylpyrrolidone, N,N-dimethylformamide, N,N-dimethylacetoamide, or dimethylsulfoxide.

The photosensitive agent, i.e., o-naphthoquinone diazide sulfonic acid ester, is partially decomposed in the non-exposed portion of the photosensitive resin composition layer, with the result that the capability of inhibiting the dissolution in an alkaline solution, said capability being inherent in the photosensitive resin composition, tends to be lowered or lost. It follows that the non-exposed portion is made soluble in the alkaline developing solution. In the exposed portion, however, the resin component is crosslinked as described previously. It follows that the molecular weight of the resin component is increased and, thus, the resin component is not dissolved in the alkaline developing solution. In other words, the exposed portion alone is selectively left unremoved in the developing step.

As described above, the photosensitive resin composition according to any of the first to third embodiments of the present invention performs the function of a negative photosensitive material in some cases, i.e., a photosensitive material in which the exposed portion is rendered insoluble in the developing solution in the exposure and developing steps in the case where a pattern is formed by the steps described above using an o-naphthoquinone diazide compound, i.e., 1,2-naphthoquinone diazide-5-sulfonic acid ester, as a photosensitive agent. However, the function noted above is not necessarily produced in the process of forming a pattern. It should also be noted that, in the case of using an o-quinone diazide compound as a photosensitive agent, it is possible to omit the baking treatment after the light exposure step, i.e., post-exposure baking (PEB). In the above-described process of forming a pattern, however, the post-exposure baking is highly effective for partially imidizing the polymer in the photosensitive resin composition layer so as to control the dissolving rate of the composition layer in the alkaline developing solution and to improve the contrast of the finally obtained pattern. In addition, the post-exposure backing serves to improve the adhesion between the resin composition layer and the semiconductor substrate, with the result that the resin composition layer can be prevented from being peeled off the semiconductor substrate in the developing step.

Further, the post-exposure baking permits forming a satisfactory negative pattern even in the case of using a photosensitive resin composition containing as a resin component a polyamic acid derivative which does not have a substituent group having a hydroxyl group bonded to the aromatic ring, said substituent group being introduced into the side chain of said derivative, and as a photosensitive agent component an o-naphthoquinone diazide compound. To be more specific, the polyamic acid derivative noted above includes, for example, a polyamic acid derivative which is obtained in the case of using singly an alcohol compound, amine compound, alkoxide, each of which does not have a hydroxyl group bonded to the aromatic ring, or a phenol compound having only one hydroxyl group bonded to the aromatic ring, as a compound for introducing a substituent group into the side chain of the polymer in the synthesis of the polyamic acid derivative described previously.

To reiterate, the post-exposure baking permits forming a satisfactory negative pattern in the case where the photosensitive resin composition contains the particular polyamic acid derivative noted above. The formation of a satisfactory negative pattern is supposed to be derived from the reactions described below. Specifically, the post-exposure baking causes the o-naphthoquinone diazide sulfonic acid ester contained in the resin composition to be partially decomposed so as to form a ketene in the non-exposed portion of the resin composition layer. The ketene thus formed is converted into a carboxylic acid by the water in the system, resulting in an increased solubility of the non-exposed portion in the alkaline developing solution. It follows that, since a substituent group which does not have a hydroxyl group bonded to the aromatic ring is introduced into the side chain, the non-exposed portion is made soluble in the alkaline developing solution even in the case of using a polyamic acid derivative which is originally low in its solubility in the alkaline developing solution. On the other hand, the post-exposure baking permits crosslinking the resin component in the exposed portion of the resin composition layer as in the case of using a polyamic acid derivative having a substituent group, which has a hydroxyl group bonded to the aromatic ring, introduced into the side chain, with the result that the exposed portion is made substantially insoluble in the alkaline developing solution. In conclusion, the exposed portion alone is selectively left unremoved in the developing step so as to form a satisfactory negative pattern.

Also, where the photosensitive resin composition according to any the first to third embodiments of the present invention contains an o-quinone azide as a photosensitive agent, the composition is enabled to perform the function of a negative photosensitive material by applying various treatments besides the patterning step involving the post-exposure baking described above. Further, a negative photosensitivity can be imparted to the photosensitive resin composition of the present invention, for example, by adding a basic substance such as imidazole to the resin composition, by exposing the entire substrate coated with the resin composition after the exposure step and the post-exposure baking step to an ultraviolet ray, or by heating the substrate after the exposure step under a steam atmosphere of ammonia, alkyl amine or the like.

Further, it is possible to apply a rinsing treatment with water, alcohol, acetone or the like after the development in order to remove the developing solution residue, followed by applying a baking treatment.

In the photosensitive resin composition of the present invention using an o-quinone diazide compound as a photosensitive agent, it is particularly desirable to form a pattern in accordance with the process described above. In this case, the post-exposure baking is not particularly required, though the photosensitive resin composition performs a function different from that describe above in this case.

Specifically, the o-naphthoquinone diazide sulfonic acid ester portion (19) of the molecule in the exposed portion of the layer of the photosensitive resin composition of the present invention is converted after the light exposure step into the ketene (20) by the photochemical reaction and by the water present in the system, as described previously. Then, a development is applied to the photosensitive resin composition layer after the exposure step without applying a baking treatment. The development is performed by means of a dipping method using an alkaline aqueous solution or by a spraying method. It should be noted that, in the non-exposed portion of the photosensitive resin composition layer, the o-naphthoquinone diazide sulfonic acid ester acts as an dissolution inhibitor serving to prevent the resin composition from being dissolved in the alkaline aqueous solution. It follows that the non-exposed portion of the resin composition layer is made more unlikely to be dissolved in the developing solution than the polymer alone.

In the exposed portion of the photosensitive resin composition layer, however, the ketene (20) converted by the photochemical reaction from o-naphthoquinone diazide sulfonic acid ester as described above is further converted into a carboxylic acid (21) by the water present in the system, as shown below:

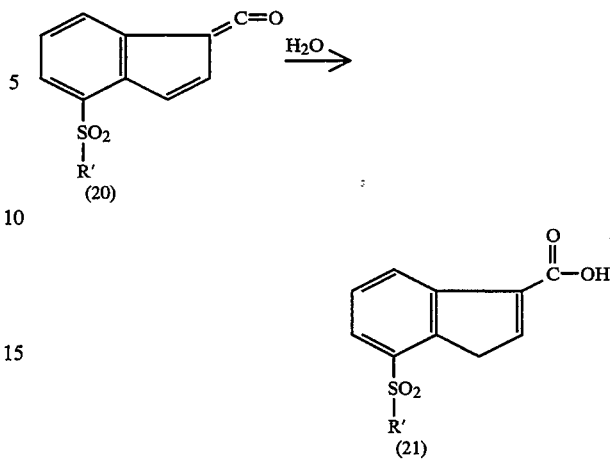

where R' represents a monovalent organic group.

Since the carboxyl group of the carboxylic acid (21) reacts with the alkali metal ion or ammonium ion present in the alkaline developing solution so as to form a salt, with the result that the exposed portion is made soluble. In other words, the non-exposed portion alone is left unremoved in the development.

As described above, the photosensitive resin composition according to any of the first to third embodiments of the present invention is enabled to perform the function of a positive photosensitive material in which the exposed portion is made soluble in the developing solution, if the development is applied without employing the post-exposure baking in the case where the composition contains an o-quinone diazide compound, i.e., 1,2-naphthoquinone diazide-5-sulfonic acid ester, as a photosensitive agent. Where the composition performs the function of a positive photosensitive material, however, the carboxylic acid (21) formed in the exposed portion fails to make the exposed portion sufficiently soluble in the developing solution in some cases. In such a case, the carboxyl group having a repeating unit represented by general formula (2), which is contained in the resin component, performs the function similar to that performed by the carboxyl group of the carboxylic acid (21) noted above, when it comes to the photosensitive resin composition according to any of the second and third embodiments of the present invention. Since the carboxyl group of the repeating unit (2) also forms a alkali salt, the solubility of the exposed portion of the photosensitive resin composition in the alkaline developing solution is promoted so as to improve the resolution of the polyimide film pattern which is finally formed.

As described previously, it is possible to apply a rinsing treatment with water, alcohol, acetone, etc. after the development in order to remove the developing solution residue, followed by applying a baking treatment.

As described previously, it is possible for the photosensitive resin composition according to any of the first to third embodiments of the present invention to contain an azide compound as a photosensitive agent. In the case of containing an azide compound as a photosensitive agent, the photosensitive resin compositions according to the first to third embodiments of the present invention perform substantially the same function.

In the first step, a semiconductor substrate is coated with a photosensitive resin composition containing an azide compound as a photosensitive agent, as in the case of coating the substrate with a composition containing an o-quinone diazide compound. The photosensitive resin composition layer is precured, followed by irradiating the surface of the resin composition layer with such an energy beam as described previously through a desired mask pattern. In this stage, the azide compound (22) given below, which is contained in the irradiated portion (exposed portion) of the photosensitive resin composition layer, is converted into a nitrene radical (23) by the light irradiation, as shown below:

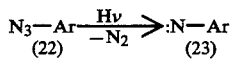

The nitrene radical (23) thus formed reacts with the hydroxyl group bonded to the aromatic ring, which is introduced into a polyamic acid derivative in the resin component of the exposed portion, performs a hydrogen-withdrawing reaction and a crosslinking reaction with a double bond of the resin component so as to crosslink the polymer chains of the resin component.

In the next step, a baking treatment, i.e., post-exposure baking, is applied to the photosensitive resin composition layer after the exposure step at about 90° to 200° C. for about 5 seconds to 60 minutes. The post-exposure baking permits further strengthening the crosslinkage of the polymer chains of the resin component in the exposed portion, i.e., the crosslinkage formed by the function of the nitrene radical (23) in the exposed portion.

After the post-exposure baking, a development is applied to the photosensitive resin composition layer by means of a dipping method using an alkaline aqueous solution, a spraying method, etc. as in the development described previously. It should be noted that, in the non-exposed portion of the photosensitive resin composition layer, the hydroxyl group bonded to the aromatic ring remaining in the polyamic acid derivative in the resin component reacts with the alkali metal ion or ammonium ion present in the alkaline developing solution so as to form a phenoxide and, thus, the resin composition is dissolved in the alkaline developing solution.

In the exposed portion, however, the resin component is crosslinked as described above, with the result that the molecular weight of the resin component is increased and, thus, the resin composition is made insoluble in the alkaline developing solution. It follows that the exposed portion alone is selectively left unremoved after the development. In other words, the photosensitive resin composition according to any of the first to third embodiments of the present invention performs the function of a negative photosensitive material, in which the exposed portion is rendered insoluble in the developing solution in the exposure and developing steps in the case where the composition contains an azide compound as a photosensitive agent and a pattern formation is carried out by the process described above.

In the case of using an azide compound as a photosensitive agent, it is possible to omit the post-exposure baking as in the case of using an o-quinone diazide compound described previously. However, it is desirable to apply the post-exposure baking in order to improve the contrast of the formed pattern and the adhesion between the resin composition film and the semiconductor substrate.

Further, it is possible to apply a rinsing treatment with water, alcohol, acetone, etc. after the development in order to remove the developing solution residue, followed by applying a baking treatment or the like.

In the present invention, it is possible to form a thin polyamic acid film on a substrate before formation of a passivation film or an interlayer insulating film by using the photosensitive resin composition of the present invention. In this case, a semiconductor substrate is coated first with a polyamic acid, followed by heating and drying (baking) the coating at about 90° to 200° C. for about 10 seconds to 60 minutes so as to form a polyamic acid film having a thickness of about 0.1 to 100 microns, preferably about 0.2 to 50 microns. Then, the polyamic acid film is further coated with a photosensitive resin composition of the present invention in a thickness of about 0.5 to 100 microns, followed by heating and drying (baking) the resin composition coating at 70° to 170° C. for about 10 seconds to 60 minutes so as to form a resin composition layer. After formation of the resin composition layer, applied is the pattern forming process such as the light-exposure and development described above.

The polyamic acid film formed first on the substrate is not particularly restricted, as far as the polyamic acid exhibits a satisfactory heat-resistance and a high adhesion with the substrate. In general, used is a polyamic acid prepared by the reaction between an acid anhydride and a diamine. In order to improve the adhesion between the polyamic acid film and the substrate, it is possible to use a polyamic acid copolymer having a small amount of siloxane diamine units. It is also possible to add a small amount of a silane coupling agent to the polyamic acid. Further, in order to impart a flexibility to the main chain of the polyamic acid and to improve the adhesion between the polyamic acid film and the substrate, it is possible to use a polyamic acid having a benzophenone skeleton or biphenyl skeleton in the acid component. It should be noted that a polyamic acid film generally fails to exhibit a high adhesion with the substrate, if the molecular weight of the polyamic acid is unduly small. Thus, the polyamic acid used for forming a film on the substrate should desirably have a molecular weight of at least 10,000.

Where a polyamic acid film is formed in advance on the substrate surface as described above, it is possible to improve the adhesion between the resin composition layer and the substrate. Even in this case, the photosensitive resin composition of the present invention performs the function of a positive or negative photosensitive material in the light-exposure and developing steps depending on the chemical structure of the resin component, the kind of the photosensitive agent used, and the pattern forming process employed. Incidentally, the polyamic acid film formed first on the substrate is developed simultaneously with the photosensitive resin composition layer of the present invention in the developing step.

The pre-treatment described above for forming a polyamic acid film on a substrate is also effective in the case of forming a polyimide film pattern by using an alkali-soluble photosensitive polyimide described in Published Unexamined Japanese Patent Application No. 64-630 referred to previously. In this case, a polyamic acid thin film is formed first on a semiconductor substrate, followed by forming a photosensitive polyimide film on the polyamic acid film. Further, a exposuse and development are applied as desired to the photosensitive polyimide film so as to form a desired pattern. It should be noted that the polyamic acid film formed first on the substrate is developed in the developing step by an alkaline developing solution simultaneously with the photosensitive polyimide film. In the next step, the resultant pattern is heated so as to cure and obtain a desired polyimide film pattern. It is important to note that the pre-treatment noted above permits improving the adhesion between the polyimide film pattern and the semiconductor substrate.

Table F shows examples of the photosensitive resin composition of the present invention which are desirably used for the process of forming a polyimide film pattern comprising the step of forming in advance a polyamic acid film on a substrate surface.

The photosensitive resin composition according to any of the first to third embodiments of the present invention performs the functions described below regardless of the kind of the photosensitive agent used and the process of forming a polyimide film pattern employed.

The photosensitive resin composition layer of a predetermined pattern after the development is heated at a predetermined temperature. The heating permits removing the substituent group introduced into the side chain of the polyamic acid derivative having a repeating unit (1), the azide compound serving to crosslink the polymer chains of the resin component, the o-quinone diazide compound contained in the resin component, and the like. The heating also permits evaporating the solvent component remaining in the coated film. As a result, the polyamic acid is cyclized, thereby forming a film pattern of polyimide having a repeating unit represented by general formula (24) given below:

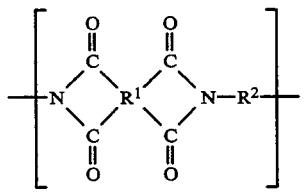

(24)

In the heating process, it is desirable to gradually elevate the temperature from room temperature to the final heating temperature of 150° to 450° C. If the final heating temperature is lower than 150° C., the polyamic acid derivative partially fails to be imidized in the polyimide forming step. If the polyamic acid derivative partially remains unreacted, the thermal stability of the formed polyimide film tends to be impaired. On the other hand, if the final heating temperature exceeds 450° C., the imidized polymer tends to be decomposed, with the result that the thermal stability is impaired.

A resin encapsulated semiconductor device is manufactured by applying, for example, an ordinary encapsulating process using an encapsulating resin such as an epoxy resin to the semiconductor substrate having a polyimide film pattern formed on the surface by using the photosensitive resin composition according to any of the first to third embodiments of the present invention.

Since the patterned polyimide film exhibits excellent electrical insulating properties, a high resistance to radiation and an excellent heat resistance, the patterned polyimide film acts as a satisfactory passivation film or an interlayer insulating film in a semiconductor device.

As described above, the photosensitive resin composition according to any of the first to third embodiments of the present invention performs two different functions, i.e., the function of a positive or negative photosensitive material in the light-exposure and developing steps and the function of a polyimide film used as a passivation film or interlayer insulating film used in a semiconductor device. It follows that the use of the photosensitive resin composition of the present invention makes it possible to perform continuously the photoresist process for patterning a polyimide film and the polyimide film forming process, which were conventionaly performed as two different processes, for the pattern formation of a passivation film or an interlayer insulating film. Since it is possible to form a polyimide film pattern without separately using a photoresist, the composition of the present invention permits simplifying the process of forming a polyimide film pattern.

The photosensitive resin composition of the present invention can also be used as a photoresist for the ordinary fine processing for PEP. In this case, the photosensitive resin composition layer is patterned on a substrate by the process described previously, followed by selectively etching the substrate by means of the ordinary dry etching or wet etching process, with the patterned resin composition layer used as an etching resistant mask.

It is also possible to form a pattern by using a known a precursor of a polyimide other than the photosensitive resin composition of the present invention by utilizing the baking treatment after the exposure step, i.e. the post-exposure baking, which is employed as desired in the process of forming a passivation film or an interlayer insulating film using the photosensitive resin composition according to any of the first to third embodiments of the present invention described above. In this case, a photosensitive resin composition according to a fourth embodiment of the present invention is prepared by mixing a resin component of a polyamic acid having a repeating unit (2) given above and a photosensitive agent of a naphthoquinone diazide compound. To be more specific, a resin layer containing as a main component a resin composition of the fourth embodiment is formed on a substrate, followed by selectively exposing the resin layer to light and subsequently applying a baking treatment to the resin layer at 130° to 200° C. Further, a development is applied to the resin layer after the baking treatment, followed by heating the developed resin layer after the development So as to imidize the polyamic acid having a repeating unit (2) and, thus, to form a polyimide film pattern.

In the photosensitive resin composition of the fourth embodiment, the compounds similar to the polyamic acid contained in the resin component of the composition according to the second embodiment of the present invention can be used as the polyamic acid having a repeating unit (2).

On the other hand, the naphthoquinone diazide compounds used as the photosensitive agent in the composition of the fourth embodiment are not particularly restricted. It is possible to use in the fourth embodiments the compounds similar to those used in the composition of any of the first to third embodiments of the present invention. For example, it is possible to use as the photosensitive agent 1,2-naphthoquinone diazide-4-sulfonic acid, 1,2-naphthoquinone diazide-5-sulfonic acid, 2,1-naphthoquinone diazide-4-sulfonic acid, 2,1-naphthoquinone diazide-5-sulfonic acid, and derivatives thereof such as a salt, ester and amide thereof. It is particularly desirable to use 1,2-naphthoquinone diazide-5-sulfonic acid ester. Also, it is desirable to use the compounds QD-16 to QD-51 shown in Table B referred to previously in conjunction with the photosensitive resin compositions according to the first to third embodiments of the present invention.

In the photosensitive resin composition according to the fourth embodiment of the present invention, it is desirable to use the naphthoquinone diazide compound in an amount of 5 to 70 parts by weight, preferably 25 to 45 parts by weight, based on 100 parts by weight of the polyamic acid having a repeating unit represented by general formula (2). If the naphthoquinone diazide compound is used in an excessively large amount, the thickness of the resin layer is unduly diminished by the heating in the imidizing step, with the result that the resolution of the formed polyimide film pattern tends to be impaired. On the other hand, if the amount of the naphthoquinone diazide compound is unduly small, the photosensitivity of the resin layer in the light-exposing step is lowered, with the result that the resolution of the formed polyimide film pattern tends to be lowered. It should also be noted that, in the photosensitive resin composition of the fourth embodiment, it is possible to add the naphthoquinone diazide compound in the form of a solution prepared by dissolving the compound in an organic solvent such as methylethyl ketone, cyclohexane, acetate cellosolve, N,N-dimethylformamide, N-methyl-2-pyrrolidone or hexamethylphosphoric triamide.

In the method of forming a polyimide film pattern described above, it is possible to form either a positive or negative pattern by properly selecting the kind of the naphthoquinone diazide compound contained as a photosensitive agent in the photosensitive resin composition of the fourth embodiment, the conditions of the post-exposure baking, etc. The reasons for the particular function have not yet been clarified sufficiently. For example, in the case of using 1,2-naphthoquinone diazide-4-sulfonic acid ester as a photosensitive agent, chemical reactions are considered to take place as described below.

Specifically, the photosensitive agent noted above is considered to undergo the reactions shown below in the exposed portion and non-exposed portion of the resin layer in the exposure and developing steps. In the exposed portion of the photosensitive resin composition of the fourth embodiment, 1,2-naphthoquinone diazide-4-sulfonic acid ester (25) is converted into indene carboxylic acid in the exposure step and, at the same time, is decomposed into 1-sulfo-3-carboxylidene (26) and the skeletal portion, i.e. the main chain portion of the polyamic acid, as shown in reaction formula ( a ) given below:

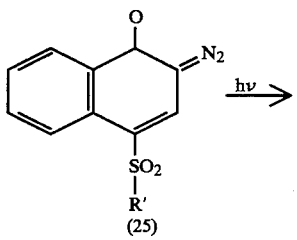

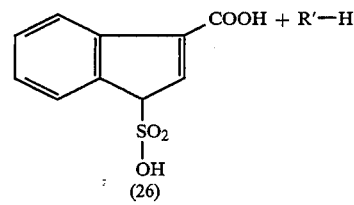

where R' represents a monovalent organic group.

Further, reactions (b) to (d) given below are brought about in the exposed portion in the step of the post-exposure baking, i.e., the baking treatment after the exposure:

(b) 1-sulfo-3-carboxylidene formed in the exposure step serves to partially imidize the polyamic acid having a repeating unit (2).

(c) The indene carboxylic acid is decarboxylated to convert into an indene derivative.

(d) Where the 1,2-naphthoquinone diazide-4-sulfonic acid ester used is polyfunctional, the unreacted 1,2-naphthoquinone diazide-4-sulfonic acid ester is crosslinked in the light-exposure step.

On the other hand, reactions (e) and (f) given below take place in the step of the post-exposure baking in the non-exposed portion of the photosensitive resin composition of the fourth embodiment:

(e) 1,2-naphthoquinone diazide-4-sulfonic acid ester is thermally decomposed to convert into an indene carboxylic acid.

(f) Where the 1,2-naphthoquinone diazide-4sulfonic acid ester used is polyfunctional, the unreacted 1,2-naphthoquinone diazide-4-sulfonic acid ester is crosslinked in the light-exposure step.

When it comes to the exposed portion of the photosensitive resin composition of the fourth embodiment, the solubility in the alkaline developing solution is promoted by reaction (a) given above. By the contrary, the solubility in the alkakine developing solution is lowered by reactions (b) to (d). On the other hand, the solubility of the non-exposed portion in the alkaline developing solution is promoted by reaction (e). By the contrary, the solubility in the alkaline developing solution is lowered by reaction (f).

In the method of forming a polyimide film pattern described above, it is considered reasonable to understand that a positive pattern is formed finally where the contribution of reaction (a) is greater than that of reactions (b) to (d), and a negative pattern is formed finally where the contribution of reactions (b) to (d) is greater than that of reaction (a). Which of reaction (a) or reactions (b) to (d) is more predominant in the exposed portion of the photosensitive resin composition of the fourth embodiment depends on the kind of the naphthoquinone diazide compound used as the photosensitive agent, conditions of the light-exposure step, the baking conditions after the exposure step, etc. It follows that it is possible to form either a positive or negative pattern by suitably selecting the various conditions in the method of forming a polyimide film pattern described above.

In the case of using the photosensitive resin composition according to the fourth embodiment of the present invention, it is possible to form a polyimide film pattern by substantially the same method as in the case of using the composition according to any of first to third embodiments of the present invention. Specifically, a polyamic acid having a repeating unit (2) and a naphthoquinone diazide compound are dissolved in a suitable organic solvent, followed by removing fine impurity materials from the resultant solution by means of, for example, filtering so as to prepare a varnish of the photosensitive resin composition. Then, a substrate such as a semiconductor substrate is coated with the varnish by means of, for example, s rotary coating method or dipping method, followed by heating and drying (baking) the coating so as to form a resin layer.

In the next step, the surface of the resin layer is selectively exposed through a desired mask pattern to an energy beam such as an X-ray, visible light, infrared radiation, ultraviolet radiation or an electron beam (exposure step). It is possible to employ any of the contact type or projection type exposure system. The resin layer after the exposure step is subjected to a baking treatment at 130° to 200° C. using, for example, a hot plate, followed by cooling the resin layer. If the temperature for the baking treatment is unduly low, the resultant pattern fails to exhibit a sufficiently high resolution. On the other hand, if the temperature for the baking treatment is unduly high, the solubility of the resin layer in the alkaline developing solution is lowered, making it difficult to perform the subsequent development. The baking treatment should preferably be carried out at a temperature falling within a range of between 140° and 160° C. The baking treating time, which depends on the baking temperature, should generally be about 0.5 to 60 minutes, preferably about 1 to 4 minutes. If the baking treating time is unduly short, the resultant pattern fails to exhibit a sufficiently high resolution. On the other hand, if the baking treating time is unduly long, the subsequent development applied to the resin layer is made difficult.

After the baking treatment, a development is applied to the resin layer using an alkaline aqueous solution. In this step, the exposed portion or non-exposed portion of the resin layer is selectively dissolved in the developing solution and, thus, removed so as to form a desired positive or negative pattern. It is possible to use as the alkaline aqueous solution the organic or inorganic alkaline solution used for developing a resin layer of the photosensitive resin composition according to any of the first to third embodiments of the present invention.

Further, the resin layer having a predetermined pattern, which has been developed as described above, is heated at a predetermined temperature. As a result, the polyamic acid having a repeating unit (2), which is contained in the resin layer, is cyclized (imidized) so as to form a polyimide film pattern having a repeating unit represented by general formula (27) given below:

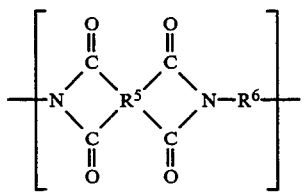
(27)

In the heating process, it is desirable to gradually elevate the temperature from room temperature to the final heating temperature of 90° to 400° C. If the temperature is rapidly elevated in the heating process, the polyamic acid partially fails to be imidized in the polyimide forming process. If the polyamic acid partially remains unreacted, the thermal stability tends to be impaired.

A resin encapsulated semiconductor device can be manufactured by applying an ordinary encapsulating process using an encapsulating resin such as an epoxy resin to the semiconductor substrate having a polyimide film pattern formed on the surface by the particular method using a photosensitive resin composition according to the fourth embodiment of the present invention. Since the patterned polyimide film exhibits excellent electrical insulating properties, a high resistance to radiation, and an excellent heat resistance, the patterned film can suitably used as a passivation film or an interlayer insulating film in the semiconductor device.

Like the photosensitive resin composition according to any of the first to third embodiments of the present invention, the composition of the fourth embodiment can also be allowed to perform two different functions by employing a suitable method, i.e., the function of a positive or negative photosensitive material in the light-exposure and developing steps and the function of a polyimide film acting as a passivation film or as an interlayer insulating film. It follows that the method of forming a polyimide film pattern using the photosensitive resin composition of the fourth embodiment makes it possible to perform continuously the photoresist process for the patterning a polyimide film and the polyimide film forming process, which were convertionaly performed as two different processes. Since it is possible to form a polyimide film pattern without separately using a photoresist, the composition of the present invention permits simplifying the process of forming a polyimide film pattern.

Further, the polyimide film pattern formed by the particular method using photosensitive resin composition according to the fourth embodiment of the present invention can be used in the ordinary dry etching or wet etching process as an etching resistant mask for the ordinary fine etching treatment for PEP.

Let us describe Examples of the present invention in order to more clearly set forth the technical idea of the present invention. Needless to say, the technical scope of the present invention is not restricted by the following Examples.

Examples 1-29 given below are directed to the photosensitive resin compositions according to the first to third embodiments of the present invention. The chemical structures of the compounds referred to by abbreviations in these Examples and Tables 1-11 included in these Examples are shown in Table G.

EXAMPLE 1

A four-necked flask having an inner volume of 100 ml purged with a nitrogen gas was charged with 2.18 g (0.01 mol) of pyromellitic dianhydride (PMDA), 2.48 g (0.02 mol) of 3-hydroxybenzyl alcohol, and 10 ml of N-methyl-2-pyrrolidone (NMP). The mixture was stirred at room temperature for 24 hours so as to obtain dihydroxybenzyl pyromellitate.

Then, the temperature within the flask was lowered to 0° C., followed by adding a solution prepared by dissolving 2.00 g (0.01 mol) of 4,4'-diaminodiphenylether (ODA) in 10 ml of NMP while stirring the system. Further, a solution prepared by dissolving 4.53 g (0.022 mol) of dicyclohexyl carbodiimide (DCC) in NMP was dripped into the flask over 25 minutes.

The reaction solution thus obtained was maintained at 5° C. for carrying out reactions for 4 hours, followed by removing the formed precipitate by filtration under a reduced pressure. The resultant filtrate was put in 600 ml of water so as to obtain a precipitate of a polyamic acid ester.

2.0 g of the polyamic acid ester was dissolved in 8 g of NMP, and 0.46 g of 1,2-naphthoquinone diazidesulfonic acid ester of 2,3,4,4'-tetrahydroxybenzophenone (ester substitution number of 3) acting as a photosensitive agent was added to the resultant solution. Then, the resultant solution was passed through a filter having a pore size of 0.5 micron so as to obtain a photosensitive resin composition according to the first embodiment of the present invention.

EXAMPLES 2–4

Photosensitive resin compositions according to the first embodiment of the present invention were prepared by the method similar to that of Example 1 using the raw material compositions shown in Table 1 described below.

EXAMPLE 5

2.0 g of the polyamic acid ester prepared as in Example 1 was dissolved in 8 g of NMP, followed by adding 0.40 g of 2,6-di-(4'-azidebenzal)-4-methyl cyclohexanone as a photosensitive agent to the resultant solution so as to prepare a photosensitive resin composition according to the first embodiment of the present invention (see Table 1).

Each of the photosensitive resin compositions of the first embodiment prepared in Examples 1–5 was subjected to evaluation tests with respect to various properties as follows:

Test 1: (Evaluation of Resolution Performance)

A silicon wafer was coated with the photosensitive resin composition by means of rotary coating method using a spinner. The coating was then heated and dried at 90° C. for 5 minutes, followed by exposing the dried film to light for 60 seconds through a patterning mask. An exposure apparatus (PLA-500F manufactured by Canon Inc.) was used in the exposure step. After the exposure, the silicon wafer was dipped for 90 seconds in an alkaline developing solution, i.e., 2.38 wt % aqueous solution of tetramethyl ammonium hydroxide (TMAH), for the developing purpose, followed by rinsing with water so as to form a desired pattern.

A cross section of each of the patterns formed by using the photosensitive resin compositions prepared in Examples 1–5 was observed by an electron microscope (SEM). Table 2 shows the conditions of the test and the results.

Test 1': (Evaluation of Resolution Performance)

A silicon wafer having a diameter of 3 inches was coated with the photosensitive resin composition prepared in Example 1. The coating was heated and dried for 10 minutes on a hot place of 90° C. so as to obtain a dried film having a thickness of 5 microns. Then, the film was exposed to an ultraviolet radiation through a patterning mask using an exposure apparatus PLA-500F noted previously. After the exposure, the silicon wafer was subjected to a baking treatment for 10 minutes on a hot plate of 150° C., followed by dipping the silicon wafer for 90 seconds in an alkaline developing solution (2.38 wt % aqueous solution of TMAH) for the developing purpose. Finally, the wafer was rinsed with water so as to form a desired pattern.

A cross section of the pattern thus formed was observed with an electron microscope (SEM). Table 2 shows the conditions and results of test 1'.

The results shown in Table 2 suggest that the polyimide film pattern formed by using the photosensitive resin composition according to the first embodiment of the present invention exhibits a resolution suitable for using the polyimide film pattern as a passivation film or an interlayer insulating film in a semiconductor device. Further, tests 1 and 1' suggest that the baking treatment after the exposure step, i.e. the post-exposure baking, is effective for improving the resolution of the formed pattern.

TABLE 1

| Photosensitive resin composition | Polyamic acid derivative (numeral denoting molar ratio) | | | | Resin component (weight (g) of polyamic acid derivative used) | Photosensitive agent (weight (g) of comound used) |
|---|---|---|---|---|---|---|
| | a* Tetracarboxilic dianhydride | b* | Diamine | | | |
| Example 1 | PMDA 1.0 | 3-hydroxybenzyl alcohol 2.0 | ODA 1.0 | — | 2.0 g | QD-4 0.46 g |
| Example 2 | PMDA 1.0 | 3-hydroxybenzyl alcohol 2.0 | ODA 0.7 | 6FDA 0.3 | 2.0 g | QD-4 0.46 g |
| Example 3 | PMDA 1.0 | 4-hydroxybenzyl aocohol 2.0 | ODA 0.7 | 6FDA 0.3 | 2.0 g | QD-4 0.46 g |
| Example 4 | BTDA 1.0 | 3-hydroxybenzyl alcohol 2.0 | ODA 0.7 | 6FDA 0.3 | 2.0 g | QD-4 0.46 g |
| Example 5 | PMDA 1.0 | 3-hydroxybenzyl alcohol 2.0 | ODA 1.0 | — | 2.0 g | QD-4 0.40 g | b*: Compound reacted with a*
Description in the specification should be referred to with respect to abbreviations of compounds in the table.

TABLE 2

| Photosensitive resin composition | Exposure apparatus | Exposure (mJ/cm$^2$) | d* Conc. of developing solution | Developing time (sec) | e* Resolution ($\mu$m) | Initial film thickness ($\mu$m) |
|---|---|---|---|---|---|---|
| Example 1 | PLA-500F | 200 | 2.38% | 60 | 10.0 P | 5.0 |
| Example 2 | " | 250 | " | " | 5.0 P | 4.8 |
| Example 3 | " | 230 | " | " | 5.0 P | 5.0 |
| Example 4 | " | 150 | " | " | 2.0 P | 2.0 |
| Example 5 | " | 200 | " | " | 10.0 N | 5.0 |
| Example 1 | a* PLA-500F | 200 | " | 90 | 8.0 N | 5.0 | a*: Baking treatment between exposure and developing steps (corresponding to test 1')
d*: Developing solution, TMAH aqueous solution (wt %)
e*: P ... Positive pattern, N ... Negative pattern

EXAMPLE 6

A four-necked flask having an inner volume of 500 ml purged with a nitrogen gas was charged with 10.91 g (0.05 mol) of PMDA and 60 ml of NMP, which was cooled to 0° C. Then, a solution prepared by dissolving 10.01 g (0.05 mol) of ODA in 40 ml of NMP was slowly put into the flask. The resultant reaction solution was stirred for 5 hours while maintaining the reaction solution at 0° to 5° C. so as to obtain a polyamic acid solution. Further, added to the polyamic acid solution were a solution prepared by dissolving 10.91 g (0.1 mol) of 4-aminophenol in 100 ml of NMP and another solution prepared by dissolving 20.63 g (0.1 mol) of DCC in 40 ml of NMP. The resultant reaction solution was kept stirred for 4 hours at room temperature. Then, 10 ml ethanol was added to the reaction solution. The resultant solution was kept stirred for 2 hours, followed by removing the insoluble components by means of filtration. The filtrate was dripped into 3 liters of methanol so as to precipitate polymer. The precipitated polymer was separated by means of filtration and, then, dried so as to obtain a polyamic acid derivative.

2 g of the polyamic acid derivative and 0.5 g of 1,2-naphthoquinone diazide-4-sulfonic acid ester of 2,3,4,4'-tetrahydroxy benzophenone (ester substitution number of 3) were dissolved in 10 g of NMP, followed by filtration with a filter having a pore size of 0.5 micron so as to obtain a photosensitive resin composition according to the first embodiment of the present invention.

EXAMPLE 7

2 g of the polyamic acid derivative prepared as in Example 6 and 0.2 of 2,6-di-(4'azidebenzal)-4-methyl cyclohexane acting as a photosensitive agent were dissolved in 10 g of NMP, followed by filtration with a filter having a pore size of 0.5 micron so as to obtain a photosensitive resin composition according to the first embodiment of the present invention.

Test 2 (Evaluation of Resolution Performance)

A silicon wafer having a diameter of 3 inches was coated with the photosensitive resin composition prepared in each of Examples 6 and 7 by the rotary coating method using a spinner. Then, the coating was heated and dried for 5 minutes on a hot plate of 100° C. The dried film was exposed to light through a patterning mask using a PLA-500F noted previously as an exposure apparatus. After the exposure, the silicon wafer was dipped for 120 seconds in an alkaline developing solution (2.38 wt % aqueous solution of TMAH) for the developing purpose, followed by rinsing with water so as to form a desired pattern.

A cross section of each of the patterns thus formed using the photosensitive resin compositions prepared in Examples 6 and 7 was observed with an electron microscope. A pattern having resolution of 20 microns with an exposure of 350 mJ/cm$^2$ was recognized with respect to the photosensitive resin composition prepared in Example 6. Likewise, a pattern having are solution of 50 microns with an exposure of 400 mJ/cm$^2$ was recognized with respect to the photosensitive resin composition prepared in Example 7.

Test 3: (Evaluation of Adhesion with Phosphosilicate Glass Film)

A silicon wafer covered with a phosphosilicate glass film (PSG film) was coated with the photosensitive resin composition prepared in each of Examples 6 and 7 by the spin coating method. Then, a silicon chip having a PSG film, 2 mm square, formed on the surface was put on the coated film such that the PSG film of the silicon chip is in direct contact with the coated film so as to form a laminate structure of PSG film/photosensitive resin composition layer/PSG film. The laminate structure was dried at 90° C. for 30 minutes, followed by applying a baking treatment at 150° C. for 30 minutes, at 250° C. for 1 hour and, then, at 350° C. for 30 minutes, so as to form a polymer film having the thickness controlled at about 5 microns between the silicon wafer and the silicon chip. The resultant sample was left to stand for 100 hours within a pressure cooker under steam of 120° C. and 2.2 atms. The shear breaking strength of the silicon chip, 2 mm square, put on the silicon wafer was measured with respect to each of the sample subjected to the pressure cooker treatment (PCT) and a control sample not subjected to the PCT.

The shear breaking strength was found to be 2.2 kg/mm$^2$ at 0 hour of PCT (not subjecting to the PCT) and 1.8 kg/mm$^2$ at about 100 hours of PCT in the sample formed by using the photosensitive resin composition of Example 6. On the other hand, the shear breaking strength was found to be 2.1 kg/mm$^2$ at 0 hour of PCT and 1.6 kg/mm$^2$ at about 100 hours of PCT in the sample formed by using the photosensitive resin composition of Example 7.

EXAMPLE 8

A four-necked flask having an inner volume of 500 ml purged with a nitrogen gas was charged with 21.8 g (0.1 mol) of PMDA, 24.8 g (0.2 mol) of 3-hydroxybenzyl alcohol, and 100 ml of NMP. The mixture was stirred at room temperature for 24 hours so as to obtain dihydrobenzyl pyromellitate.

Then, the flask was cooled to 0° C., followed by pouring a solution prepared by dissolving 20.0 g (0.1 mol) of ODA in 100 ml of NMP into the flask while stirring the solution within the flask. Further, a solution prepared by dissolving 45.3 g (0.22 mol) DCC in NMP was dripped into the flask over 25 minutes. The resultant reaction solution was maintained at 5° C. so as to carry out the reaction for 4 hours, followed by removing the formed precipitate by means of filtration under a reduced pressure. Then, the filtrate was put in 5 liters of methanol so as to form precipitate. The resultant precipitate was recovered by means of filtration and, then, dried at 80° C. for 14 hours within a vacuum dryer so as to obtain 47 g of a polyamic acid ester.

On the other hand, a four-necked flask having an inner volume of 100 ml purged with a nitrogen gas was charged with 2.18 g (0.01 mol) of PMDA and 10 ml of NMP, followed by dripping a solution prepared by dissolving 2 g of ODA in 10 ml of NMP to the mixed solution while stirring the mixed solution. The resultant reaction solution was maintained at 5° C. so as to carry out reaction for 10 hours and, thus, to obtain a polyamic acid solution.

Added to the polyamic acid solution were 16.72 g of the polyamic acid ester prepared in advance as described above, 105 g of NMP, and 5.26 g of a photosensitive agent, i.e., 1,2-naphthoquinone diazide-5-sulfonic acid ester of 2,3,4,4'-tetrahydroxy benzophenone (average esterification rate of 75%). The mixture was stirred for 3 hours and, then, the resultant solution was filtered with a filter having a pore size of 0.5 micron so as to prepare a photosensitive resin composition according to the second embodiment of the present invention.

EXAMPLES 9-17

Photosensitive resin compositions according to the second embodiment of the present invention were prepared as in Example 8 by using polyamic acid derivatives, polyamic acids and photosensitive agents, which were prepared by mixing the raw materials in the mixing ratio shown in Table 3 described below.

Various properties of the photosensitive resin compositions of the second embodiment were evaluated as follows:

Test 4: (Evaluation of Resolution Performance)

The resolution of some of the photosensitive resin compositions prepared in Examples 8-17 were evaluated as in test 1 conducted in Examples 1-5. Table 4 shows the evaluating conditions and the results of the evaluation.

Test 5: (Evaluation of Adhesion with PSG Film)

A silicon wafer covered with a PSG film was coated with the photosensitive resin composition prepared in each of Examples 10, 14 and 15 by means of the spin coating method. Then, a silicon chip having a PSG film, 2 mm square, formed on the surface was put on the coated film such that the PSG film of the silicon chip is in direct contact with the coated film so as to form a laminate structure of PSG film/photosensitive resin composition layer/PSG film. The laminate structure was dried at 90° C. for 30 minutes, followed by applying a baking treatment at 150° C. for 30 minutes, at 250° C. for 1 hour and, then, at 350° C. for 30 minutes, so as to form a polymer film having the thickness controlled at about 5 microns between the silicon wafer and the silicon chip. The resultant sample was left to stand for 100 hours within a pressure cooker under steam of 120° C. and 2.2 atms. The shear breaking strength of the silicon chip, 2 mm square, put on the silicon wafer was measured with respect to each of the sample subjected to the pressure cooker treatment (PCT) and a control sample not subjected to the PCT. Table 5 shows the results.

Test 6: (Evaluation of Adhesion with Epoxy Resin for Encapsulating Semiconductor)

A silicon wafer covered with a PSG film was coated with the photosensitive resin composition prepared in each of Examples 10, 14 and 15 by means of the spin coating method. Then, the sample was dried at 90° C. for 30 minutes, followed by applying a heat treatment at 150° C. for 30 minutes, at 250° C. for 1 hour and, then, at 350° C. for 30 minutes, so as to form a polymer film having the thickness controlled at about 5 microns. Further, a silicon wafer having a polymer film formed on the surface was diced into small pieces each sized at 10 mm×30 mm, followed by forming an encapsulating resin film, 3 mm square, on each of the diced samples by using a low pressure transfer molding machine. An epoxy resin for encapsulating a semiconductor device (KE-300Ts manufactured by Toshiba Chemical K.K.) was used as the encapsulating resin, and the transfer molding was performed for 3 minutes at a temperature of 175° C. and a pressure of 80 kg/cm². The resultant sample was left to stand for 100 hours within a pressure cooker under steam of 120° C. and 2.2 arms. A shear breaking strength of the encapsulating resin was measured for each of the sample subjected to the pressure cooker treatment (PCT) and a control sample not subjected to the PCT. Table 5 shows the results.

The results shown in Tables 4 and 5 suggest that the polyimide film pattern formed by using the photosensitive resin composition according to the second embodiment of the present invention exhibits a resolution and adhesion suitable for using the patterned film as a passivation film or an interlayer insulating film in a semiconductor device.

TABLE 3

| Example | a* Tetracarboxilic dianlydride | b* | Polyamic acid derivative (numeral denoting molar ratio) | Diamine | | |
|---|---|---|---|---|---|---|
| 8 | PMDA 1.0 | — | 3-hydropybenzyl alcohol 2.0 | ODA 1.0 | — | — |
| 9 | BTDA 1.0 | — | 4-hydroxybenzyl alcohol 2.0 | ODA 1.0 | — | — |
| 10 | BTDA 0.75 | PMDA 0.25 | 4-hydroxybenzyl alcohol 2.0 | ODA 0.95 | TSL9306 0.05 | — |
| 11 | PMDA 1.0 | — | 3-hydroxybenzyl alcohol | ODA 1.0 | — | — |

TABLE 3-continued

| Example | | | | | | |
|---|---|---|---|---|---|---|
| 12 | PMDA 1.0 | — | 4-hydroxybenzyl alcohol 2.0 | ODA 1.0 | — | — |
| 13 | DSDA 1.0 | — | 4-aminophenol 2.0 | BAPB 0.5 | ODA 0.5 | — |
| 14 | PMDA 0.5 | BTDA 0.5 | 4-hydroxybenzyl alcohol 2.0 | ODA 0.25 | 6FDA 0.70 | TSL9306 0.05 |
| 15 | BTDA 0.75 | PMDA 0.25 | 4-hydroxybenzyl alcohol 2.0 | HFBAPP 0.50 | ODA 0.45 | TSL9306 0.05 |
| 16 | BTDA 0.50 | PMDA 0.50 | 4-aminophenol 2.0 | BAPP 0.50 | ODA 0.50 | — |
| 17 | PMDA 1.0 | — | 3-aminophenol 2.0 | BAPP 0.50 | ODA 0.50 | — |

| Example | c* Resin component (weight (g) of compound used) | Photosensitive agent (weight (g) of compound used) | Polyamic acid (numeral denoting molar ratio) | | | |
|---|---|---|---|---|---|---|
| | | | Tetracarboxilic dianydride | | Diamine | |
| 8 | 16.72 g/ 4.18 g | QD-4 5.22 g | PMDA 1.0 | — | ODA 1.0 | — |
| 9 | 8 g/2 g | QD-4 2.5 g | BTDA 1.0 | — | ODA 1.0 | — |
| 10 | 8 g/2 g | QD-4 2.5 g | BTDA 0.75 | PMDA 0.25 | ODA 0.95 | TSL9306 0.05 |
| 11 | 5 g/5 g | QD-1 3.0 g | BTDA 0.75 | PMDA 0.25 | ODA 0.95 | TSL9306 0.05 |
| 12 | 5 g/5 g | QD-2 2.5 g | PMDA 1.0 | — | ODA 1.0 | — |
| 13 | 6 g/4 g | QD-4 2.5 g | PMDA 1.0 | — | ODA 1.0 | — |
| 14 | 6 g/4 g | QD-9 3.0 g | BTDA 0.75 | PMDA 0.25 | ODA 0.95 | TSL9306 0.05 |
| 15 | 7 g/3 g | DA-1 2.5 g | BTDA 0.75 | PMDA 0.25 | HFBAPP 0.50 | ODA 0.50 |
| 16 | 8 g/2 g | A-21 2.5 g | BTDA 0.50 | PMDA 0.50 | BAPP 0.50 | ODA 0.50 |
| 17 | 8 g/2 g | A-21 2.5 g | PMDA 1.0 | — | BAPP 0.50 | ODA 0.50 | b*: Compound reacted with a*
Description in the specification should be referred to with respect to abbreviations of compounds in the table.
c*: Weight (g) of the polyamic acid derivative/weight (g) of the polyamic acid (solid)

TABLE 4

| | Tests 4 (Resolution Performance) | | | | | |
|---|---|---|---|---|---|---|
| Photosensitive resin Composition | Exposure apparatus | Exposure (mJ/cm²) | d* Conc. of developing solution | Developing time (sec) | e* Resolution (μm) | Initial film thickness (μm) |
| Example 8 | PLA-500F | 250 | 2.38% | 90 | 5.0 P | 5.0 |
| Example 9 | " | 300 | " | 120 | 5.0 P | 4.0 |
| Example 10 | " | 280 | " | 90 | 5.0 P | 3.8 |
| " | g-line stepper (NA 0.45) | 320 | " | 90 | 6.0 P | 5.0 |
| Example 13 | PLA-500F | 250 | 1.19% | 60 | 10.0 P | 4.5 |
| Example 15 | KrF Excimer Laser Stepper (NA 0.37) | 120 | 2.38% | 60 | 1.0 N | 1.0 |
| Example 17 | KrF Excimer Laser Stepper (NA 0.37) | 100 | 2.38% | 60 | 1.0 N | 1.0 | d*: Developing solution, TMAH aqueous solution (wt %)
e*: P . . . Positive pattern, N . . . Negative pattern

TABLE 5

| Photosensitive resin composition | Test 5 f* (Adhesion with PSG film) | | Test 6 f* (Adhesion with Encapsulating resin) | |
|---|---|---|---|---|
| | PCT 0 hour | PCT 100 hours | PCT 0 hour | PCT 100 hours |
| Example 10 | 2.2 | 1.5 | 4.3 | 3.5 |
| Example 14 | 2.0 | 1.2 | 3.5 | 2.8 |
| Example 15 | 2.3 | 1.4 | 3.7 | 2.5 | f*: unit (kg/mm²)

EXAMPLE 18

16.11 g of BTDA and 12.41 g of m-hydroxybenzyl alcohol were dissolved in dimethylacetoamide (DMAC), and reaction was carried out for 3 hours at 100° C. under a nitrogen gas atmosphere so as to obtain benzyl alcohol ester. Then, a solution prepared by dissolving 9.51 g of ODA and 0.62 g of bis (γ-aminopropyl) tetramethyldisiloxane in 30 ml of DMAC was added to the reaction mixture. Further, a solution prepared by dissolving 0.83 g of dicyclohexylcarbodiimide in 30 ml of DMAC was added to the reaction mixture while cooling the solution with ice. After completion of the dropping, the reaction mixture was stirred for 1 hour while cooling the reaction mixture with ice, followed by further stirring the reaction mixture at room temperature for 10 hours. After the stirring, 5 ml of ethanol was added to the reaction mixture, followed by stirring the resultant solution for 2 hours and subsequently removing the insoluble components from filtration. The resultant filtrate was poured into 2 liters of methanol so as to permit the formed polymer to re-precipitate. The precipitated polymer was separated by means of filtration and, then, dried so as to obtain 20.4 g of a polyamic acid ester (PE-1), the yield being 55%.

On the other hand, a four-necked flask having an inner volume of 500 ml purged with a nitrogen gas was charged with 3,3',4,4'-benzophenone tetracarboxylic dianhydride and 100 ml of NMP, which was cooled with ice. Then, a solution prepared by dissolving 19.02 g of ODA and 1.24 g of bis (γ-aminopropyl) tetramethyldisiloxane in 120 ml of NMP was slowly added to the mixed solution while stirring the reaction solution such that the temperature of the reaction solution should not exceed 10° C. The reaction solution was kept stirred continuously for 10 hours while maintaining the temperature to fall within a range of between 0° C. and 5° C. so as to obtain a polyamic acid solution (PA-1).

Further, a solution was prepared by mixing 0.4 g of polyamic acid ester (PE-1), 8.56 g of polyamic acid solution (PA-1), 0.67 g of o-naphthoquinone diazide (QD-5) and 4 g of NMP and, then, filtered with a filter having a pore size of 0.5 micron so as to obtain a photosensitive resin composition according to the second embodiment of the present invention.

EXAMPLE 19

21.8 g of PMDA was suspended in 200 g of ethanol, and the suspension was stirred under a nitrogen gas atmosphere for 12 hours under heating at 70° C. The resultant reaction solution was poured into 500 ml of water, and the precipitated crystals were separated out by means of filtration. Then, the separated crystals were recrystallized within a mixed solvent of ethanol/water so as to obtain 12 g of pyromellitic acid ester.

In the next step, a solution prepared by dissolving 9.30 g (0.03 mol) of the pyromellitic acid ester, 7.09 g of 4,4'-diaminodiphenylether and 0.37 g of bis (γ-aminopropyl) tetramethyldisiloxane in 100 ml of NMP. The resultant solution was cooled with ice, followed by adding to the resultant solution another solution prepared by dissolving 6.30 g of dicyclohexylcarbodiimide in 20 g of NMP. After completion of the addition, the solution was stirred at room temperature for 12 hours, followed by adding 5 ml of ethanol to the solution. The resultant solution was further stirred for 2 hours, followed by removing the insoluble components by means of filtration. The resultant filtrate was poured into 2 liters of water so as to permit precipitation of a polymer. The polymer thus precipitated was recovered by means of filtration and, then, dried so as to obtain 11 g of a polyamic acid ester (PE-2) with a yield of 55%.

2 g of the polyamic acid ester (PE-2) thus prepared was mixed with 2 g of the polyamic acid ester (PE-1) prepared in Example 18, 5.35 g of polyamic acid solution (PA-1), the polymer content of which was 1 g, 1.25 g of o-naphthoquinone diazide (QD-5), and 6 g of NMP, and the resultant solution was filtered with a filter having a pore size of 0.5 micron so as to prepare a photosensitive resin composition according to the second embodiment of the present invention.

Various properties of the photosensitive resin composition of the second embodiment thus prepared were evaluated as follows:

Test 7: (Evaluation of Sensitivity)

A silicon wafer having a diameter of 3 inches was coated with the photosensitive resin composition prepared in Example 18 by the spin coating method. Then, the wafer was heated on a hot plate of 110° C. for 3 minutes so as to form a resin composition film having a thickness of 2.1 microns. The resin composition film was exposed to light emitted from a mercury lamp through a quartz mask for measuring the sensitivity, i.e., a quartz mask having 15 sections differing from each other in the transmittance over a range of between 1% and 75%. After the exposure, the wafer was subjected to a baking treatment for 1 minute on a hot plate of 110° C., followed by dipping the wafer in an alkaline developing solution (2.38 wt % aqueous solution of TMAH) for 3 minutes for the developing purpose so as to obtain a positive pattern.

FIG. 1 is a graph showing the sensitivity of the photosensitive resin composition obtained in the test. The amount of light exposure is plotted on the abscissa A of FIG. 1, with the ordinate B denoting the film-remaining rate in the exposed portion, i.e., the ratio in the thickness of the film after the development to the thickness of the film before the development in the exposed portion.

Test 8: (Evaluation of Resolution Performance)

A silicon wafer having a diameter of 3 inches was coated with each of the photosensitive resin compositions prepared in Examples 18 and 19 by means of the rotary coating method using a spinner, followed by heating and drying the wafer on a hot plate so as to dry the coated film. Then, the coated film was exposed to light for 60 seconds through a patterning mask using an exposure apparatus of PLA-500F noted previously. After the exposure, the film formed of the photosensitive resin composition prepared in Example 19 was subjected to a baking treatment by putting the wafer on a hot plate. Then, the silicon wafer was dipped in an alkaline developing solution (aqueous solution of TMAH) for the developing purpose, followed by rinsing the wafer with water.

A cross section of each of the patterns thus formed was observed with an electron microscope. Table 6 shows the conditions and results of the test.

The results shown in Table 6 indicate that the polyimide film pattern formed by using the photosensitive resin composition according to the second embodiment of the present invention exhibits a resolution suitable for using the pattern as a passivation film or an interlayer insulating film in a semiconductor device.

Test 9: (Evaluation of Resolution Performance)

A silicon wafer was coated with the polyamic acid solution (PA-1), followed by heating the wafer on a hot plate of 150° C. for 20 seconds so as to form a film having a thickness of 1.0 micron. The film thus formed was further coated with the photosensitive resin composition obtained in Example 18, followed by heating the wafer on a hot plate of 110° C. for 3 minutes for the drying purpose so as to form a resin composition film having a thickness of 5 microns. Then, the resin composition film was exposed to light through a patterning mask, followed by baking the film for 1 minute on a hot plate of 110° C. Further, the silicon wafer was dipped in an alkaline developing solution (2.38 wt % aqueous solution of TMAH) for 2 minutes for the developing purpose, followed by rinsing the wafer with water.

A cross section of the pattern thus formed was observed with an electron microscope. Recognized was resolution of a positive pattern having lines and spaces of 5 microns (see item J* in Table 6).

In this test, a polyamic acid thin film was formed first on a substrate by using a photosensitive resin composition according to the second embodiment of the present invention, followed by forming a pattern by using a photosensitive resin composition of the present invention. Even in this case, the resultant polyimide film pattern exhibits a resolution suitable for using the pattern as a passivation film or an interlayer insulating film in a semiconductor device, as apparent from the result of the test.

Test 10: (Evaluation of Adhesion with PSG Film)

The adhesion strength of the polyimide film pattern, which was formed by using each of the photosensitive resin compositions prepared in Examples 18 and 19, with a PSG film was evaluated by the method and under conditions similar to those in test 5. With respect to the photosensitive resin composition prepared in Example 18, the evaluation of the adhesion strength with a PSG film also covered the case where the substrate was coated in advance with a polyamic acid. Table 7 shows the results of the evaluation.

Test 11: (Evaluation of Adhesion with Semiconductor Encapsulating Epoxy Resin)

The adhesion strength of a polyimide film pattern with an epoxy resin for encapsulating a semiconductor device was evaluated by the method and under conditions similar to those in test 6 with respect to each of the photosensitive resin compositions prepared in Examples 18 and 19. With respect to the photosensitive resin composition prepared in Example 18, the evaluation also covered the case where the substrate was coated in advance with a polyamic acid. Table 7 also shows the results of the evaluation.

The results shown in Table 7 suggest that the polyimide film pattern formed by using a photosensitive resin composition according to the second embodiment of the present invention exhibits a high adhesion suitable for using the polyimide film pattern as a passivation film or an interlayer insulating film in a semiconductor device. It is also shown that, when it comes to the photosensitive resin composition prepared in Example 18, it is desirable to coat the substrate with a polyamic acid before formation of a photosensitive resin composition layer so as to improve the adhesion of the resultant polyimide film pattern with the substrate or with the epoxy resin for encapsulating a semiconductor device.

TABLE 6

| Photosensitive resin Composition | Tests 8/9 (Resolution Performance) | | | | | |
|---|---|---|---|---|---|---|
| | Exposure apparatus | Exposure (mJ/cm$^2$) | d* Conc. of developing solution | Developing time (sec) | e* Resolution ($\mu$m) | Initial film thickness ($\mu$m) |
| Example 18 | i* PLA-500F | 180 | 2.38% | 100 | 5.0 P | 5.0 |
| | j* PLA-500F | 220 | " | 120 | 5.0 P | 5.0 |
| Example 19 | k* PLA-500F | 200 | " | 180 | 10.0 N | 3.0 |
| | l* PLA-500F | 180 | " | 120 | 10.0 P | 5.0 | d*: Developing solution, TMAH aqueous solution (wt %)
e*: P ... positive pattern, N ... negative pattern
i*: Drying after coating at 110° C. for 3 minutes (corresponding to test 8)
j*: Drying after coating at 110° C. for 3 minutes (corresponding to test 9)
k*: Drying after coating at 90° C. for 5 minutes, baking after light exposure at 160° C. for 2 minutes (corresponding to test 8)
l*: Drying after coating at 90° C. for 10 minutes, baking after light exposure at 150° C. for 1 minute (corresponding to test 8)

TABLE 7

| Photosensitive resin composition | Test 10 f* (Adhesion with PSG film) | | Test 11 f* (Adhesion with Encapsulating resin) | |
|---|---|---|---|---|
| | PCT 0 hour | PCT 100 hours | PCT 0 hour | PCT 100 hours |
| Example 18 | g* 2.6 | 1.3 | 3.3 | 2.0 |
| | h* 2.8 | 1.5 | 3.5 | 2.3 |
| Example 19 | g* 2.3 | 1.2 | 3.3 | 2.1 | f*: unit (kg/mm$^2$)
g*: Substrate was directly coated with photosensitive resin composition
h*: Substrate was coated first with polyamic acid and, then, with photosensitive resin composition Comparative Example A four-necked flask purged with a nitrogen gas was charged with 20.0 g of PMDA, 20.6 g of potassium-t-butoxide and 200 ml of tetrahydrofuran (THF), and the system was stirred for 12 hours. Then, the formed precipitate was separated out by means of filtration, followed by washing with THF and diethylether and subsequently drying the washed precipitate. The dried precipitate was dissolved in 200 ml of water, neutralized with a dilute sulfuric acid and, then, the formed precipitate was separated out by means of filtration. Further, the separated precipitate was washed with water and, then, dried. Still further, the dried precipitate was recrystallized within a mixture of ethanol and water so as to obtain 15 g of pyromellitic acid ester.

In the next step, 11.98 g of the pyromellitic acid ester noted above, 6.01 g of ODA, and 8.4 g of triethylamine were dissolved in 50 ml of NMP, and the solution was cooled to −10° C. in a three-necked flask purged with a nitrogen gas. Further, N,N'-(phenylphosphino) bis

[2(3H)-benzothizolon] was slowly added to the solution, followed by adding 100 ml of NMP to the solution. The resultant solution was stirred for 2 hours. After the stirring, the solution was slowly poured to 2 liters of methanol which was kept vigorously stirred so as to precipitate a polymer, which was separated out by filtration and, then, dried under vacuum so as to obtain 10.5 g of polyamic acid ester.

1 g of the polyamic acid ester thus prepared was mixed with 5.35 g of the polyamic acid solution (PA-1) prepared in Example 18, 3 g of NMP and 0.5 g of o-naphthoquinone diazide (QD-5) acting as a photosensitive agent so as to prepare a solution. The solution was passed through a filter having a pore size of 0.5 micron so as to prepare a photosensitive resin composition for Comparative Example 1. On the other hand, another solution was prepared by mixing 8.02 g of the polyamic acid solution (PA-1), the polymer content of which was 1.5 g, 0.5 g of the polyamic acid ester prepared in Comparative Example 1, 0.86 g of o-naphthoquinone diazide (QD-5) acting as a photosensitive agent, and 2 g of NMP. The solution was passed through a filter having a pore size of 0.5 micron so as to prepare a photosensitive resin composition for Comparative Example 2.

It should be noted that, in the photosensitive resin composition in each of Comparative Examples 1 and 2, an organic group having at least one hydroxyl group bonded to the aromatic ring is not introduced into the side chain of the polyamic acid derivative, i.e., the resin component of the composition.

The coating, light exposure and development with an alkaline developing solution (1.19 wt % aqueous solution of TMAH) were performed as in test 8 described previously, except for the post-exposure baking, with respect to the photosensitive resin composition for each of the Comparative Examples 1 and 2. The exposed portion and non-exposed portion of the resin composition layer were both dissolved in the alkaline developing solution, resulting in failure to form a pattern. This is considered to suggest that, in the photosensitive resin composition of the present invention, the post-exposure baking is required for the pattern formation in the case where an organic group having at least one hydroxyl group bonded to the aromatic ring is not introduced into the side chain of the resin component of the composition.

Incidentally, the composition according to each of Comparative Examples 1 and 2 was treated as in test 8 including the post-exposure baking. Resolution of lines and spaces each having a width of 5.0 microns was recognized in this case. This suggests that, even if an organic group having at least one hydroxyl group attached to the aromatic ring is not introduced into the side chain of the resin component of a photosensitive resin composition, the post-exposure baking permits the composition to form a pattern.

EXAMPLE 20

A four-necked flask having an inner volume of 100 ml purged with a nitrogen gas was charged with 1.526 g (0.007 mol) of PMDA, 1.763 g (0.014 mol) of 3-hydroxybenzyl alcohol and 10 ml of NMP. The mixed solution was stirred at room temperature for 24 hours so as to obtain dihydroxybenzyl pyromellitate.

Then, the flask was cooled to 0° C., followed by adding a solution prepared by dissolving 2.00 g (0.01 mol) of 4,4'-diaminodiphenylether in 10 ml of NMP to the flask while stirring the flask. Further, a solution prepared by dissolving 3.17 g (0.0154 mol) of DCC in NMP was dripped into the reaction flask over 25 minutes. The resultant reaction solution was maintained at 5° C. so as to carry out the reaction for 4 hours, followed by slowly adding 0.654 g (0.003 mol) of PMDA to the reaction solution. Further, the reaction solution was maintained at 5° C. so as to carry out the reaction for 4 hours, followed by removing the formed precipitate by filtration under a reduced pressure. The filtrate was poured into 600 ml of water so as to precipitate a polyamic acid ester having a copolymer structure.

2 g of the polyamic acid ester thus prepared was dissolved in 8 g of NMP, followed by adding to the solution 0.46 g of a photosensitive agent, i.e., 1,2-naphthoquinone diazide-5-sulfonic acid ester of 2,3,4,4'-tetrahydroxy benzophenone (QD-4, average esterification rate of 75%) so as to prepare a photosensitive resin composition according to the third embodiment of the present invention.

EXAMPLES 21 TO 24

Photosensitive resin compositions according to the third embodiment of the present invention were prepared as in Example 20 using the raw material compositions shown in Table 8.

EXAMPLE 25

2.0 g of a polyamic acid ester prepared as in Example 20 was dissolved in 8 g of NMP, followed by adding as a photosensitive agent 0.40 g of 2,6-di-(4'-azidebenzal)-4-methylcyclohexane (A-21) to the solution so as to prepare a photosensitive resin composition according to the third embodiment of the present invention (see Table 8).

EXAMPLE 26

A reaction flask was charged with 16.11 g (0.05 mol) of BTDA, 12.41 g of 3-hydroxylbenzyl alcohol, and 100 g of NMP. The mixture, which was kept stirred slowly, was heated to 90° C. and the stirring was continued for additional 3 hours at 90° C. Then, the reaction solution was cooled to room temperature, followed by slowly adding a solution prepared by dissolving 15.02 g (0.075 mol) of 4,4'-diaminodiphenylenter in 70 g of NMP to the reaction solution. Then, the reaction solution was maintained at 10° C., and a solution prepared by dissolving 21.66 g (0.105 mol) of dicyclohexylcarbodiimide in 50 g of NMP was dripped into the reaction solution over 30 minutes. The resultant reaction solution was stirred for 4 hours at 10° C.

In the next step, 5.45 g (0.025 mol) of PMDA was added to the reaction solution, and the resultant solution was kept stirred for 5 hours at a reaction temperature of 10° C. Then, a by-product precipitate was removed by means of suction filtration so as to obtain a mother liquor, i.e., a solution of a polyamic acid derivative having a copolymer structure. Further, 1.0 g of o-naphthoquinone diazide (QD-5) was dissolved in 20 g of the polyamic acid derivative solution, and the resultant solution was passed through a filter having a pore size of 0.5 micron so as to prepare a photosensitive resin composition according to the third embodiment of the present invention (see Table 8).

Various properties of the photosensitive resin composition of the third embodiment thus prepared were evaluated as follows:

Test 12: (Evaluation of Resolution Performance)

The resolution of the photosensitive resin composition prepared in each of Examples 20 to 26 was evaluated by the method similar to that in test 1. Table 9 shows the conditions and results of the evaluation.

Test 12': (Evaluation of Resolution Performance)

A silicon wafer having a diameter of 3 inches was coated with the photosensitive resin composition prepared in Example 26 and, then, put on a hot plate of 90° C. for heating and drying the coating for 10 minutes, so as to obtain a composition film having a thickness of 4 microns. The composition film was exposed to an ultraviolet radiation with an exposure of 200 mJ/cm² through a patterning mask by using an exposure apparatus PLA-500F referred to previously. After the exposure, the silicon wafer was baked for 20 minutes on a hot plate of 140° C., followed by dipping the silicon wafer in an alkaline developing solution(2.38 wt % aqueous solution of TMAH) for 7 minutes at room temperature for the developing purpose. Finally, the wafer was rinsed with water.

A cross section of each of the patterns thus formed was observed with an electron microscope. The conditions and results of the evaluation are shown in Table 9. The results shown in Table 9 suggest that the polyimide film pattern formed by using the photosensitive resin composition of the third embodiment exhibits a resolution suitable for using the pattern as a passivation film or an interlayer insulating film in a semiconductor device.

TABLE 8

| Photosensitive resin composition | Polyamic acid derivative (numeral denoting molar ratio) | | | | | Resin component (weight (g) of polyamic acid derivative used) | Photosensitive agent (weight (g) of compound used) |
|---|---|---|---|---|---|---|---|
| | a* Tetracarboxilic dianhydride | b* | Diamine | | a* Additional Reactnat | | |
| Example 20 | PMDA 0.7 | 3-hydroxybenzyl alcohol 1.4 | ODA 1.0 | — | PMDA 0.3 | 2.0 g | QD-4 0.46 g |
| Example 21 | PMDA 0.7 | 3-hydroxybenzyl alcohol 1.4 | ODA 0.7 | 6FDA 0.3 | PMDA 0.3 | 2.0 g | QD-4 0.46 g |
| Example 22 | PMDA 0.7 | 4-hydroxybenzyl alcohol 1.4 | ODA 0.7 | 6FDA 0.3 | PMDA 0.3 | 2.0 g | QD-4 0.46 g |
| Example 23 | BTDA 0.8 | 3-hydroxybenzyl alcohol 1.6 | ODA 1.0 | — | BTDA 0.2 | 2.0 g | QD-4 0.46 g |
| Example 24 | PMDA 0.7 | 3-hydroxybenzyl alcohol 1.4 | ODA 1.0 | — | BTDA 0.3 | 2.0 g | QD-4 0.46 g |
| Example 25 | PMDA 0.7 | 3-hydroxybenzyl alcohol 1.4 | ODA 1.0 | — | PMDA 0.3 | 2.0 g | A-21 0.40 g |
| Example 26 | BTDA 0.5 | 3-hydroxybenzyl alcohol 1.0 | ODA 0.75 | — | PMDA 0.25 | 20 g | QD-5 0.1 g | b*: Compound reacted with a*
Description in the specification should be referred to with respect to abbreviations of compounds in the talbe.

TABLE 9

| Photosensitive resin Composition | Tests 12/12' (Resolution Performance) | | | | | |
|---|---|---|---|---|---|---|
| | Exposure apparatus | Exposure (mJ/cm²) | d* Conc. of developing solution | Developing time (sec) | e* Resolution (μm) | Initial film thickness (μm) |
| Example 20 | PLA-500F | 400 | 2.38% | 20 | 10.0 P | 8.0 |
| Example 21 | " | 350 | " | " | 8.0 N | 5.0 |
| Example 22 | " | 280 | " | " | 5.0 N | 5.5 |
| Example 23 | " | 200 | " | " | 4.0 N | 3.0 |
| Example 24 | " | 290 | " | " | 5.0 N | 5.0 |
| Example 25 | " | 350 | " | " | 5.0 N | 5.0 |
| Example 26 | m* PLA-500F | 180 | " | 420 | 6.0 N | 4.0 | d*: Developing solution, TMAH aqueous solution (wt %)
e*: P ... positive pattern, N ... negative pattern
m*: Baking after exposure at 140° C. for 20 minutes (corresponding to test 12')

EXAMPLE 27

Polyamic acid (PA-2) having an intrinsic viscosity of 0.60 g/dl was obtained by the reaction among 0.1 mol of BTDA, 0.095 mol of ODA and 0.005 mol of bis (γ-aminopropyl) tetramethylsiloxane. Then, a solution was prepared by dissolving 7.5 g of a polyamic acid derivative represented by formula (PE-3) given below, 2.5 g of the polyamic acid (PA-2) noted above, and 2.5 g of a photosensitive agent, i.e., o-naphthoquinone diazide compound (QD-4) in 50 g of NMP:

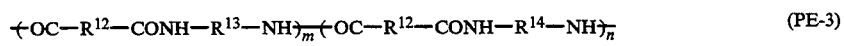
(PE-3)

$R^{12}$:

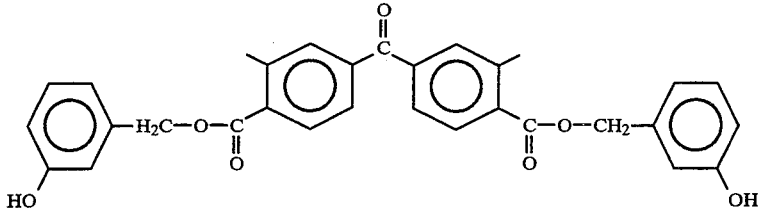

$R^{13}$:

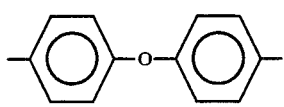

$R^{14}$:

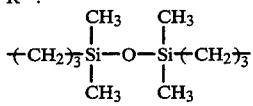

m:n = 0.95:0.05        $\eta_{inh}$ = 0.20

The solution thus prepared was passed through a filter having a pore size of 0.5 micron so as to obtain a photosensitive resin composition according to the second embodiment of the present invention.

EXAMPLES 28 AND 29

Photosensitive resin compositions of the present invention were prepared as in Example 27 by using the resin components and the photosensitive agents shown in Table 10.

Test 13: (Evaluation of Resolution Performance)

A silicon wafer was coated with a polyamic acid solution (CT4200T manufactured by Toshiba Chemical Co., Ltd.). Then, the wafer was heated on a hot plate of 160° C. for 20 minutes so as to obtain a coated film having a thickness of 0.4 micron. The coated film was further coated with the photosensitive resin composition prepared in Example 27, and the wafer was heated on a hot plate of 90° C. for 10 minutes so as to obtain a composition film having a thickness of 5 microns. Then, the composition film was exposed to light with an exposure apparatus of 200 mJ/cm² through a patterning mask, followed by dipping the wafer in an alkaline developing solution (2.38 wt % aqueous solution of TMAH) for the developing purpose. Finally, the wafer was rinsed with water so as to form a desired pattern.

A cross section of the pattern thus formed was observed with an electron microscope.

A similar test was applied with respect to each of the photosensitive resin compositions prepared in Examples 28 and 29 so as to evaluate the resolution of the formed pattern.

Table 10 also shows the conditions and results of the test.

Test 14: (Evaluation of Adhesion)

A silicon wafer was coated with a polyamic acid solution available on the market, followed by heating the wafer so as to form a film. The film thus formed was further coated with the photosensitive resin composition prepared in Example 27, as in test 13 described above. Further, the wafer was heated within an oven at 150° C. for 30 minutes, at 250° C. for 30 minutes and, then, at 350° C. for 30 minutes so as to form a cured film.

The cured film was imparted with cutting lines with a razor at an interval of 1 mm so as to form 100 square sections each sized at 1 mm × 1 mm.

A cellophane tape, which was attached to the cured film, was peeled off (cross cut test). However, the cured film was not peeled off at all. Then, the wafer was exposed to a saturated steam of 12° C. (pressure cooker test, PCT). The cross cut test was applied again to the wafer 100 hours after the pressure cooker test, with the result that peeling of the film was not recognized at all.

Test 15: (Evaluation of Adhesion with PSG Film)

A silicon wafer having a PSG film formed on the surface was coated first with a polyamic acid and, then, with the photosensitive resin composition prepared in each of Examples 27 to 29. Then, a silicon chip, 2 mm square, having a PSG film formed on the surface and a polyamic acid thin film formed on the PSG film was put on the photosensitive resin composition layer so as to form a laminate structure of PSG film/polyamic acid thin film/photosensitive resin composition layer/polyamic acid thin film/PSG film.

The adhesion strength of the photosensitive region composition with a PSG film was evaluated by the method and under the conditions similar to those in test 5. Table 11 shows the results.

Test 16: (Evaluation of Adhesion with Epoxy Resin for Encapsulating Semiconductor Device)

A silicon wafer having a phosphosilicate glass (PSG) film formed on the surface was coated first with a polyamic acid and, then, with the photosensitive resin composition prepared in each of Examples 27 to 29.

The adhesion strength with an epoxy resin for encapsulating a semiconductor device was evaluated by the method and under the conditions similar to those in test 6. Table 11 also shows the results.

Tables 10, 11 and the result of test 14 collectively indicate that, where a polyamic acid thin film is formed first on a substrate, followed by forming a pattern by using the photosensitive resin composition of the present invention, the resultant polyimide film pattern exhibits a resolution and adhesion, etc. suitable for using the pattern as a passivation film or an interlayer insulating film in a semiconductor device.

photosensitive agent were dissolved in 40 g of NMP, followed by passing the resultant solution through a

TABLE 10

| | Test 13 (resolution performance) | | | | | |
|---|---|---|---|---|---|---|
| Photosensitive resin composition Resin component/ photosensitive agent | Polyamic acid coated in advance on substrate | | Film thickness after coating of upper layer | Exposure (mJ/cm$^2$) | d* Development | e* Resolution (μm) |
| | Polymer | Film thickness (μm) | | | | |
| Example 27 | PE-3, PA-2/QD-4 = 75:25 (weight ratio) | CT4200T | 0.4 | 5.0 | 200 | 2.38% TMAH 60 sec. | 5.0 P |
| " | PE-3, PA-2/QD-4 = 75:25 (weight ratio) | PA-2 | 30 | 40 | 350 | 1.19% TMAH 120 sec. | 50.0 P |
| Example 28 | PE-3/QD-5 | PA-2 | 0.5 | 6.5 | 330 | 2.38% TMAH 60 sec. | 5.0 P |
| Example 29 | PE-1:PA-2 = 50:50 (weight ratio)/A-21 | PA-2 | 0.3 | 3.0 | 220 | 1.19% TMAH 40 sec. | 10.0 N | d*: Developing solution, TMAH aqueous solution (wt %)
e*: P ... Positive pattern, N ... Negative pattern
Description in the specification should be referred to with respect to abbreviations of compounds in the table.

TABLE 11

| Photosensitive resin composition | Polyamic acid coated in advance on substrate | | Film thickness after coating of upper layer (μm) | Test 15 f* (Adhesion with PSG film | | Test 16 f* (Adhesion with Encapsulating resin) | |
|---|---|---|---|---|---|---|---|
| | Polymer | Film thickness (μm) | | PCT- 0 hour | PCT- 100 hours | PCT- 0 hour | PCT- 100 hours |
| Example 27 | PA-2 | 30 | 40 | 3.2 | 1.8 | 4.0 | 2.9 |
| Example 28 | " | 0.5 | 6.5 | 3.0 | 1.5 | 2.7 | 1.9 |
| Example 29 | " | 0.3 | 3.0 | 3.2 | 1.7 | 4.1 | 3.0 | f*: unit kg/mm$^2$
Description in the specification should be referred to with respect to abbreviations of compounds in the table.

Reference Example 8.0 g of polyimide (PI-3) shown below and 2 g of o-naphthoquinone diazide compound (QD-4) acting as a filter having a pore size of 0.5 micron so as to prepare a photosensitive polyimide resin composition:

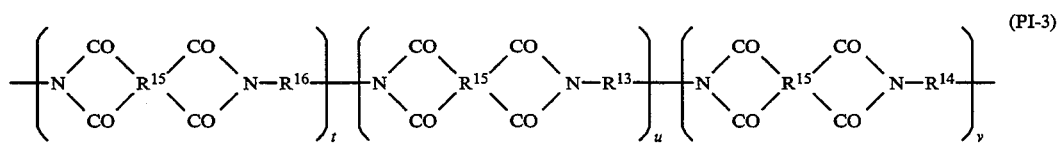
(PI-3)

R$^{13}$:

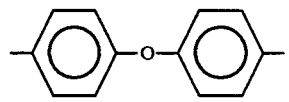

R$^{14}$:

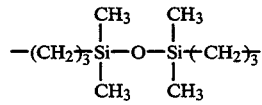

R$^{15}$:

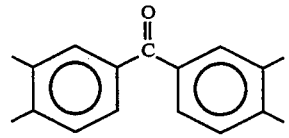

R$^{16}$:

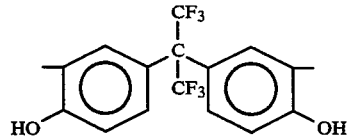

t:u:v = 80:10:10

$\eta_{inh} = 0.20$

Then, a silicon wafer was coated with a polyamic acid solution available on the market, i.e., CT4200T referred to previously, followed by drying the coating in an oven of 150° C. for 1 hour so as to form a coated film having a thickness of 0.8 micron. The coated film thus prepared was further coated with the photosensitive polyimide resin composition film noted above, followed by heating and drying on a hot plate for 5 minutes so as to obtain a resin composition film having a thickness of 5.0 micron. Then, the resin composition film was exposed to light through a patterning mask, followed by dipping the wafer in an alkaline developing solution (1.19% aqueous solution of TMAH) for the developing purpose. Finally, the wafer was rinsed with water so as to obtain a positive pattern. The pattern thus formed was observed with a microscope. Recognized was a resolution of lines and spaces of 4 microns.

The photosensitive polyimide resin composition was subjected to tests for evaluation of the adhesion strength with a phosphosilicate glass as in test 15 and for evaluation of the adhesion strength with an epoxy resin for encapsulating a semiconductor device as in test 16. The results obtained in these tests were not better than those in the case of using the photosensitive resin composition of the present invention.

The test results suggest that, where the substrate is coated in advance with a polyamic acid solution, it is possible to form a satisfactory polyimide film pattern in the cases of using various photosensitive compositions including those which do not fall within the technical scope of the present invention.

As described above, the photosensitive resin composition according to any of the first to third embodiments of the present invention permits forming a polyimide film pattern without using a photoresist, making it possible to simplify the process of forming a polyimide film pattern in the manufacture of a semiconductor device. What should also be noted is that the polyimide film pattern formed by using the composition of the present invention exhibits a resolution, adhesion, etc. suitable for using the pattern as a passivation film or an interlayer insulating film in a semiconductor device.

The Examples which follow are directed to the specific method of forming a polyimide film pattern using a photosensitive resin composition according to the fourth embodiment of the present invention. The abbreviations used in Examples 30 to 61 and Tables 12 to 19, which follow, are explained in Table G and H.

EXAMPLE 30

A nitrogen gas dried with phosphorus pentoxide was introduced in a reaction flask equipped with a stirrer, a thermometer and a dropping funnel. Then, the reaction flask was charged with 4.635 g (0.21 mol) of pyromellitic dianhydride, 19.993 g (0.062 mol) of 3,3′,4,4′-benzophenone tetracarboxylic dianhydride, 0.333 g (0,003 mol) of maleic anhydride and 100 g of N-methyl-2-pyrrolidone. The resultant mixture was fully stirred and, then, cooled to −5° C.

Then, a solution prepared by dissolving 15.996 g (0.081 mol) of 4,4′-diaminodiphenylether and 1.199 g (0.003 mol) of bis (γ-aminopropyl) tetramethyldisiloxane in 69 g of N-methyl-2-pyrrolidone was slowly dripped into the reaction flask. The mixed solution thus prepared was maintained at a temperature falling within a range of between −5° and 0° C. for 4 hours and, then, reaction was carried out at room temperature (20° C.) for 4 hours so as to obtain a polyamic acid. The mixed solution of the polyamic acid thus prepared and N-methyl-2-pyrrolidone was controlled and a logarithmic viscosity of the mixed solution was measured at 30° C., the result being 0.83 dl/g.

In the next step, 10 g of the polyamic acid solution was mixed with 2.5 g of a naphthoquinone diazide compound of the general formula given below, and the mixture was sufficiently stirred at room temperature (20° C.) to form a homogeneous system:

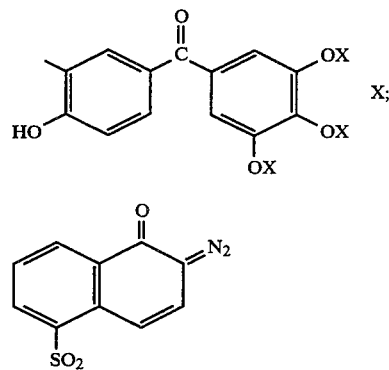

The homogeneous mixture was passed through a membrane filter having a pore size of 0.5 micron so as to obtain a photosensitive resin composition containing as main components a polyamic acid and a naphthoquinone diazide compound. A polyimide film pattern was formed by the particular pattern forming method of the present invention by using the photosensitive resin composition thus prepared, and various properties of the polyimide film pattern were measured as follows:

Test 17: (Evaluation of Resolution Performance)

A silicon wafer having a diameter of 3 inches was coated with the photosensitive resin composition prepared in Example 30 by using a spinner, followed by heating the wafer on a hot plate of 100° C. for 10 minutes so as to form a resin layer having a thickness of 6.2 microns. The resin layer thus formed was exposed to light through a quartz mask for resolution performance test by using a contact exposure machine (CA-800 manufactured by Cobilt, Inc.), with a exposure of 70 mJ/cm² (wavelength of 365 nm). After the exposure step, a baking treatment was applied to the resin layer at 150° C. for 2 minutes, followed by dipping the wafer in a resist developing solution (2.38 wt % aqueous solution of tetramethyl ammonium hydroxide) for 60 seconds and subsequently applying water wash for 20 seconds so as to form a negative pattern.

A cross section of the pattern thus formed was observed with an electron microscope. Recognized was a resolution of lines and spaces of 3 microns. The resultant pattern was heated at 320° C. so as to form a satisfactory polyimide film pattern.

Test 18: (Evaluation of Adhesion with Silicon Wafer)

A silicon wafer having a diameter of 3 inches was coated with the photosensitive resin composition prepared in Example 30 by using a spinner. The wafer was heated on a hot plate of 90° C. for 10 minutes so as to form a resin layer having a thickness of 5.0 microns. Then, the wafer was put in a constant temperature dryer and heated at 150° C. for 1 hour, 250° C. for 1 hour and, then, at 320° C. for 1 hour, so as to imidize the resin layer formed on the wafer. Further, the wafer was heated at 120° C. for 24 hours under a saturated steam of 2 atms, followed by evaluating the adhesion strength by the checker's test method. It has been found that the resin layer did not peel at all from the wafer, indicating a high adhesion strength of the resin layer with the wafer.

Test 19: (Evaluation of Heat Resistance)

A silicon wafer having a diameter of 3 inches was coated with the photosensitive resin composition prepared in Example 30 by using a spinner. The wafer was heated on a hot plate of 90° C. for 10 minutes so as to form a resin layer having a thickness of 5.0 microns. Then, the wafer was put in a constant temperature dryer and heated at 150° C. for 1 hour, 250° C. for 1 hour and, then, at 320° C. for 1 hour, so as to imidize the resin layer formed on the wafer. After the heating, the resin layer was peeled off the wafer with a razor, followed by subjecting the peeled resin layer to a thermogravimetric analysis (TGA). Weight reduction caused by thermal decomposition was not recognized until about 400° C.

Comparative Tests for Evaluating Properties

A silicon wafer having a diameter of 3 inches was coated with the photosensitive resin composition prepared in Example 30 by using a spinner. The wafer was heated on a hot plate of 90° C. for 10 minutes so as to form a resin layer having a thickness of 5.0 microns. Then, the resin layer thus formed was exposed to light through a quartz mask for resolution performance test by using a contact exposure machine CA-800 referred to previously, with a light exposure rate of 70 mJ/cm$^2$ (wavelength of 365 nm). After the exposure step, the silicon wafer was immediately dipped in a resist developing solution (2.38 wt % aqueous solution of tetramethyl ammonium hydroxide) for 60 seconds so as to form a pattern. Then, the silicon wafer was pulled out of the developing solution and washed with water for 20 seconds. In this case, however, the remaining portion of the patterned resin layer was found dissolved, resulting in failure to form a good pattern.

On the other hand, a silicon wafer having a diameter of 3 inches was coated with the photosensitive resin composition prepared in Example 30 by using a spinner. The wafer was heated on a hot plate of 90° C. for 10 minutes so as to form a resin layer having a thickness of 5.0 microns. Then, the resin layer thus formed was subjected to a heat treatment at 150° C. for 2 minutes, followed by exposing the resin layer to light through a quartz mask for evaluating the resolution by using a contact exposure machine CA-800 referred to previously, with a light exposure of 70 mJ/cm$^2$ (wavelength of 365 nm). Immediately after the exposure step, the silicon wafer was dipped in a resist developing solution (2.38 wt % aqueous solution of tetramethyl ammonium hydroxide) for 60 seconds, resulting in failure to form a pattern. The pattern formation is considered to have been achieved because the naphthoquinone diazide compound contained in the resin layer was decomposed during the heat treatment before the exposure step.

EXAMPLES 31 TO 38

Polyamic acid solutions were prepared as in Example 30 using the raw material compositions shown in Table 12. Table 12 also shows the logarithmic viscosity of each of the polyamic acid solutions prepared in Examples 31 to 38. Further, photosensitive resin compositions of Examples 31 to 38 were prepared by mixing predetermined amounts of the polyamic acid solutions and the naphthoquinone diazide compounds as shown in Table 12.

Test 20: Evaluation of Resolution Performance

A layer of the photosensitive resin composition prepared in each of Examples 31 to 38, which was formed on a silicon wafer, was subjected to light exposure, baking treatment, and development by the method and under the conditions as in test 17 for evaluation of the resolution performance for Example 30 so as to form a pattern. A cross section of each of the patterns thus formed was observed with an electron microscope so as to measure the resolution. Table 13 shows the results.

Test 21: (Evaluation of Adhesion with Silicon Wafer)

The adhesion strength between a formed pattern and a silicon wafer was measured by the method and under the conditions as in test 18 for evaluating the adhesion strength for Example 30 with respect to the photosensitive resin composition prepared in each of Examples 31 to 38. Table 13 also shows the results.

Test 22: (Evaluation of Heat Resistance)

The heat resistance of a pattern formed on a silicon wafer was measured by the method and under the conditions as in test 19 for evaluating the heat resistance for Example 30 with respect to the photosensitive resin composition prepared in each of Examples 31 to 38. Table 13 also shows the results.

As shown in Table 13, a negative pattern was formed in the case of using the photosensitive resin composition prepared in any of Examples 31 to 38. Particularly, the pattern formed by using the composition prepared in any of Examples 31 to 36 was excellent in resolution, exhibited a high adhesion between the formed pattern and the substrate, was sufficiently high in the resistance to heat. When it comes to the composition prepared in Example 37, in which a large amount of naphthoquinone diazide compound was used, the weight reduction of the resin layer in the imidizing step was large, and the adhesion strength of the resultant polyimide film with the substrate was lowered. On the other hand, in the case of the composition prepared in Example 38, in which the amount of naphthoquinone diazide compound used was small, the resolution of the formed pattern was somewhat low because each of the exposed portion and the non-exposed portion was relatively high in solubility in an alkaline solution. Of course, Example 38 was found inferior to the other Examples in the patterning characteristics.

TABLE 12

|  |  | \multicolumn{9}{c}{Examples} |
| --- | --- | --- | --- | --- | --- | --- | --- | --- | --- | --- |
|  |  | 30 | 31 | 32 | 33 | 34 | 35 | 36 | 37 | 38 |
| Mixing of Polyamic Acid |  |  |  |  |  |  |  |  |  |  |
| Tetracarboxylic dianhydride (g) | BPDA | — | 17.653 | — | 5.884 | — | — | — | — | — |
|  | BTDA | 19.993 | 12.888 | 17.721 | 18.688 | 11.921 | 15.788 | 22.554 | 19.993 | 19.933 |
|  | PMDA | 4.635 | — | 9.815 | 4.362 | 13.086 | 10.905 | 6.107 | 4.635 | 4.635 |
|  | DPE | 15.969 | — | 19.219 | 18.819 | — | 10.010 | 18.819 | 15.996 | 15.996 |
| Diamine (g) | DAM | — | 18.439 | — | — | 19.232 | 8.922 | — | — | — |
|  | ASi-a | 1.119 | 0.944 | — | 1.491 | 0.746 | — | — | 1.119 | 1.119 |
|  | ASi-b | — | — | 1.089 | — | — | 2.178 | 3.267 | — | — |
| Monoamine (g) | Å | — | 0.559 | — | — | — | — | — | — | — |
|  | T | — | — | 0.428 | — | — | — | — | — | — |
| Dicarboxylic anhydride | Å-a | — | — | — | 0.592 | — | — | — | — | — |
|  | Å-b | — | — | — | — | 0.924 | — | — | — | — |
|  | Å-c | — | — | — | — | — | 0.356 | — | — | — |
|  | Å-d | — | — | — | — | — | — | 0.672 | — | — |
|  | Å-e | 0.333 | — | — | — | — | — | — | 0.333 | 0.333 |
| Synthetic Conditions | Temp. (°C.) | −5~20 | −5~25 | −10~25 | 0~25 | 0~25 | 0~25 | 0~25 | −5~20 | −5~20 |
|  | Time (hour) | 8 | 8 | 8 | 7 | 7 | 7 | 7 | 8 | 8 |
| Logarithmic Viscosity | (dl/g) | 0.82 | 0.82 | 0.79 | 0.58 | 0.92 | 0.79 | 0.61 | 0.82 | 0.82 |
| Mixing Amount of Polyamic Acid | (g) | 7.5 | 7.0 | 7.5 | 7.0 | 8.0 | 7.0 | 7.0 | 5.5 | 9.5 |
| Mixing Amount of Naphthoquinone diazide compound (g) | PAC-a | 2.5 | 3.0 | — | — | — | — | — | — | — |
|  | PAC-b | — | — | 2.5 | 3.0 | 2.0 | 3.0 | 3.0 | 4.5 | 0.5 |

TABLE 13

|  | \multicolumn{9}{c}{Examples} |
| --- | --- | --- | --- | --- | --- | --- | --- | --- | --- |
|  | 30 | 31 | 32 | 33 | 34 | 35 | 36 | 37 | 38 |
| Coated Film Thickness (μm) | 6.2 | 4.9 | 6.6 | 5.5 | 4.2 | 5.2 | 5.5 | 5.0 | 4.8 |
| Test 20 (resolution/μm) | 3.0 (negative) | 2.5 (negative) | 2.0 (negative) | 1.5 (negative) | 2.5 (negative) | 2.0 (negative) | 1.5 (negative) | 10.0 (negative) | 25.0 (negatove) |
| Test 21 (Adhesion Evaluation by Checker's test) | 0/100 | 0/100 | 0/100 | 0/100 | 0/100 | 0/100 | 0/100 | 50/100 | 0/100 |
| Test 22 (10% weight reduction temperature) | 420 | 430 | 410 | 430 | 425 | 425 | 430 | 350 | 430 |

*Evaluation by Checker's test (Evaluation of Adhesion): Adhesion strength with silicon wafer after heating for 24 hours under saturated steam of 2 atms.
*10% Weight Reduction Temperature (°C.) (Evaluation of Heat Resistance): TGA measurement after thermal curing at 320° C.

EXAMPLES 39 TO 45

Polyamic acid solutions used in Examples 39 to 45 were prepared as in Example 30 by using the raw material compositions shown in Table 14. Table 14 also shows the logarithmic viscosity of each of the polyamic acid solutions noted above. Further, photosensitive resin compositions for Examples 39 to 45 were prepared by mixing predetermined amounts of the polyamic acid solutions with naphthoquinone diazide compound as shown in Table 14.

Test 23: (Evaluation of Resolution Performance)

A layer of the photosensitive resin composition prepared in each of Examples 39 to 45, which was formed on a silicon wafer, was subjected to light exposure, baking treatment, and development by the method and under the conditions as in test 17 for evaluation of the resolution performance for Example 30 so as to form a pattern. In this test, the exposure was set at 150 mJ/cm², and the development was performed by dipping the silicon wafer in an aqueous solution containing 1.19% by weight of tetramethyl ammonium hydroxide, followed by washing the wafer with water. A cross section of each of the patterns thus formed was observed with an electron microscope so as to measure the resolution. Table 15 shows the results.

Test 24: (Evaluation of Adhesion with Silicon Wafer)

The adhesion strength between a formed pattern and a silicon wafer was measured by the method and under the conditions as in test 18 for evaluating the adhesion for Example 30 with respect to the photosensitive resin composition prepared in each of Examples 39 to 45. Table 15 also shows the results.

Test 25: (Evaluation of Heat Resistance)

The heat resistance of a pattern formed on a silicon wafer was measured by the method and under the conditions as in test 19 for evaluating the heat resistance for Example 30 with respect to the photosensitive resin composition prepared in each of Examples 39 to 45. Table 15 also shows the results.

As shown in Table 15, a negative or positive fine pattern was formed in the case of using the photosensitive resin composition prepared in any of Examples 39 to 45. The pattern formed by using the composition prepared in any of Examples 39 to 45 exhibited a high adhesion between the formed pattern and the substrate, and was sufficiently high in the resistance to heat.

When it comes to the composition prepared in each of Examples 39 to 44, the formed pattern was found to exhibit a very high adhesion strength with the silicon wafer in the test for evaluating the adhesion strength with the silicon wafer. Specifically, even after heating for 62 hours at 120° C., the formed pattern did not peel at all off the wafer. On the other hand, peeling did not occur at all after heating for 24 hours at 120° C. in the case of the composition prepared in Example 45. However, the formed pattern was found to peel 10% off the wafer after the heating for 62 hours. It is considered reasonable to understand that, in the case of using a polyfunctional naphthoquinone diazide sulfonic acid ester as a photosensitive agent as in Example 45, the unreacted naphthoquinone diazide sulfonic acid ester is crosslinked during the heat treatment so as to lower the flexibility of the resin layer. In the case of using a monofunctional naphthoquinone diazide sulfonic acid ester as a photosensitive agent as in Examples 39 to 44, however, the crosslinking noted above does not take place, leading to an excellent adhesion strength of the formed pattern with the wafer, as noted above.

ple 39, followed by applying light exposure to the resin layer as in test 23 described above. Immediately after the light exposure, the silicon wafer was dipped in a resist developing solution (1.19 wt % aqueous solution of tetramethyl ammonium hydroxide). It was possible to form a pattern. However, when the wafer was taken out of the developing solution and, then, washed with water for 30 seconds, the remaining portion of the resin layer was dissolved, resulting in failure to form a satisfactory pattern.

TABLE 14

|  |  | Examples |  |  |  |  |  |  |
|---|---|---|---|---|---|---|---|---|
|  |  | 39 | 40 | 41 | 42 | 43 | 44 | 45 |
| Mixing of Polyamic Acid |  |  |  |  |  |  |  |  |
| Tetracarboxylic dianhydride (g) | BPDA | — | 17.653 | — | — | — | — | — |
|  | BTDA | 19.993 | 12.888 | 17.721 | 11.921 | 15.788 | 22.554 | 19.993 |
|  | PWDA | 4.635 | — | 9.815 | 13.086 | 10.905 | 6.107 | 4.635 |
|  | DPE | 15.969 | — | 19.219 | — | 10.010 | 18.819 | 15.996 |
| Diamine (g) | DAM | — | 18.439 | — | 19.232 | 8.922 | — | — |
|  | ASi-a | 1.119 | 0.944 | — | 0.746 | — | — | 1.119 |
|  | ASi-b | — | — | 1.089 | — | 2.178 | 3.267 | — |
| Monoamine (g) | Å | — | 0.559 | — | — | — | — | — |
|  | T | — | — | 0.428 | — | — | — | — |
| Dicarboxylic anhydride | Å-a | — | — | — | — | — | — | — |
|  | Å-b | — | — | — | 0.924 | — | — | — |
|  | Å-c | — | — | — | — | 0.356 | — | — |
|  | Å-d | — | — | — | — | — | 0.672 | — |
|  | Å-e | 0.333 | — | — | — | — | — | 0.333 |
| Synthetic Conditions | Temp. (°C.) | −5~20 | −5~25 | −10~25 | 0~25 | 0~25 | 0~25 | −5~20 |
|  | Time (hour) | 8 | 8 | 8 | 7 | 7 | 7 | 8 |
| Logarithmic Viscosity | (dl/g) | 0.82 | 0.82 | 0.79 | 0.92 | 0.79 | 0.61 | 0.82 |
| Mixing Amount of Polyamic Acid | (g) | 7.0 | 7.0 | 7.5 | 7.5 | 7.0 | 7.0 | 7.0 |
| Mixing Amount Naphthoquinone diazide compound (g) | PAC-c | 3.0 | — | — | 2.5 | — | 3.0 | — |
|  | PAC-d | — | 3.0 | — | — | — | — | — |
|  | PAC-e | — | — | 2.5 | — | — | — | — |
|  | PAC-f | — | — | — | — | 3.0 | — | — |
|  | PAC-g | — | — | — | — | — | — | 3.0 |

TABLE 15

|  | Examples |  |  |  |  |  |  |
|---|---|---|---|---|---|---|---|
|  | 39 | 40 | 41 | 42 | 43 | 44 | 45 |
| Coated Film Thickness (μm) | 4.5 | 4.0 | 5.0 | 4.0 | 3.7 | 5.1 | 4.5 |
| Test 23 (resolution/μm) | 3.5 (positive) | 2.0 (negative) | 2.2 (negative) | 3.0 (positive) | 1.5 (negative) | 3.5 (positive) | 2.0 (negative) |
| Test 24 (Adhesion; Evaluation by Checker's test) | 0/100 | 0/100 | 0/100 | 0/100 | 0/100 | 0/100 | 10/100 |
| Test 25 (10% weight reduction temperature) | 415 | 440 | 400 | 415 | 415 | 420 | 400 |

*Evaluation by Checker's test (Evaluation of Adhesion): Adhesion strength with silicon wafer after heating for 62 hours under saturated steam of 2 atms.
*10% Weight Reduction Temperature (°C.) (Evaluation of Heat Resistance): TGA measurement after thermal curing at 320° C.

Comparative Test for Evaluating Characteristics

A resin layer was formed on a silicon wafer by using the photosensitive resin composition prepared in Exam- EXAMPLES 46 to 52

Polyamic acid solutions used in Examples 46 to 52 were prepared as in Example 30 by using the raw material compositions in Table 16. Table 16 also shows the logarithmic viscosity of each of the polyamic acid solutions thus prepared. Then, photosensitive resin compositions for Examples 46 to 52 were prepared by mixing predetermined amounts of the polyamic acid solutions thus prepared and naphthoquinone diazide compound as shown in Table 16.

Test 26: (Evaluation of Resolution Performance)

A layer of the photosensitive resin composition prepared in each of Examples 46 to 52, which was formed on a silicon wafer, was subjected to light exposure, baking treatment, and development by the method and under the conditions as in test 17 for evaluation of the resolution performance for Example 30 so as to form a pattern. In this test, the exposure was set at 170 mJ/cm$^2$, and the development was performed by dipping the silicon wafer in an aqueous solution containing 1.19% by weight of tetramethyl ammonium hydroxide, followed by washing the wafer with water. A cross section of each of the patterns thus formed was observed with an electron microscope so as to measure the resolution. Table 17 shows the results.

Test 27: (Evaluation of Adhesion with Silicon Wafer)

The adhesion strength between a formed pattern and a silicon wafer was measured by the method and under the conditions as in test 18 for evaluating the adhesion strength for Example 30 with respect to the photosensitive resin composition prepared in each of Examples 46 to 52. Table 17 also shows the results.

Test 28: (Evaluation of Heat Resistance)

The heat resistance of a pattern formed on a silicon wafer was measured by the method and under the conditions as in test 19 for evaluating the heat resistance for Example 30 with respect to the photosensitive resin composition prepared in each of Examples 46 to 52. Table 17 also shows the results.

As shown in Table 17, a negative fine pattern was formed in the case of forming a pattern by the method described above by using the photosensitive resin composition prepared in any of Examples 46 to 52. The pattern thus formed exhibited a high adhesion strength between the formed pattern and the substrate, and was sufficiently high in the resistance to heat.

In Examples 45 to 52, a polyfunctional naphthoquinone diazide sulfonic acid ester was used as a photosensitive agent. However, the formed pattern was found to exhibit a very high adhesion strength with the silicon wafer. Specifically, even after heating for 62 hours at 120° C., the formed pattern did not peel at all off the wafer. It is considered reasonable to understand that, even if the naphthoquinone diazide sulfonic acid ester is crosslinked during the heat treatment, the reduction in the flexibility of the resin layer is suppressed because the naphthoquinone diazide sulfonic acid ester used in Examples 46 to 52 has a soft segment such as an aliphatic hydrocarbon structure or a polysiloxane structure in the main chain. In the case of using as a photosensitive agent a naphthoquinone diazide sulfonic acid ester having a soft segment such as an aliphatic hydrocarbon structure, polysiloxane structure or polysilane structure, it is possible to achieve a particularly excellent adhesion of the formed pattern with the silicon wafer.

Comparative Test for Evaluating Characteristics

A resin layer was formed on a silicon wafer by using the photosensitive resin composition prepared in Example 46, followed by applying a light exposure to the resin layer as in test 26 described above. Immediately after the light exposure, the silicon wafer was dipped in a resist developing solution (1.19 wt % aqueous solution of tetramethyl ammonium hydroxide). It was possible to form a pattern. However, when the wafer was taken out of the developing solution and, then, washed with water for 30 seconds, the remaining portion of the resin layer was dissolved, resulting in failure to form a satisfactory pattern.

TABLE 16

| | | Examples | | | | | | |
|---|---|---|---|---|---|---|---|---|
| | | 46 | 47 | 48 | 49 | 50 | 51 | 52 |
| Mixing of Polyamic Acid | | | | | | | | |
| Tetracarboxylic dianhydride (g) | BPDA | — | 17.653 | — | 5.884 | — | — | — |
| | BTDA | 19.993 | 12.888 | 17.721 | 18.688 | 11.921 | 15.788 | 22.554 |
| | PMDA | 4.635 | — | 9.815 | 4.362 | 13.086 | 10.905 | 6.107 |
| | DPE | 15.969 | — | 19.219 | 18.819 | — | 10.010 | 18.819 |
| Diamine (g) | DAM | — | 18.439 | — | — | 19.232 | 8.922 | — |
| | ASi-a | 1.119 | 0.944 | — | 1.491 | 0.746 | — | — |
| | ASi-b | — | — | 1.089 | — | — | 2.178 | 3.267 |
| Monoamine (g) | Å | — | 0.559 | — | — | — | — | — |
| | T | — | — | 0.428 | — | — | — | — |
| Dicarboxylic anhydride | Å-a | — | — | — | 0.592 | — | — | — |
| | Å-b | — | — | — | — | 0.924 | — | — |
| | Å-c | — | — | — | — | — | 0.356 | — |
| | Å-d | — | — | — | — | — | — | 0.672 |
| | Å-e | 0.333 | — | — | — | — | — | — |
| Synthetic Conditions | Temp. (°C.) | −5∼20 | −5∼25 | −10∼25 | 0∼25 | 0∼25 | 0∼25 | 0∼25 |
| | Time (hour) | 8 | 8 | 8 | 7 | 7 | 7 | 7 |
| Logarithmic Viscosity | (dl/g) | 0.82 | 0.82 | 0.79 | 0.58 | 0.92 | 0.79 | 0.61 |
| Mixing Amount of Polyamic Acid | (g) | 7.0 | 7.0 | 7.5 | 7.5 | 7.5 | 7.0 | 7.0 |
| Mixing Amount of Naphthoquinone diazide compound (g) | PAC-h | 3.0 | — | — | — | 2.5 | — | 3.0 |
| | PAC-i | — | 3.0 | — | — | — | — | — |
| | PAC-j | — | — | 2.5 | — | — | — | — |
| | PAC-k | — | — | — | 2.5 | — | — | — |
| | PAC-l | — | — | — | — | — | 3.0 | — |

TABLE 17

| | Examples | | | | | | |
|---|---|---|---|---|---|---|---|
| | 46 | 47 | 48 | 49 | 50 | 51 | 52 |
| Coated Film Thickness | 4.5 | 4.0 | 5.0 | 5.5 | 4.0 | 3.7 | 5.1 |

TABLE 17-continued

|  | Examples | | | | | | |
| --- | --- | --- | --- | --- | --- | --- | --- |
|  | 46 | 47 | 48 | 49 | 50 | 51 | 52 |
| (μm) Test 26 (resolution/μm) | 2.0 (negative) | 2.0 (negative) | 2.2 (negative) | 2.0 (negative) | 2.0 (negative) | 1.5 (negative) | 2.0 (negative) |
| Test 27 (Adhesion; Evaluation by Checker's test) | 0/100 | 0/100 | 0/100 | 0/100 | 0/100 | 0/100 | 0/100 |
| Test 28 (10% weight reduction temperature) | 415 | 400 | 420 | 421 | 430 | 415 | 415 |

*Evaluation by Checker's test (Evaluation of Adhesion): Adhesion strength with silicon wafer after heating for 62 hours under saturated steam of 2 atms.
*10% Weight Reduction Temperature (°C.) (Evaluation of Heat Resistance): TGA measurement after thermal curing at 320° C.

EXAMPLES 53 to 61

Polyamic acid solutions used in Examples 53 to 61 were prepared as in Example 30 by using the raw material compositions shown in Table 18. Table 18 also shows the logarithmic viscosity of each of the polyamic acid solutions thus prepared. Then, photosensitive resin compositions for Examples 53 to 61 were prepared by mixing predetermined amounts of the polyamic acid solutions thus prepared and naphthoquinone diazide compound as shown in Table 18.

Test 29: (Evaluation of Resolution Performance)

A layer of the photosensitive resin composition prepared in each of Examples 53 to 61, which was formed on a silicon wafer, was subjected to light exposure, baking treatment, and development by the method and under the conditions as in test 17 for evaluation of the resolution performance for Example 30 so as to form a pattern. In this test, the light exposure amount was set at 150 mJ/cm$^2$ (wavelength 365 nm), and the development was performed by dipping the silicon wafer in an aqueous solution containing 1.19% by weight of tetramethyl ammonium hydroxide, followed by washing the wafer with water. A cross section of each of the patterns thus formed was observed with an electron microscope so as to measure the resolution. Table 19 shows the results.

Test 30: (Evaluation of Adhesion with Silicon Wafer)

The adhesion strength between a formed pattern and a silicon wafer was measured by the method and under the conditions as in test 18 for evaluating the adhesion strength for Example 30 with respect to the photosensitive resin composition prepared in each of Examples 53 to 61. Table 19 also shows the results.

Test 31: (Evaluation of Heat Resistance)

The heat resistance of a pattern formed on a silicon wafer was measured by the method and under the conditions as in test 19 for evaluating the heat resistance for Example 30 with respect to the photosensitive resin composition prepared in each of Examples 53 to 61. Table 19 also shows the results.

As shown in Table 19, a negative fine pattern was formed in the case of forming a pattern by the method described above by using the photosensitive resin composition prepared in any of Examples 53 to 61. The pattern thus formed exhibited a high adhesion between the formed pattern and the substrate, and was sufficiently high in the resistance to heat.

TABLE 18

|  |  | Examples | | | | | | | | |
| --- | --- | --- | --- | --- | --- | --- | --- | --- | --- | --- |
|  |  | 53 | 54 | 55 | 56 | 57 | 58 | 59 | 60 | 61 |
| Mixing of Polyamic Acid |  |  |  |  |  |  |  |  |  |  |
| Tetracarboxylic dianhydride (g) | BPDA | — | 17.653 | — | 5.884 | — | — | — | — | — |
|  | BTDA | 19.993 | 12.888 | 17.721 | 18.688 | 11.921 | 15.788 | 22.554 | 19.993 | 19.933 |
|  | PMDA | 4.635 | — | 9.815 | 4.362 | 13.086 | 10.905 | 6.107 | 4.635 | 4.635 |
|  | DPE | 15.969 | — | 19.219 | 18.819 | — | 10.010 | 18.819 | 15.996 | 15.996 |
| Diamine (g) | DAM | — | 18.439 | — | — | 19.232 | 8.922 | — | — | — |
|  | ASi-a | 1.119 | 0.944 | — | 1.491 | 0.746 | — | — | 1.119 | 1.119 |
|  | ASi-b | — | — | 1.089 | — | — | 2.178 | 3.267 | — | — |
| Monoamine (g) | Å | — | 0.559 | — | — | — | — | — | — | — |
|  | T | — | — | 0.428 | — | — | — | — | — | — |
| Dicarboxylic anhydride | Å-a | — | — | — | 0.592 | — | — | — | — | — |
|  | Å-b | — | — | — | — | 0.924 | — | — | — | — |
|  | Å-c | — | — | — | — | — | 0.356 | — | — | — |
|  | Å-d | — | — | — | — | — | — | 0.672 | — | — |
|  | Å-e | 0.333 | — | — | — | — | — | — | 0.333 | 0.333 |
| Synthetic Conditions | Temp. (°C.) | −5~20 | −5~25 | −10~25 | 0~25 | 0~25 | 0~25 | 0~25 | −5~20 | −5~20 |
|  | Time (hour) | 8 | 8 | 8 | 7 | 7 | 7 | 7 | 8 | 8 |
| Logarithmic Viscosity | (dl/g) | 0.82 | 0.82 | 0.79 | 0.58 | 0.92 | 0.79 | 0.61 | 0.82 | 0.82 |
| Mixing Amount of Polyamic Acid | (g) | 7.5 | 7.0 | 7.5 | 7.0 | 8.0 | 7.0 | 7.0 | 7.0 | 8.0 |
| Mixing Amount of Naphthoquinone diazide compound (g) | PAC-m | 2.5 | — | — | — | — | — | — | — | — |
|  | PAC-n | — | 3.0 | — | — | — | 3.0 | — | — | — |
|  | PAC-o | — | — | 2.5 | — | — | — | 3.0 | — | — |
|  | PAC-p | — | — | — | 3.0 | — | — | — | 3.0 | — |
|  | PAC-q | — | — | — | — | 2.0 | — | — | — | 2.0 |

TABLE 19

| | Examples | | | | | | | | |
|---|---|---|---|---|---|---|---|---|---|
| | 53 | 54 | 55 | 56 | 57 | 58 | 59 | 60 | 61 |
| Coated Film Thickness (μm) | 4.2 | 4.5 | 4.2 | 4.0 | 4.2 | 4.6 | 3.5 | 3.6 | 3.5 |
| Test 29 (resolution/μm) | 3.5 (negative) | 2.0 (positive) | 2.2 (positive) | 3.0 (negative) | 1.5 (negative) | 3.5 (positive) | 2.0 (positive) | 3.5 (negative) | 2.0 (negative) |
| Test 30 (Adhesion; Evaluation by Checker's test) | 0/100 | 0/100 | 0/100 | 0/100 | 0/100 | 0/100 | 0/100 | 0/100 | 0/100 |
| Test 31 (10% weight reduction temperature) | 425 | 425 | 415 | 430 | 430 | 415 | 430 | 410 | 430 |

*Evaluation by Checker's test (Evaluation of Adhesion): Adhesion strength with silicon wafer after heating for 62 hours under saturated steam of 2 atms.
*10% Weight Reduction Temperature (°C.) (Evaluation of Heat Resistance): TGA measurement after thermal curing at 320° C.

As described above in detail, the method of the present invention for forming a polyimide film pattern comprises a baking treatment after the light exposure step, making it possible to form easily a pattern of a high resolution by means of development with an alkaline developing solution. The method of the present invention also permits readily forming a fine polyimide film pattern having a high adhesion strength with a semiconductor substrate and an excellent heat resistance. Naturally, the present invention is of high industrial value.

TABLE A

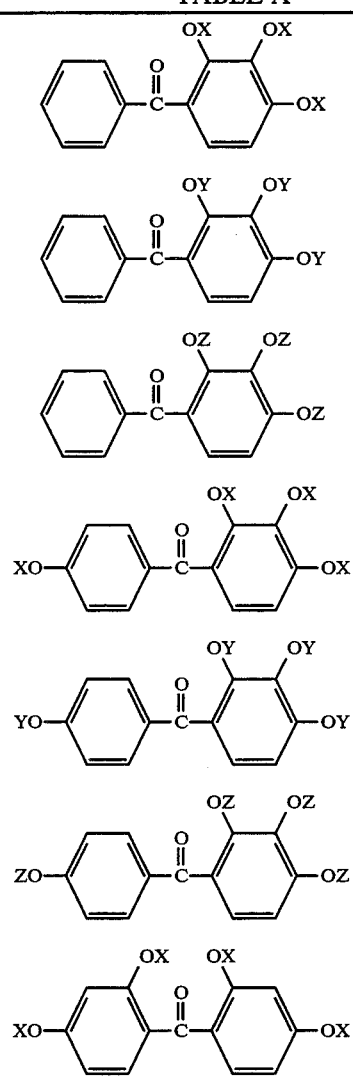

TABLE A-continued

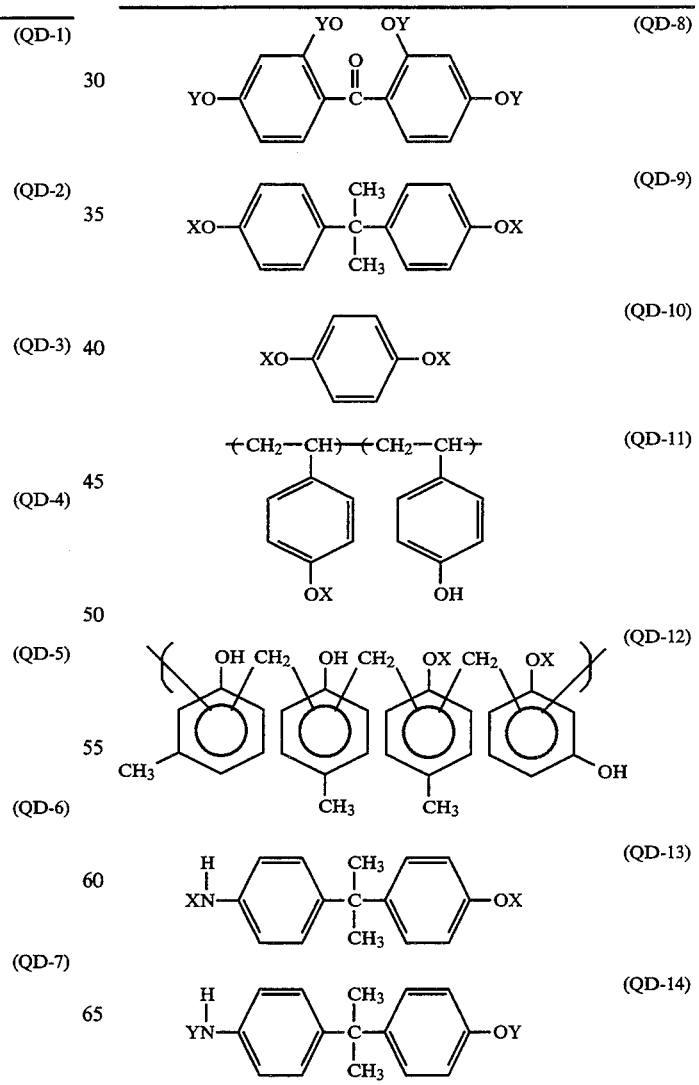

TABLE A-continued
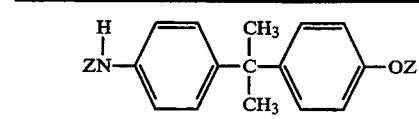
In (QD-1) to (QD-15):
X: 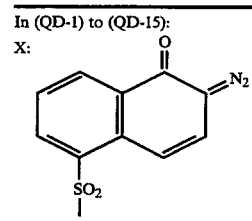
Y: 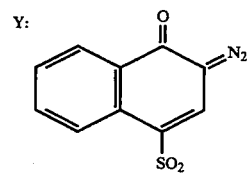
Z: 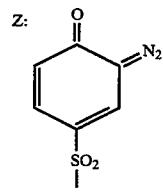
TABLE B
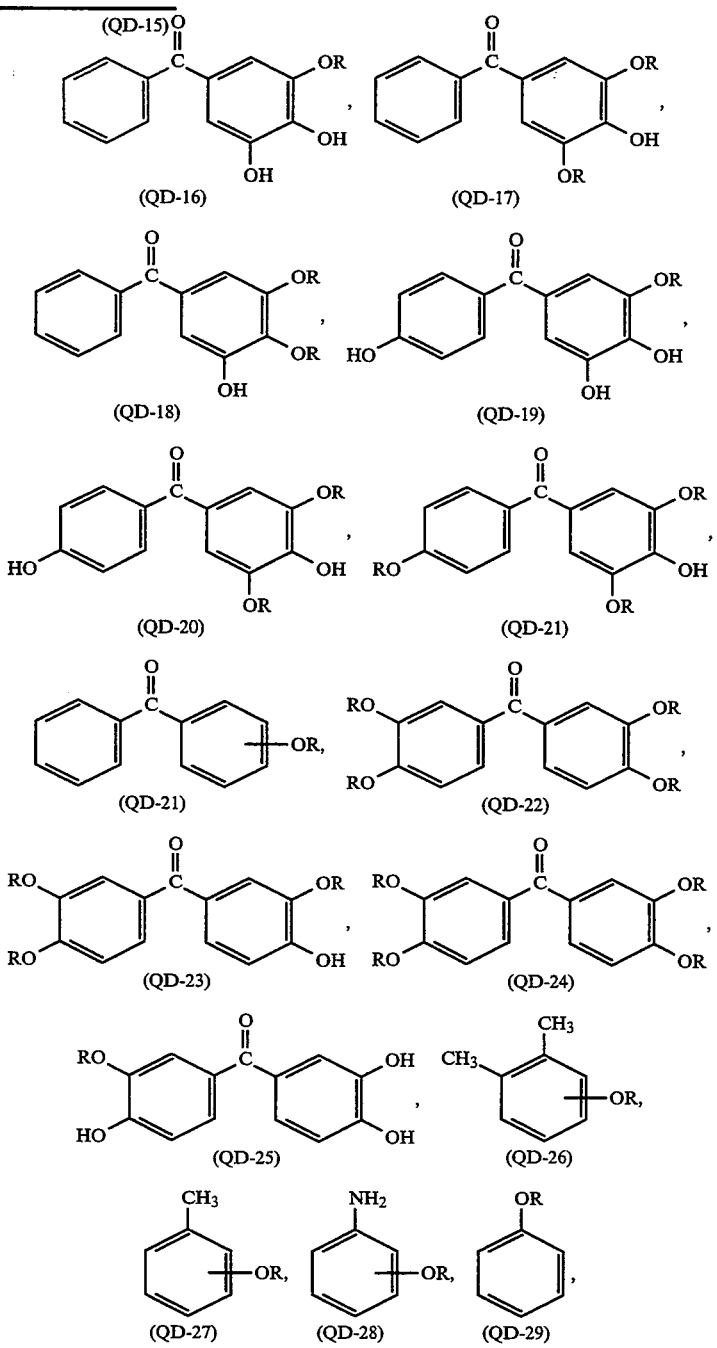

TABLE B-continued
CH₃—OR, (QD-30)  C₃H₇—OR, (QD-31)  HO—C₃H₆—OR, (QD-32)  RO—C₂H₄—OR, (QD-33)  RO—C₄H₈—OR, (QD-34)
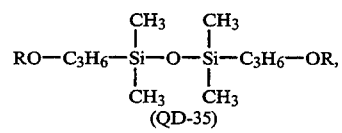
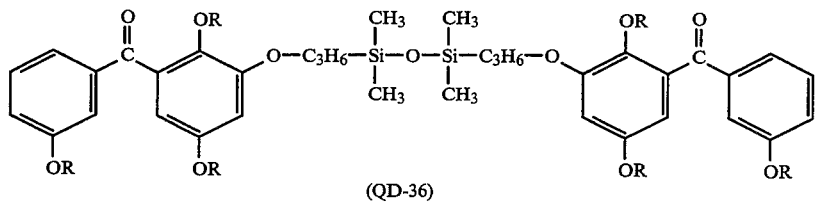
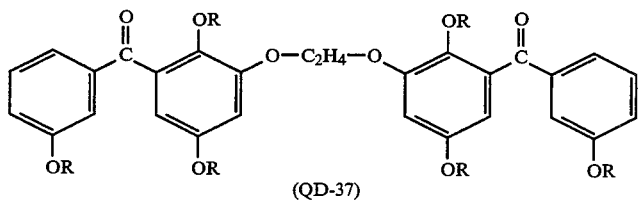
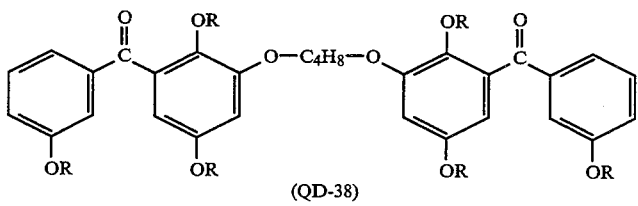
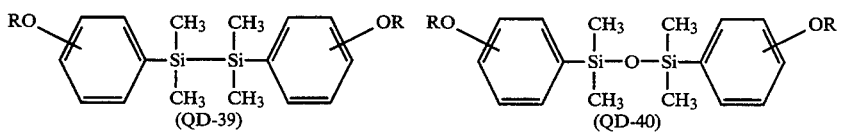
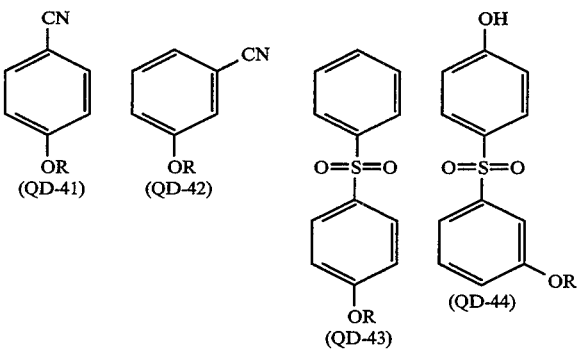
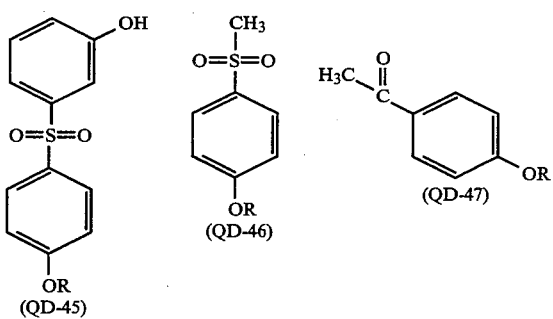

TABLE B-continued
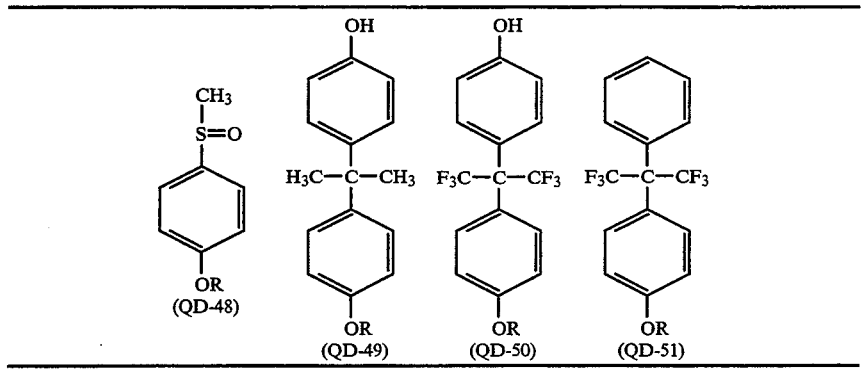
In (QD-16) to (QD-51):
R:
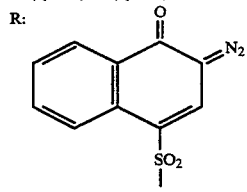
TABLE C
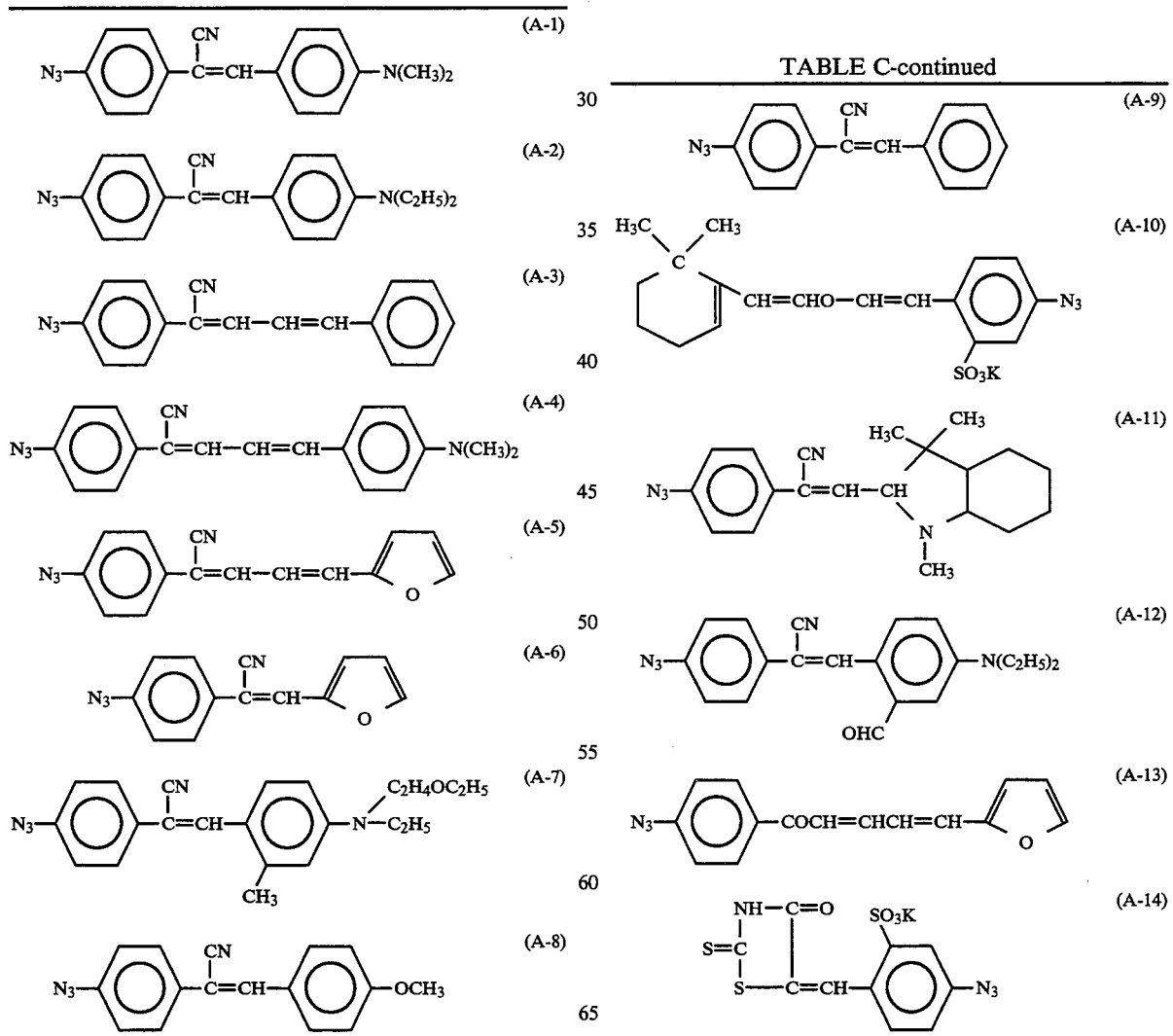

TABLE C-continued (A-15) [structure: pyrazolone with CH3, CH=CH-C6H4-N3]

(A-16) 4-azidobenzaldehyde (N3-C6H4-CHO)

(A-17) bis(4-azido-2-sulfokalium-benzyl) ether type structure with tetrahydropyran linkage (A-18) 4,4'-diazidostilbene (N3-C6H4-CH=CH-C6H4-N3)

TABLE D (DA-1) PhCO-C(N2)-CO-Ph (DA-2) NC-C6H4-CO-C(N2)-CO-C6H4-CN (DA-3) PhCO-C(N2)-CO-CH2CH3

(DA-4) (CH3)3C-CO-C(N2)-CO-C(CH3)3

(DA-5) PhCO-C(N2)-CO-O-CH2-Ph (DA-6) Ph-CH2-CO-C(N2)-CO-O-CH2-Ph (DA-7) HO-C6H4-CO-C(N2)-CO-CH3

(DA-8) 2-diazo-1,3-indandione (DA-9) H3CO-C6H4-CO-C(N2)-CO-C6H4-OCH3

(DA-10) PhCO-C(N2)-CO-CH3

TABLE D-continued (DA-11) PhCO-C(N2)-CO-CH(CH3)2

(DA-12) PhCO-C(N2)-CO-O-C2H5

(DA-13) PhCO-C(N2)-CO-O-Ph (DA-14) PhCO-C(N2)-CO-CH(H)-O-Ph (DA-15) CH3-CO-C(N2)-CO-NH-Ph (DA-16) hydantoin-type with CH2CH(CH3)2 substituent (DA-17) PhCO-C(N2)-CO-O-CH2-Si(CH3)3

(DA-18) (CH3)3Si-C6H4-CO-C(N2)-CO-CH3

(DA-19) (CH3)3Si-C6H4-CO-C(N2)-CO-O-CH2-Si(CH3)3

(DA-20) PhCO-C(N2)-CO-O-C6H4-Si(CH3)3

(DA-21) CH3-CO-C(N2)-CO-NH-C6H4-Si(CH3)3

(DA-22) 2-methyl-2-(4-trimethylsilylphenyl)-5-diazo-1,3-dioxane-4,6-dione

TABLE E

[structure: cyclohexadienone with OH, CH2—, Si(CH3) substituents]

[structure: (CH3)3SiOCH2-C6H4-]

[structure: HO-C6H4-CH2-C6H4-CH2—]

TABLE E-continued

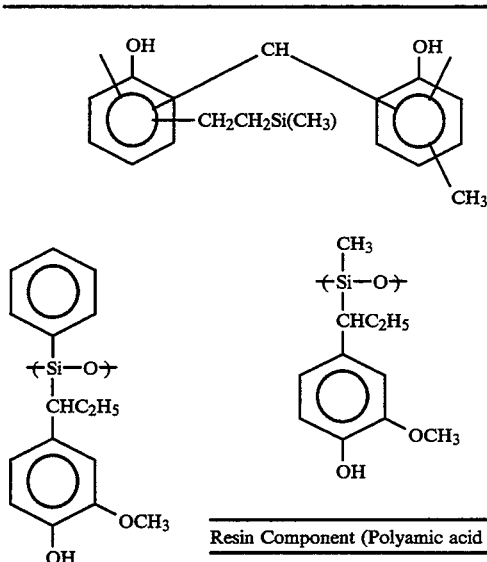

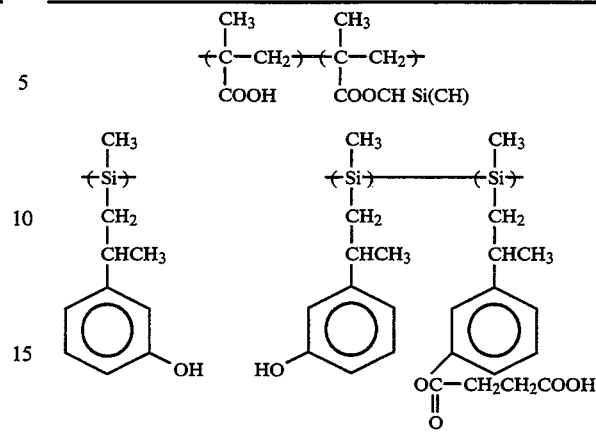

TABLE F

| Resin Component (Polyamic acid derivative and/or Polyamic acid) | Photosensitive Agent |
|---|---|
| Polyamic acid derivative P-1 | o-naphthoquinone diazide |
| Polyamic acid derivative P-1 | Bisazide |
| Mixture of Polyamic acid derivative P-1 and Polyamic acid P-2 | o-naphthoquinone diazide |
| Mixture of Polyamic acid derivative P-1 and with Polyamic acid derivative P-3 | o-naphthoquinone diazide |
| Polyamic acid derivative P-4 | o-naphthoquinone diazide |

P-1

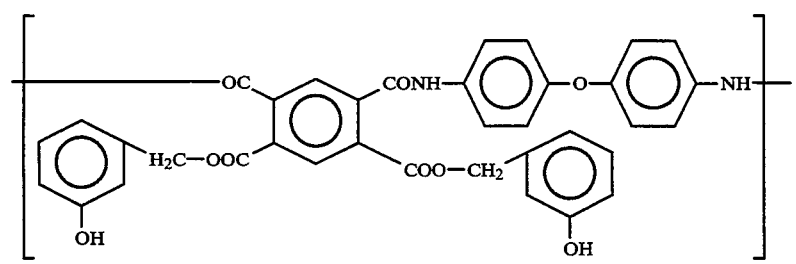

P-2

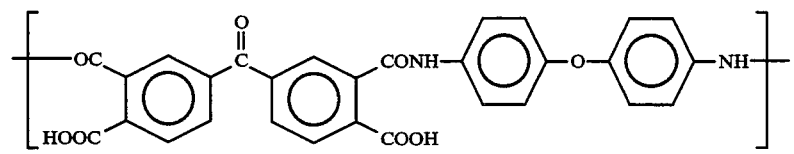

P-3

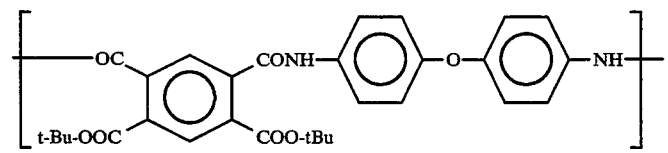

P-4

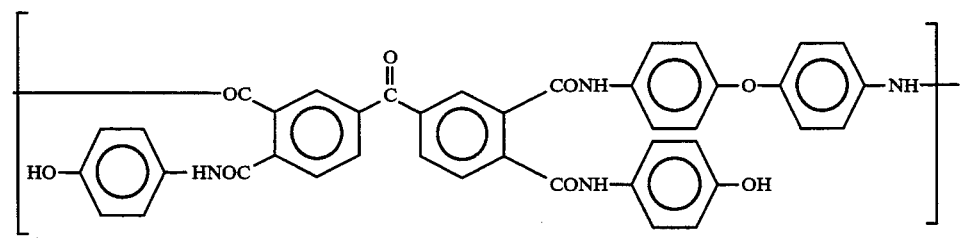

TABLE G

<Tetracarboxylic dianhydride>
PMDA:

TABLE G-continued

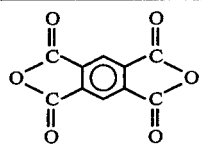

BTDA:
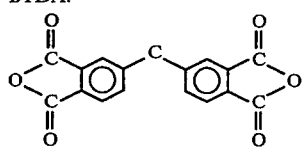

DSDA:
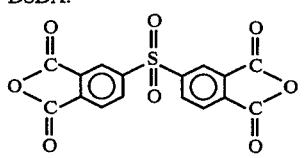

<Diamine>
ODA:
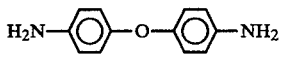

6FDA:
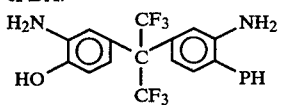

TSL9360 (Manufactured by Toshiba Silicon Inc.)
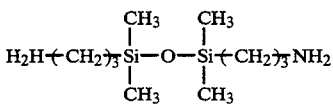

HFBAPP:
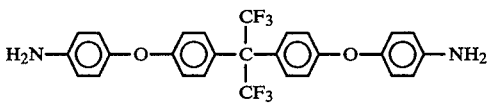

BAPB:
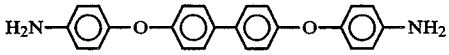

BAPP:
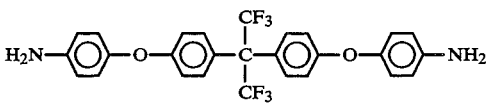

<Photosensitive Agent>
Same as those shown in Table A to D.

TABLE H

| | |
|---|---|
| BPDA: | 3,3',4,4'-biphenyl tetracarboxylic dianhydride |
| BTDA: | 3,3',4,4'-benzophenone tetracarboxylic dianhydride |
| PMDA: | pyromellitic dianhydride |
| DPE: | 4,4'diaminodiphenylether |
| DAM: | 4,4'-diaminodiphenylmethane |
| Asi-a: | (bis(γ-aminopropyl)tetramethyldisiloxane |

Asi-b:
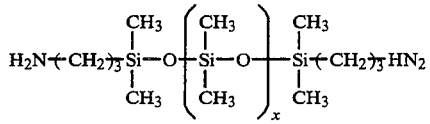
(x = 4)

| | |
|---|---|
| A: | aniline |
| T: | o-toluidine |
| A-a: | phthalic anlydride |
| A-b: | hexahydrophthalic anhydride |
| A-c: | methyl nadic anhydride |
| A-d: | 4-methylhexahydrophthalic anhydride |
| A-e: | maleic anhydride |

PAC-a:
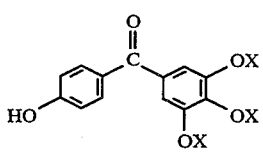

PAC-b:
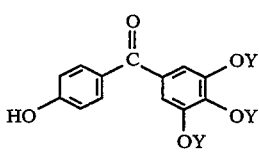

PAC-c:

PAC-d:
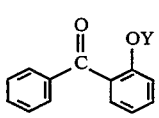

PAC-e:
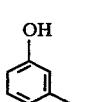

PAC-f:
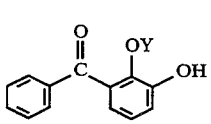

PAC-g:
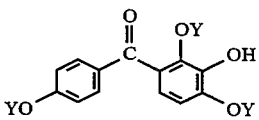

PAC-h: YO—C$_2$H$_4$—OY
PAC-i: YO—C$_4$H$_8$—OY

PAC-j:
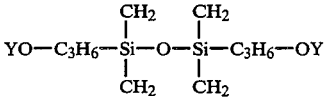

PAC-k:
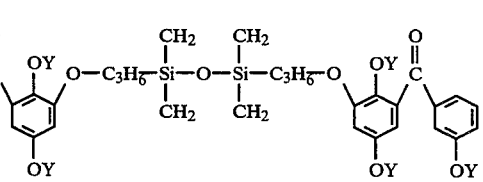

TABLE H-continued

PAC-l:

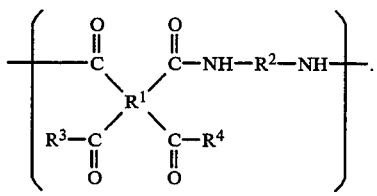

PAC-m

![structure: benzene ring with CN on top and OY on bottom]

PAC-n

![structure: 2,2-bis(4-hydroxyphenyl)propane with one OH and one OY]

PAC-o

![structure: 2,2-bis(4-hydroxyphenyl)hexafluoropropane with one OH and one OY]

PAC-p

![structure: CH3-C(=O)- attached to benzene ring with OY]

PAC-q

![structure: bis(4-hydroxyphenyl)sulfone with one OH and one OY]

In (PAC-a) to (PAC-q)

X:

![structure: 1,2-naphthoquinonediazide-5-sulfonyl]

Y:

![structure: 1,2-naphthoquinonediazide-4-sulfonyl]

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A photosensitive resin composition for forming a polyimide film pattern, comprising in admixture a polyamic acid derivative having a repeating unit represented by general formula (1), and a photosensitizing amount of an o-quinone diazide compound photosensitive agent:

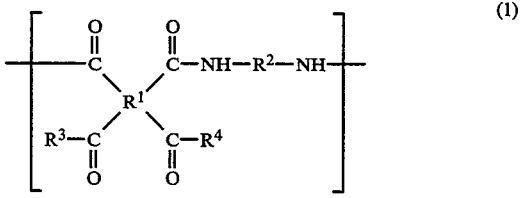

where, $R^1$ represents a tetravalent organic group, $R^2$ represents a divalent organic group, and $R^3$ and $R^4$ represent a monovalent organic group or hydroxyl group, at least one of $R^3$ and $R^4$ being an organic group having at least one hydroxyl group bonded to an aromatic ring.

2. A photosensitive resin composition for forming a polyimide film pattern, comprising in admixture a polyamic acid derivative having a repeating unit represented by general formula (1), a polyamic acid having a repeating unit represented by general formula (2), and a photosensitizing amount of an o-quinone diazide compound photosensitive agent:

(1)

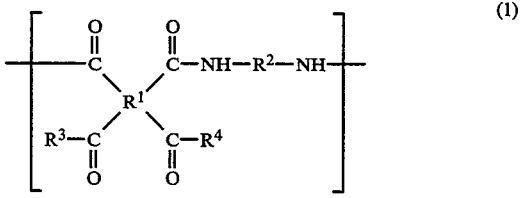

(2)

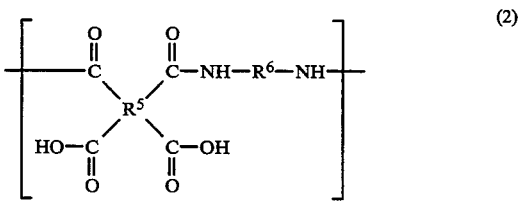

where, $R^1$ represents a tetravalent organic group, $R^2$ represents a divalent organic group, $R^3$ and $R^4$ represent a monovalent organic group or hydroxyl group, at least one of $R^3$ and $R^4$ being an organic group having at least one hydroxyl group bonded to an aromatic ring, $R^5$ represents a tetravalent organic group, and $R^6$ represents a divalent organic group.

3. A photosensitive resin composition for forming a polyimide film pattern, comprising in admixture a polyamic acid derivative having a copolymer structure including a repeating unit represented by general formula (1) and a repeating unit represented by general formula (2), and a photosensitizing amount of an o-quinone diazide compound photosensitive agent:

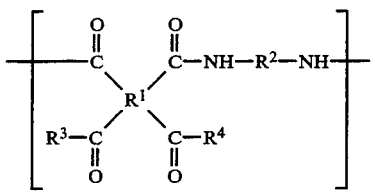

(1)

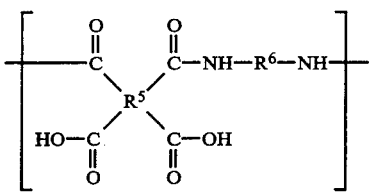

(2)

where, $R^1$ represents a tetravalent organic group, $R^2$ represents a divalent organic group, $R^3$ and $R^4$ represent a monovalent organic group or hydroxyl group, at least one of $R^3$ and $R^4$ being an organic group having at least one hydroxyl group bonded to an aromatic ring, $R^5$ represents a tetravalent organic group, and $R^6$ represents a divalent organic group.

4. The photosensitive resin composition for forming a polyimide film pattern according to claim 1, wherein said photosensitive agent is used in an amount of 0.1 to 30 parts by weight based on 100 parts by weight of the amount of said polyamic acid derivative having a repeating unit represented by general formula (1).

5. The photosensitive resin composition for forming a polyimide film pattern according to claim 2, wherein said polyamic acid derivative having a repeating unit represented by general formula (1) is used in an amount of 20 to 98 parts by weight based on 100 parts by weight of the amount of the total resin component.

6. The photosensitive resin composition for forming a polyimide film pattern according to claim 2, wherein said photosensitive agent is added in an amount of 5 to 50 parts by weight based on 100 parts by weight of the sum of the polyamic acid derivative having a repeating unit represented by general formula (1), the polyamic acid having a repeating unit represented by general formula (2), and the photosensitive agent.

7. The photosensitive resin composition for forming a polyimide film pattern according to claim 3, wherein said photosensitive agent is used in an amount of 0.1 to 30 parts by weight based on 100 parts by weight of the amount of the polyamic acid derivative having a copolymer structure including repeating units represented by general formulas (1) and (2).

* * * * *